(12) United States Patent
Song et al.

(10) Patent No.: US 11,713,371 B2
(45) Date of Patent: Aug. 1, 2023

(54) POLAR FUNCTIONAL GROUP-PARTIALLY INTRODUCED POLYMER, PREPARATION METHOD THEREFOR, AND ORGANIC ELECTRONIC ELEMENT CONTAINING SAME

(71) Applicant: KOREA RESEARCH INSTITUTE OF CHEMICAL TECHNOLOGY, Daejeon (KR)

(72) Inventors: Chang Eun Song, Busan (KR); Won Suk Shin, Daejeon (KR); Sang Jin Moon, Daejeon (KR); Jong Cheol Lee, Daejeon (KR); Sang Kyu Lee, Daejeon (KR); Hang Ken Lee, Daejeon (KR); Vu Van Doan, Daejeon (KR); Shafket Rasool, Daejeon (KR)

(73) Assignee: KOREA RESEARCH INSTITUTE OF CHEMICAL TECHNOLOGY, Daejeon (KR)

( * ) Notice: Subject to any disclaimer, the term of this patent is extended or adjusted under 35 U.S.C. 154(b) by 275 days.

(21) Appl. No.: 16/646,939

(22) PCT Filed: Nov. 26, 2018

(86) PCT No.: PCT/KR2018/014590
§ 371 (c)(1),
(2) Date: Mar. 12, 2020

(87) PCT Pub. No.: WO2019/112220
PCT Pub. Date: Jun. 13, 2019

(65) Prior Publication Data
US 2020/0308342 A1    Oct. 1, 2020

(30) Foreign Application Priority Data

Dec. 4, 2017  (KR) .......................... 10-2017-0164973
Oct. 23, 2018  (KR) .......................... 10-2018-0126476

(51) Int. Cl.
*C08G 61/12*    (2006.01)

(52) U.S. Cl.
CPC ....... *C08G 61/126* (2013.01); *C08G 2261/12* (2013.01); *C08G 2261/3246* (2013.01); *C08G 2261/344* (2013.01)

(58) Field of Classification Search
CPC .......................... C08G 61/123; H01L 51/0036
See application file for complete search history.

(56) References Cited

U.S. PATENT DOCUMENTS

| 9,214,258 B2 | 12/2015 | Wu et al. | |
| 2014/0163188 A1* | 6/2014 | Osaka | H10K 85/113 526/240 |

FOREIGN PATENT DOCUMENTS

JP    5622181 B2    11/2014

OTHER PUBLICATIONS

Hoang et al., "Regular Conjugated Terpolymers Comprising Two Difference Acceptors and Bithiophene Donor in Repeating Group: Effect of Strong and Weak Acceptors on Semiconducting Properties", Journal of Polymer Science, Part A: Polymer Chemistry, vol. 54—10 pages (2016).

(Continued)

*Primary Examiner* — Catherine S Branch
(74) *Attorney, Agent, or Firm* — Knobbe, Martens, Olson & Bear, LLP

(57) ABSTRACT

The present invention relates to a polar functional group-partially introduced polymer, a preparation method therefor, and an organic electronic element adopting the same. The organic electronic element of the present invention has excellent photoelectric conversion efficiency and stability and is very advantageous in commercialization, by adopting the polar functional group-partially introduced polymer of the present invention.

13 Claims, 5 Drawing Sheets

(56) References Cited

OTHER PUBLICATIONS

Noh et al., "Facile Enhancement of Open-Circuit Voltage in P3HT Analogues via Incorporation of Hexyl Thiophene-3-carboxylate" Macromolecules, vol. 49, No. 18—12 pages (2016).
Shircliff et al., "Synthesis and characterization of pendant phenyl ester-substituted thiophene based copolymers", Materials Today Communications, vol. 8—9 pages (2016).
Zhang et al., "Downwards tuning the HOMO level of polythiophene by carboxylate substitution for high open-circuit-voltage polymer solar cells", Polym. Chem., vol. 2—8 pages (2011).
International Search Report of corresponding PCT Application No. PCT/KR2018/014590—6 pages (dated Feb. 27, 2019).

\* cited by examiner

POLAR FUNCTIONAL GROUP-PARTIALLY INTRODUCED POLYMER, PREPARATION METHOD THEREFOR, AND ORGANIC ELECTRONIC ELEMENT CONTAINING SAME

TECHNICAL FIELD

The present invention relates to a polymer to which a polar functional group is partially introduced, a method of preparing the same, and an organic electronic device adopting the same, and more particularly, to a polymer having excellent physical properties by partially introducing a polar functional group thereto, a method of preparing the same, and an organic electronic device adopting the same.

BACKGROUND ART

For the last decade or so, development of an organic material having semiconductor properties and also various application research using the same have been conducted more actively than ever. The area of application research using an organic semiconductor such as an electromagnetic wave shield, a capacitor, an OLED display, an organic thin film transistor (OTFT), a solar cell, and a memory device using a multiphoton absorption phenomenon is continuously expanding. In particular, the area of a solar cell has received great attention among new renewable energy technologies which have been recently actively studied, since it allows infinite production of clean and safe energy.

A solar cell is a device capable of directly converting solar energy into electric energy by applying a photovoltaic effect. A typical solar cell is made by a p-n junction by doping crystalline silicon (Si) which is an inorganic semiconductor. Electrons and holes which are produced by light absorption are diffused to a p-n junction point, are accelerated by the electric field thereof, and move to an electrode. Electricity conversion efficiency in this process is defined as a ratio between electricity given to an external circuit and solar power put into a solar cell, and has been achieved up to about 24% when measured under currently standardized hypothetical solar irradiation conditions. Since conventional inorganic solar cell shows limitations in high production costs and supply and demand of materials, development of a technology for increasing ease of processing and lowering production costs of a solar cell has progressed, and as a result, an organic solar cell technique using low cost rich organic materials has received attention as a new alternative.

In addition, in order to improve efficiency of the organic solar cell, various materials are applied to a photoactive layer and a buffer layer, and in particular, studies on electron donor materials which are included in the photoactive layer for realizing efficiency improvement, larger area, and the like are being actively conducted.

Generally, a photoactive layer, which is composed of a material having a low electron affinity (donor) and a material having a high electron affinity (acceptor) in combination, absorbs light to form excitons, and in the boundary between a material having a low electron affinity and a material having a high electron affinity, electrons in the material having a low electron affinity move to the material having a high electron affinity, whereby the excitons are separated into holes and electrons, respectively and move to an electrode.

Thus, in order to improve the efficiency of an organic solar cell, organic semiconductor compounds for replacing poly(3-hexylthiophene) (P3HT) which is a representative material used in the conventional photoconversion active layer has been variously studied, but still no satisfactory results have been obtained.

Besides, in order to raise a commercialization level of an organic solar cell, mass production should be possible with an easy process at a low temperature, the efficiency should not be greatly changed depending on module positions and thicknesses in the process, and stability should be excellent.

Accordingly, a more effective organic semiconductor compound for raising the commercialization level as well as increasing the photoconversion efficiency of the organic solar cell is required.

DISCLOSURE

Technical Problem

An object of the present invention is to provide a polymer to which a polar functional group is partially introduced, having an excellent power conversion efficiency, maintaining a high power conversion efficiency even in the case of manufacturing an organic electronic device at a low temperature, and having a high power conversion efficiency regardless of the position and thickness of a module due to a not large difference in the power conversion efficiency depending on a ratio of an electron receptor, a method of preparing the same, and an organic electronic device adopting the same.

Technical Solution

In one general aspect, a polymer includes: a repeating unit represented by the following Chemical Formula 1; and one or more repeating units selected from the following Chemical Formulae 2 to 4:

[Chemical Formula 1]

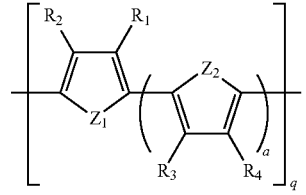

[Chemical Formula 2]

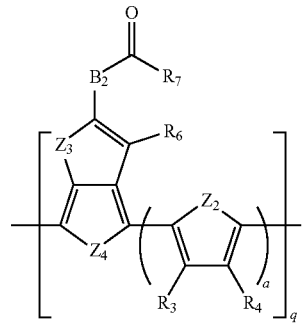

[Chemical Formula 3]

[Chemical Formula 4]

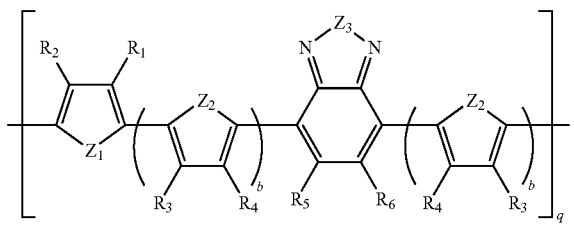

wherein

Ⓐ is an organic radical which is $C_3$-$C_{30}$ heteroarylene, a condensed polycyclic organic radical of $C_3$-$C_{30}$ heteroarylene, or a combination thereof;

$Z_1$ is S, Se, or O, or —C(R')=C(R')—, in which R' is independently of each other hydrogen, $C_1$-$C_{30}$ alkyl, $C_1$-$C_{30}$ alkoxy, or hydroxy$C_1$-$C_{30}$ alkyl;

$Z_2$ to $Z_4$ are independently of one another S, Se, or O;

$R_1$ is hydroxy$C_1$-$C_{30}$ alkyl or —$B_1$—C(=O)R'', in which $B_1$ is a single bond or $C_1$-$C_{30}$ alkylene, and R'' is $C_1$-$C_{30}$ alkyl, $C_1$-$C_{30}$ alkoxy, or —NR$^a$R$^b$, in which R$^a$ and R$^b$ are independently of each other hydrogen or $C_1$-$C_{30}$ alkyl;

$R_2$ to $R_6$ are independently of one another hydrogen, a halogen, $C_1$-$C_{30}$ alkyl, $C_1$-$C_{30}$ alkoxy, $C_6$-$C_{30}$ aryl, or $C_3$-$C_{30}$ heteroaryl;

$R_7$ is $C_1$-$C_{30}$ alkyl, $C_1$-$C_{30}$ alkoxy, or —NR$^a$R$^b$, in which R$^a$ and R$^b$ are independently of each other hydrogen or $C_1$-$C_{30}$ alkyl;

$B_2$ is a single bond or $C_1$-$C_{30}$ alkylene;

a is independently of each other an integer of 1 to 5;

b is independently of each other an integer of 0 to 5;

p and q satisfy 0<p<1, 0<q<1, and p+q=1, as a mole fraction; and the organic radical which is heteroarylene, a condensed polycyclic organic radical of heteroarylene, or a combination thereof of Ⓐ may be further substituted by one or more substituents selected from the group consisting of halogens, hydroxy, cyano, $C_1$-$C_{30}$ alkyl, $C_1$-$C_{30}$ alkoxy, $C_6$-$C_{30}$ aryl, and $C_6$-$C_{30}$ aryl$C_1$-$C_{30}$ alkyl, and the heteroarylene includes one or more selected from the group consisting of B, N, O, S, P(=O), Si, and P.

The polymer according to an exemplary embodiment of the present invention may be a polymer including a repeating unit represented by the following Chemical Formulae 1 and 2, or a repeating unit represented by the following Chemical Formulae 1 and 4:

[Chemical Formula 1]

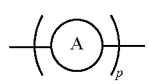

[Chemical Formula 2]

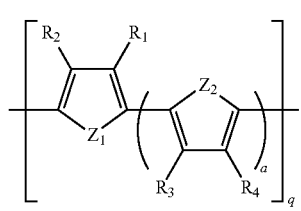

[Chemical Formula 4]

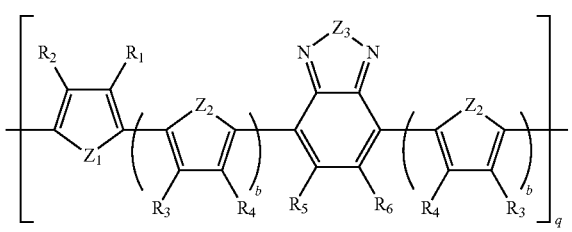

wherein

Ⓐ is an organic radical which is $C_3$-$C_{30}$ heteroarylene, a condensed polycyclic organic radical of $C_3$-$C_{30}$ heteroarylene, or a combination thereof;

$Z_1$ is S, Se, or O, or —C(R')=C(R')—, in which R' is independently of each other hydrogen, $C_1$-$C_{30}$ alkyl, $C_1$-$C_{30}$ alkoxy, or hydroxy$C_1$-$C_{30}$ alkyl;

$Z_2$ and $Z_3$ are independently of each other S, Se, or O;

$R_1$ is hydroxy$C_1$-$C_{30}$ alkyl;

$R_2$ to $R_6$ are independently of one another hydrogen, a halogen, $C_1$-$C_{30}$ alkyl, $C_1$-$C_{30}$ alkoxy, $C_6$-$C_{30}$ aryl, or $C_3$-$C_{30}$ heteroaryl;

a is an integer of 1 to 5;

b is independently of each other an integer of 0 to 5;

p and q satisfy 0<p<1, 0<q<1, and p+q=1, as a mole fraction; and the organic radical which is heteroarylene, a condensed polycyclic organic radical of heteroarylene, or a combination thereof of Ⓐ may be further substituted by one or more substituents selected from the group consisting of halogens, hydroxy, cyano, $C_1$-$C_{30}$ alkyl, $C_1$-$C_{30}$ alkoxy, $C_6$-$C_{30}$ aryl, and $C_6$-$C_{30}$ aryl$C_1$-$C_{30}$ alkyl, and the heteroarylene includes one or more selected from the group consisting of B, N, O, S, P(=O), Si, and P.

The polymer according to an exemplary embodiment of the present invention may include a repeating unit represented by the following Chemical Formulae 1 and 2-1, or a repeating unit represented by the following Chemical Formulae 1 and 3:

[Chemical Formula 1]

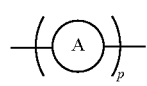

[Chemical Formula 2-1]

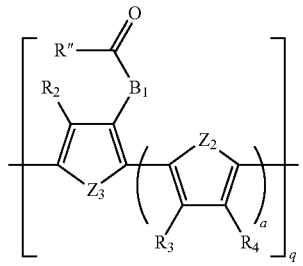

-continued

[Chemical Formula 3]

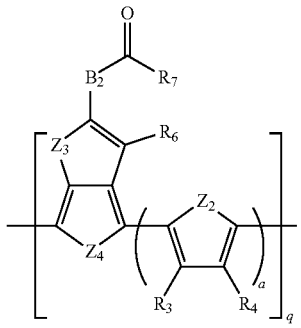

wherein

Ⓐ is an organic radical which is $C_3$-$C_{30}$ heteroarylene, a condensed polycyclic organic radical of $C_3$-$C_{30}$ heteroarylene, or a combination thereof;

$Z_2$ to $Z_4$ are independently of one another S, Se, or O;

$R_2$ to $R_4$ and $R_6$ are independently of one another hydrogen, a halogen, $C_1$-$C_{30}$ alkyl, $C_1$-$C_{30}$ alkoxy, $C_6$-$C_{30}$ aryl, or $C_3$-$C_{30}$ heteroaryl;

R" and $R_7$ are independently of each other $C_1$-$C_{30}$ alkyl, $C_1$-$C_{30}$ alkoxy, or —$NR^aR^b$, in which $R^a$ and $R^b$ are independently of each other hydrogen or $C_1$-$C_{30}$ alkyl;

$B_1$ and $B_2$ are independently of each other a single bond or $C_1$-$C_{30}$ alkylene;

a is independently of each other an integer of 1 to 5;

p and q satisfy 0<p<1, 0<q<1, and p+q=1, as a mole fraction; and the organic radical which is heteroarylene, a condensed polycyclic organic radical of heteroarylene, or a combination thereof of Ⓐ may be further substituted by one or more substituents selected from the group consisting of halogens, hydroxy, cyano, $C_1$-$C_{30}$ alkyl, $C_1$-$C_{30}$ alkoxy, $C_6$-$C_{30}$ aryl, and $C_6$-$C_{30}$ aryl$C_1$-$C_{30}$ alkyl, and the heteroarylene includes one or more selected from the group consisting of B, N, O, S, P(=O), Si, and P.

The polymer according to an exemplary embodiment of the present invention may be a polymer in which mole fractions of p and q are 0.5<p<1, 0<q<0.5, and p+q=1.

Ⓐ of the polymer according to an exemplary embodiment of the present invention may be an organic radical which is $C_3$-$C_{30}$ heteroarylene; a benzocondensed cyclic organic radical of heteroarylene selected from the group consisting of naphthobisthiadiazolylene, benzothiadiazolylene, benzofuranylene, benzothiopheneylene, isobenzofuranylene, benzoimidazolylene, benzothiazolylene, benzoisothiazolylene, benzoisoxazolylene, benzoxazolylene, benzoxadiazolylene, isoindolylene, indolylene, indazolylene, quinolylene, isoquinolylene, cinnolinylene, quinazolinylene, quinoxalinylene, carbazolylene, phenanthridinylene, benzodioxolylene, dibenzofuranylene, dibenzothiophenylene, thiadiazolopyridinylene, thiadiazolonaphthothiadiazolylene, and the like; or a combination thereof; $Z_1$ may be S or —CH=C(R')—, in which R' is hydroxy$C_1$-$C_{30}$ alkyl or —$B_1$—C(=O)R", in which $B_1$ is a single bond or $C_1$-$C_{30}$ alkylene, and R" is $C_1$-$C_{30}$ alkyl, $C_1$-$C_{30}$ alkoxy, or —$NR^aR^b$, in which $R^a$ and $R^b$ are independently of each other hydrogen or $C_1$-$C_{30}$ alkyl; $Z_2$ to $Z_4$ may be S or O; $R_2$ to $R_6$ are independently of one another hydrogen, a halogen, or $C_1$-$C_{30}$ alkyl; $R_7$ may be $C_1$-$C_{30}$ alkyl, $C_1$-$C_{30}$ alkoxy, or —$NR^aR^b$, in which $R_a$ and $R_b$ are independently of each other hydrogen or $C_1$-$C_{30}$ alkyl; a may be independently of each other an integer of 1 to 3; b may be independently of each other an integer of 0 to 3; the organic radical which is heteroarylene, a condensed polycyclic organic radical of heteroarylene, or a combination thereof of Ⓐ may be further substituted by one or more substituents selected from the group consisting of halogens, hydroxy, cyano, $C_1$-$C_{30}$ alkyl, $C_1$-$C_{30}$ alkoxy, $C_6$-$C_{30}$ aryl, $C_6$-$C_{30}$ aryl$C_1$-$C_{30}$ alkyl, and the like, and the heteroarylene may include one or more selected from the group consisting of B, N, O, S, P(=O), Si, P, and the like.

In the repeating unit represented by Chemical Formula 2 of the polymer according to an exemplary embodiment of the present invention, $Z_1$ may be S or —CH=C(R')—, R' may be hydroxy$C_1$-$C_{30}$ alkyl or —$B_1$—C(=O)R", $B_1$ may be a single bond or $C_1$-$C_{30}$ alkylene, R" may be $C_1$-$C_{30}$ alkyl, $C_1$-$C_{30}$ alkoxy, or —$NR^aR^b$, $R^a$ and $R^b$ may be independently of each other hydrogen or $C_1$-$C_{30}$ alkyl; and $Z_2$ may be S.

In the repeating unit represented by Chemical Formula 3 of the polymer according to an exemplary embodiment of the present invention, $Z_2$ to $Z_4$ may be S.

In the repeating unit represented by Chemical Formula 4 of the polymer according to an exemplary embodiment of the present invention, $Z_1$ may be S or —CH=C(R')—, R' may be hydroxy$C_1$-$C_{30}$ alkyl; and $Z_2$ and $Z_3$ may be S.

The repeating unit represented by Chemical Formula 1 of the polymer according to an exemplary embodiment of the present invention may be repeating unit represented by the following Chemical Formula 4-1 or 4-2:

[Chemical Formula 4-1]

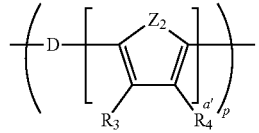

[Chemical Formula 4-2]

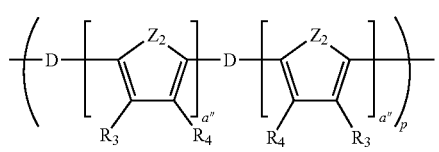

wherein

D is independently of each other an organic radical which is $C_3$-$C_{30}$ heteroarylene; a benzocondensed cyclic organic radical of heteroarylene selected from the group consisting of naphthobisthiadiazolylene, benzothiadiazolylene, benzofuranylene, benzothiopheneylene, isobenzofuranylene, benzoimidazolylene, benzothiazolylene, benzoisothiazolylene, benzoisoxazolylene, benzoxazolylene, benzoxadiazolylene, isoindolylene, indolylene, indazolylene, quinolylene, isoquinolylene, cinnolinylene, quinazolinylene, quinoxalinylene, carbazolylene, phenanthridinylene, benzodioxolylene, dibenzofuranylene, dibenzothiophenylene, thiadiazolopyridinylene, thiadiazolonaphthothiadiazolylene, and the like; or a combination thereof;

$Z_2$ is independently of each other S, Se, or O;

$R_3$ and $R_4$ are independently of each other hydrogen, a halogen, $C_1$-$C_{30}$ alkyl, $C_1$-$C_{30}$ alkoxy, $C_6$-$C_{30}$ aryl, or $C_3$-$C_{30}$ heteroaryl;

a' is an integer of 0 to 5;

a" is independently of each other an integer of 1 to 5;

p satisfies 0<p<1, as a mole fraction;

the organic radical which is heteroarylene, a benzocondensed cyclic organic radical of heteroarylene, or a combination thereof of D may be further substituted by one or more substituents selected from the group consisting of halogens, hydroxy, cyano, $C_1$-$C_{30}$ alkyl, $C_1$-$C_{30}$ alkoxy, $C_6$-$C_{30}$ aryl, $C_6$-$C_{30}$ aryl$C_1$-$C_{30}$ alkyl, and the like, and the heteroarylene includes one or more selected from the group consisting of B, N, O, S, P(=O), Si, and P.

In the polymer according to an exemplary embodiment of the present invention, D in the repeating unit represented by Chemical Formula 4-1 or 4-2 may be selected from the following structural formulae, but is not limited thereto:

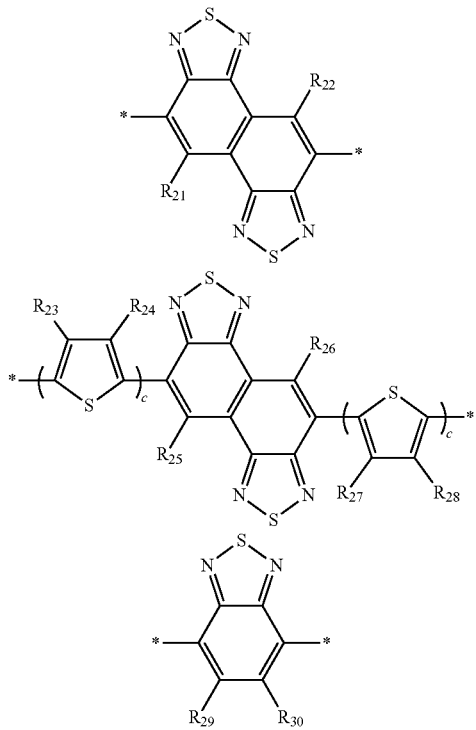

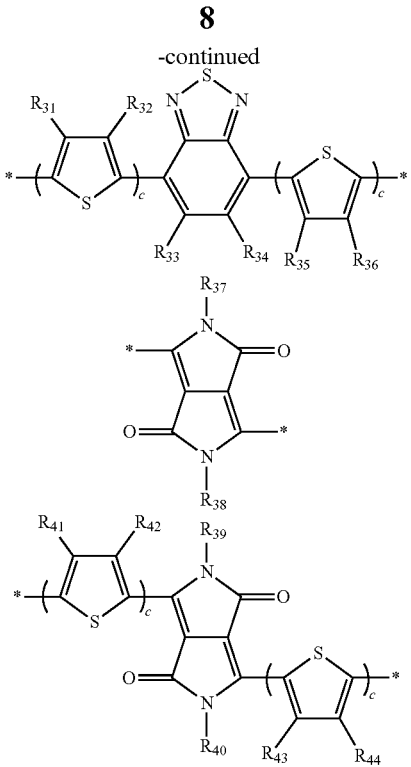

wherein $R_{21}$ to $R_{36}$ and $R_{41}$ to $R_{44}$ are independently of one another hydrogen, a halogen, $C_1$-$C_{30}$ alkyl, or $C_1$-$C_{30}$ alkoxy;

c is independently of each other an integer of 1 or 2, and when c is 2, substituents of the repeating unit may be identical to or different from each other, and at least one of the substituents of each repeating unit is $C_1$-$C_{30}$ alkyl or $C_1$-$C_{30}$ alkoxy; and $R_{37}$ to $R_{40}$ are independently of one another hydrogen or $C_1$-$C_{30}$ alkyl.

The polymer according to an exemplary embodiment of the present invention may be selected from the following compounds, but is not limited thereto:

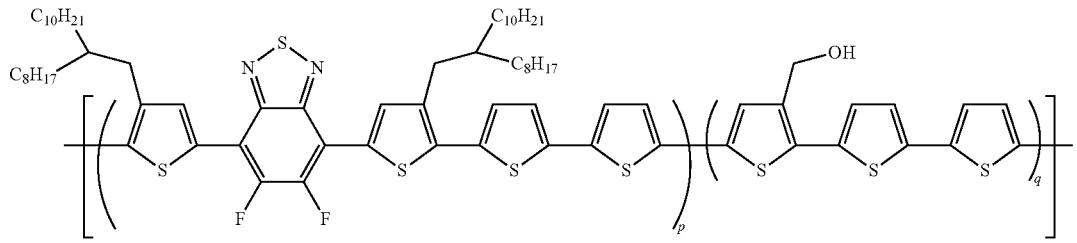

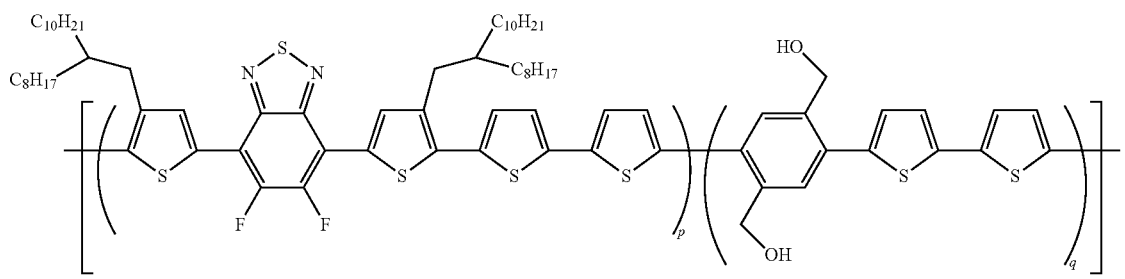

-continued
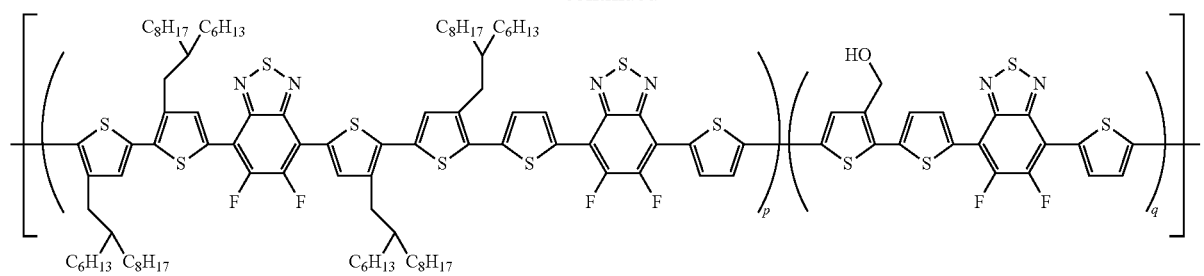
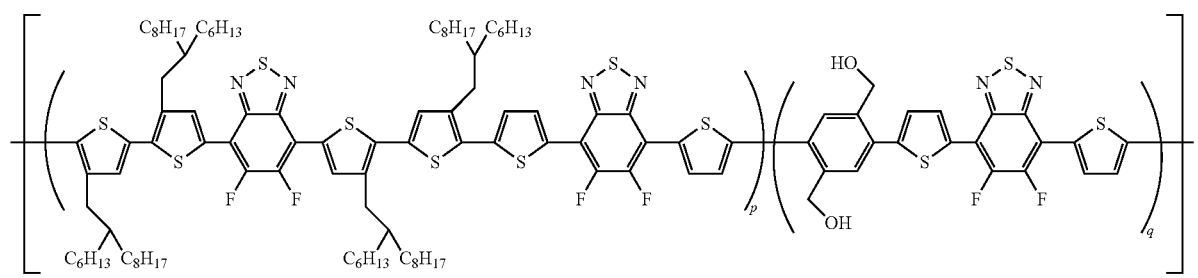
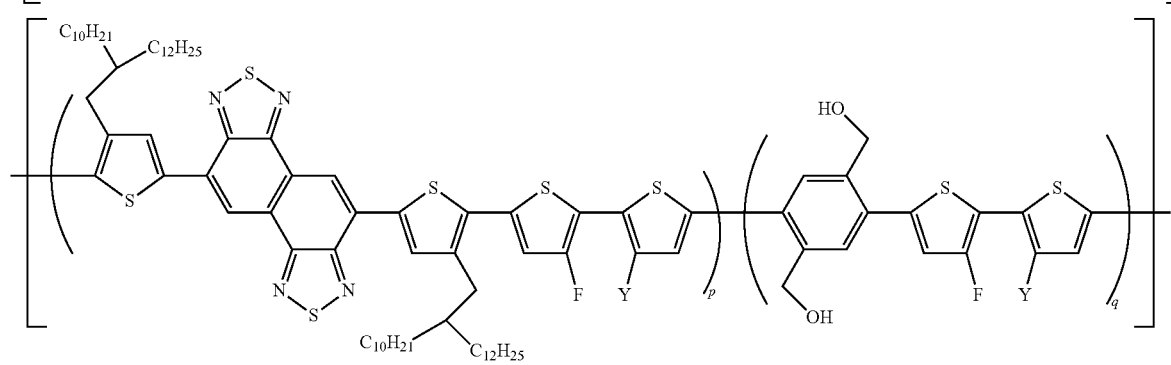
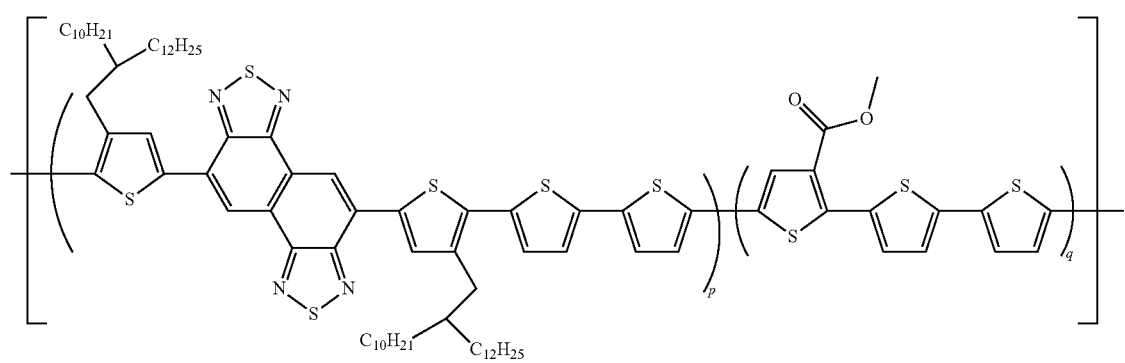
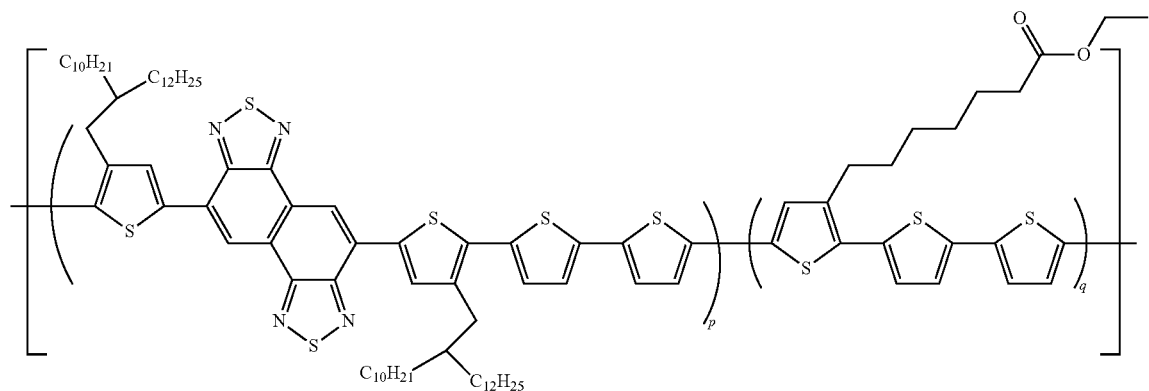

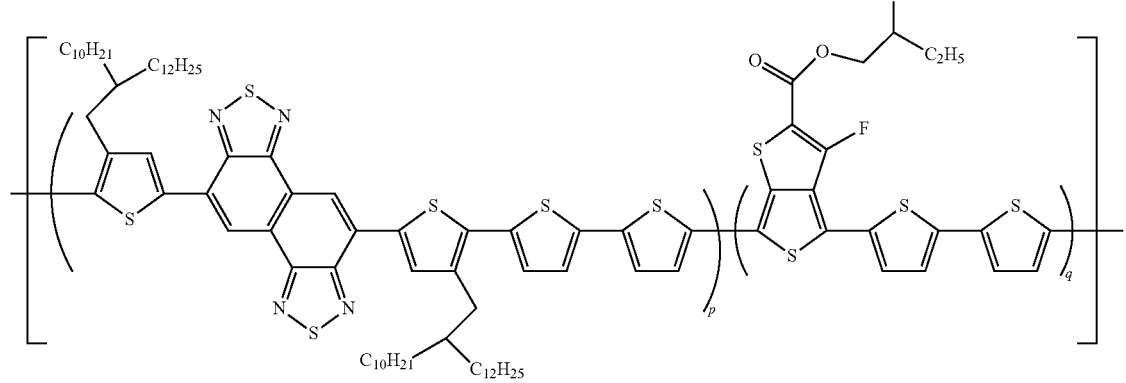
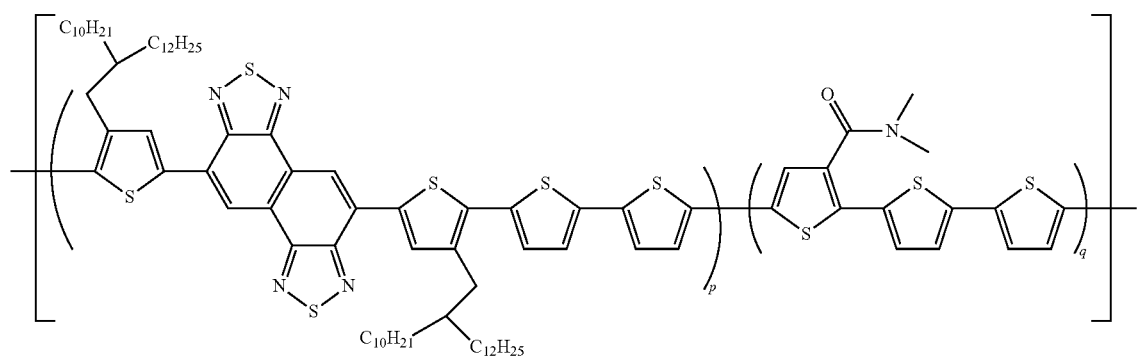
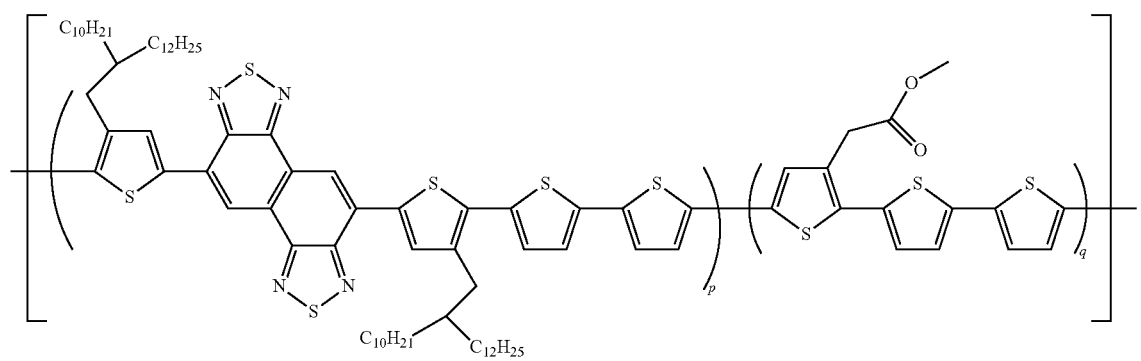
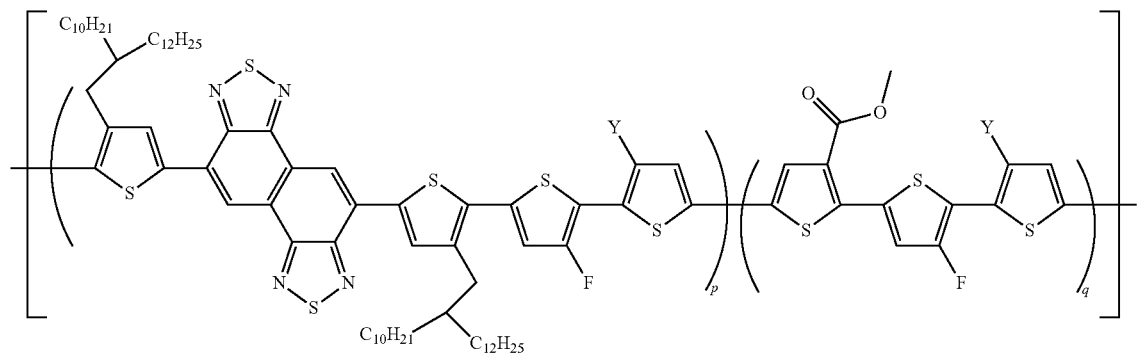

-continued

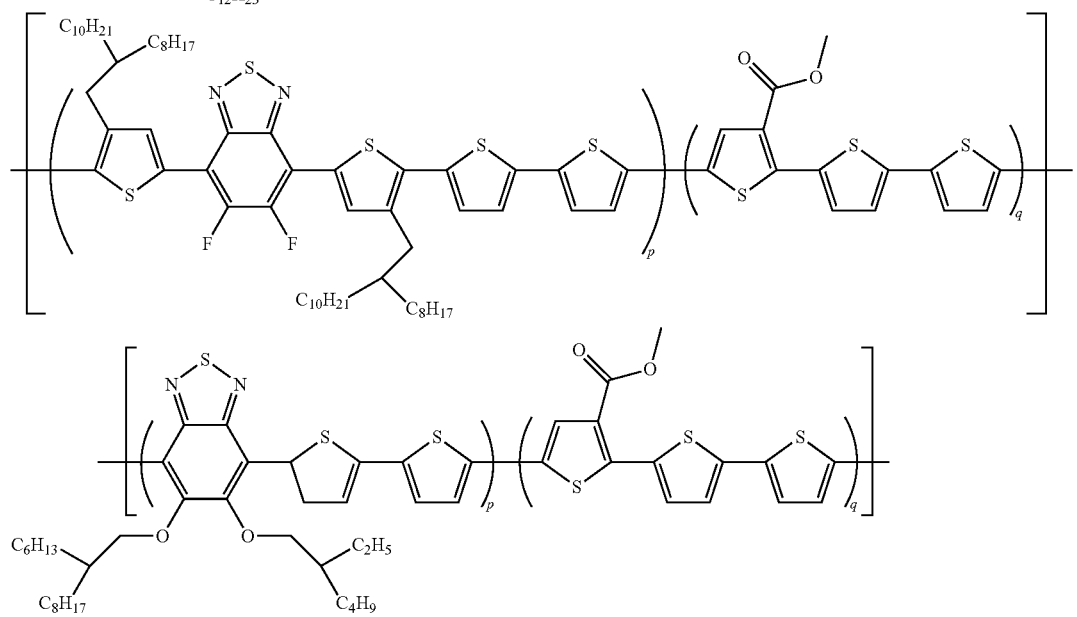

wherein

Y is hydrogen or fluorine; and p and q satisfy 0<p<1, 0<q<1, and p+q=1, as a mole fraction.

The polymer according to an exemplary embodiment of the present invention may have a weight average molecular weight of 1,000 to 1,000,000 g/mol.

In another general aspect, a method of preparing a polymer includes: polymerizing the following Chemical Formulae 5 and 6 with the following Chemical Formula 7 or 8:

[Chemical Formula 5]

[Chemical Formula 6]

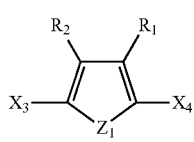

-continued

[Chemical Formula 7]

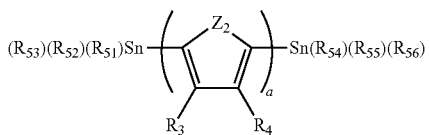

[Chemical Formula 8]

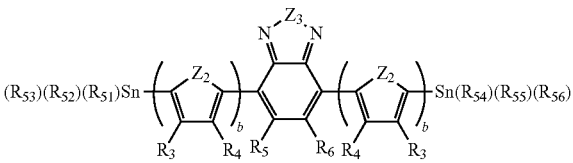

wherein

Ⓐ is an organic radical which is $C_3$-$C_{30}$ heteroarylene, a condensed polycyclic organic radical of $C_3$-$C_{30}$ heteroarylene, or a combination thereof;

$Z_1$ is S, Se, or O, or —C(R')=C(R')—, in which R' is independently of each other hydrogen, $C_1$-$C_{30}$ alkyl, $C_1$-$C_{30}$ alkoxy, or hydroxy$C_1$-$C_{30}$ alkyl;

$Z_2$ and $Z_3$ are independently of each other S, Se, or O;

$R_1$ is hydroxy$C_1$-$C_{30}$ alkyl;

$R_2$ to $R_6$ are independently of one another hydrogen, a halogen, $C_1$-$C_{30}$ alkyl, $C_1$-$C_{30}$ alkoxy, $C_6$-$C_{30}$ aryl, or $C_3$-$C_{30}$ heteroaryl;

$X_1$ and $X_4$ are independently of each other a halogen;

$R_{51}$ to $R_{56}$ are independently of one another hydrogen or $C_1$-$C_{30}$ alkyl;

a is an integer of 1 to 5;

b is independently of each other an integer of 0 to 5;

p and q satisfy $0<p<1$, $0<q<1$, and $p+q=1$, as a mole fraction; and the organic radical which is heteroarylene, a condensed polycyclic organic radical of heteroarylene, or a combination thereof of Ⓐ may be further substituted by one or more substituents selected from the group consisting of halogens, hydroxy, cyano, $C_1$-$C_{30}$ alkyl, $C_1$-$C_{30}$ alkoxy, $C_6$-$C_{30}$ aryl, $C_6$-$C_{30}$ aryl$C_1$-$C_{30}$ alkyl, and the like, and the heteroarylene includes one or more selected from the group consisting of B, N, O, S, P(=O), Si, P, and the like.

In still another general aspect, a method of preparing a polymer includes: polymerizing the following Chemical Formulae 5 and 7 with the following Chemical Formula 9 or 10:

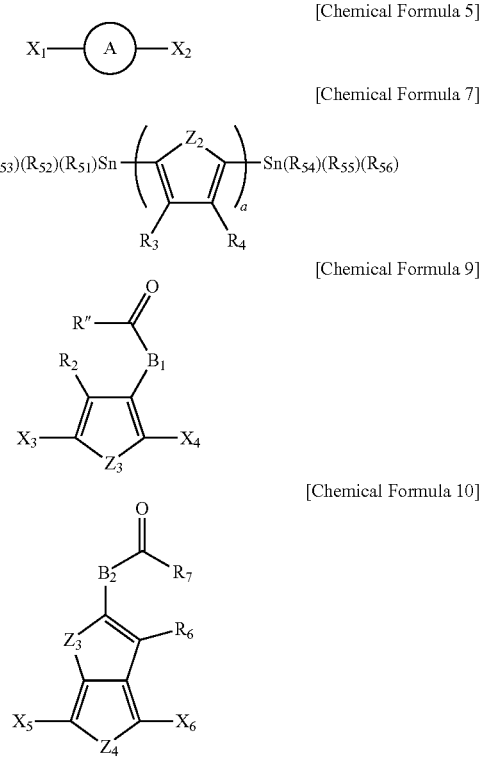

[Chemical Formula 5]

[Chemical Formula 7]

[Chemical Formula 9]

[Chemical Formula 10]

wherein $X_1$ to $X_6$ are independently of one another a halogen;

Ⓐ is an organic radical which is $C_3$-$C_{30}$ heteroarylene, a condensed polycyclic organic radical of $C_3$-$C_{30}$ heteroarylene, or a combination thereof;

$B_1$ and $B_2$ are independently of each other a single bond or $C_1$-$C_{30}$ alkylene;

$Z_2$ to $Z_4$ are independently of one another S, Se, or O;

R" and $R_7$ are independently of each other $C_1$-$C_{30}$ alkyl, $C_1$-$C_{30}$ alkoxy, or —$NR^aR^b$, in which $R^a$ and $R^b$ are independently of each other hydrogen or $C_1$-$C_{30}$ alkyl;

$R_2$ to $R_4$ and $R_6$ are independently of one another hydrogen, a halogen, $C_1$-$C_{30}$ alkyl, $C_1$-$C_{30}$ alkoxy, $C_6$-$C_{30}$ aryl, or $C_3$-$C_{30}$ heteroaryl;

$R_{51}$ to $R_{56}$ are independently of one another hydrogen or $C_1$-$C_{30}$ alkyl;

the organic radical which is heteroarylene, a condensed polycyclic organic radical of heteroarylene, or a combination thereof of Ⓐ may be further substituted by one or more substituents selected from the group consisting of halogens, hydroxy, cyano, $C_1$-$C_{30}$ alkyl, $C_1$-$C_{30}$ alkoxy, $C_6$-$C_{30}$ aryl, and $C_6$-$C_{30}$ aryl$C_1$-$C_{30}$ alkyl; and a is an integer of 1 to 5.

In still another general aspect, an organic electronic device includes the polymer of the present invention.

The polymer included in the organic electronic device according to an exemplary embodiment of the present invention may be used as an electron donor.

The organic electronic device according to an exemplary embodiment of the present invention may be selected from the group consisting of an organic light emitting device, an organic solar cell, an organic transistor, an organic photodetector drum, an organic memory device, and the like, but is not limited thereto.

Advantageous Effects

The polymer of the present invention has a polar functional group which is partially introduced to the polymer, thereby having high solubility in an organic solvent, and thus, an organic electronic device may be manufactured by a simple solution process, and even when an organic electronic device is manufactured at a low temperature, a power conversion efficiency is surprisingly improved.

In addition, the polymer of the present invention has a polar functional group which is partially introduced to the polymer, whereby a photoactive layer to which the polymer is introduced has improved stability, and a power conversion efficiency is not changed depending on a ratio of the electron receptor so that the power conversion efficiency is stable and excellent.

Accordingly, the organic electronic device adopting the polymer of the present invention has an excellent power conversion efficiency and stability, and may be easily mass-produced by a simple process such as $R_2R$.

BEST MODE

Figure 1:
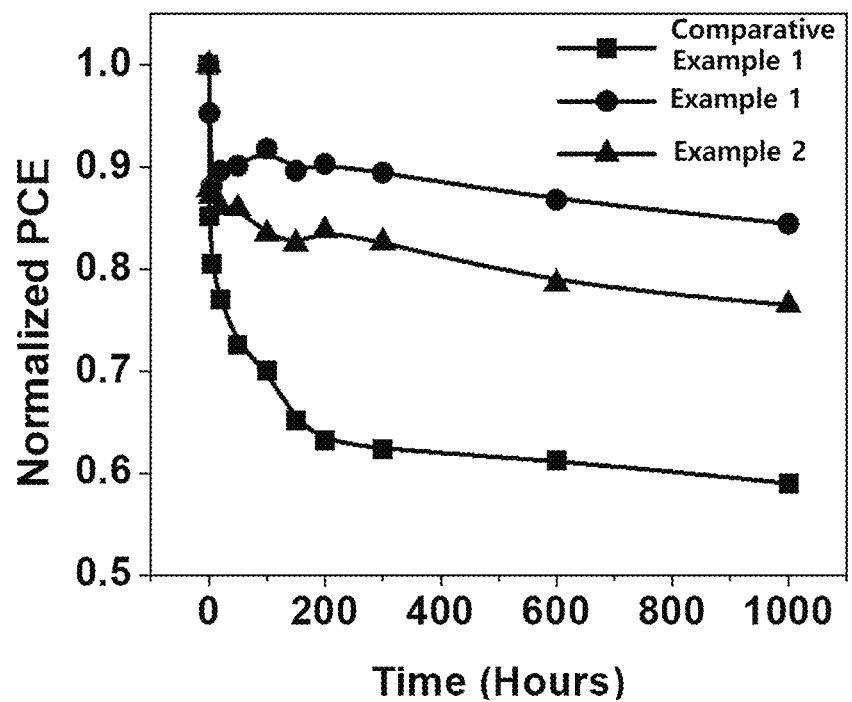
FIG. 1 is a graph representing a power conversion efficiency over time of an organic solar cell manufactured using the polymers of Example 1, Example 2, and Comparative Example 1 of the present invention.

Hereinafter, a polymer to which a polar functional group is partially introduced according to the present invention, a method of preparing the same, and an organic electronic device adopting the same will be described in more detail, using exemplary embodiments. However, the following exemplary embodiments are only a reference for describing the present invention in detail, and the present invention is not limited thereto, and may be implemented in various forms.

In addition, unless otherwise defined, all technical terms and scientific terms have the same meanings as those commonly understood by a person skilled in the art to which the present invention pertains. The terms used in the description of the present specification are only for effectively describing a certain exemplary embodiment, and not intended to limit the present invention.

The terms "alkyl", "alkoxy", and other substituents including an "alkyl" part, described herein, include both forms of straight chain and branched chain.

In addition, the term "aryl" described herein is an organic radical derived from an aromatic ring by removing one hydrogen atom, in which each ring includes a single or fused cyclic system including 4 to 7, and specifically 5 or 6 ring atoms, and even a form of a plurality of aryls being connected by a single bond is included.

In addition, the term "heteroaryl" described herein is an organic radical derived from an aromatic ring by removing one hydrogen atom, may be an aromatic ring organic radical including 3 to 8 ring atoms containing one or more selected from the group consisting of B, N, O, S, P(=O), Si, P, and the like, includes a cyclic system including appropriately 3 to 7, and specifically 5 or 6 ring atoms in each ring, and includes even a form of a plurality heteroaryls being connected by a single bond. However, the heteroaryl does not include condensed heteroarylene. Thus, the heteroaryl is interpreted as having a different meaning from that of the condensed polycyclic organic radical of heteroarylene as defined below herein.

In addition, the terms "fusion" and "condensation" described herein may be identically interpreted.

In addition, the term "heteroarylene" described herein means an organic radical derived from an aromatic ring by removing two hydrogen atoms, and also includes a form of heteroarylene being connected by a single bond.

In addition, the term "condensed polycyclic organic radical of heteroarylene" described herein means a divalent organic radical including a fused cyclic system derived from heteroarylene, may include one or more rings, and includes even a form being connected by a single bond at one or both sides of a fused cyclic system derived heteroarylene. Besides, the condensed polycyclic organic radical of heteroarylene described herein may be specifically a benzocondensed cyclic organic radical or pyrrole condensed cyclic organic radical derived from heteroarylene and the like, and more specifically

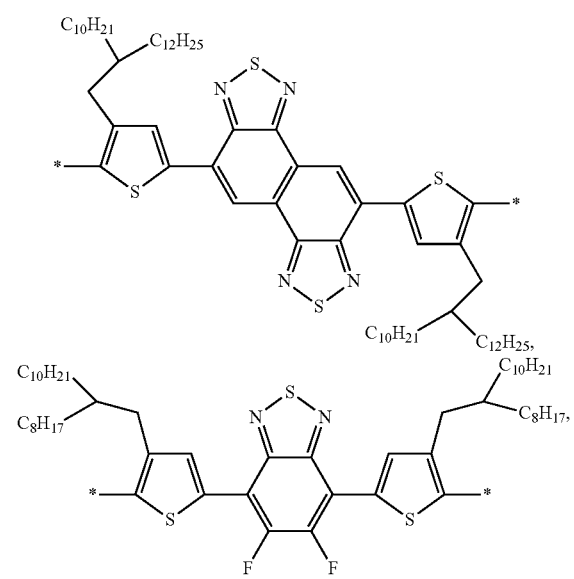

and the like disclosed in the present invention are also included in the benzocondensed cyclic organic radical.

Throughout the specification, a functional group includes both unsubstituted and substituted functional groups unless otherwise stated, and the number of carbons of the functional group does not include the number of carbons of the substituent being substituted. $C_1$-$C_{30}$ alkyl described herein may be unsubstituted alkyl having 1 to 30 carbon atoms or substituted alkyl having 1 to 30 carbon atoms, in which the number of carbons of 1 to 30 does not include the number of carbons of the substituent.

In addition, the term "substituted" described herein means that a hydrogen element bonded to a carbon element is substituted by one or more substituents selected from the group consisting of halogens, hydroxy, cyano, nitro, $C_1$-$C_{30}$ alkyl, $C_3$-$C_{30}$ cycloalkyl, $C_1$-$C_{30}$ alkoxy, $C_6$-$C_{30}$ aryl, $C_3$-$C_{30}$ heteroaryl, $C_6$-$C_{30}$ aryl$C_1$-$C_{30}$ alkyl, and the like, in a compound or a structure forming a compound.

Hereinafter, the polymer according to the present invention will be described.

The present invention provides a polymer to which a polar functional group is partially introduced, and the polymer of the present invention includes a repeating unit represented by the following Chemical Formula 1; and one or more repeating units selected from the group consisting of the following Chemical Formulae 2 to 4:

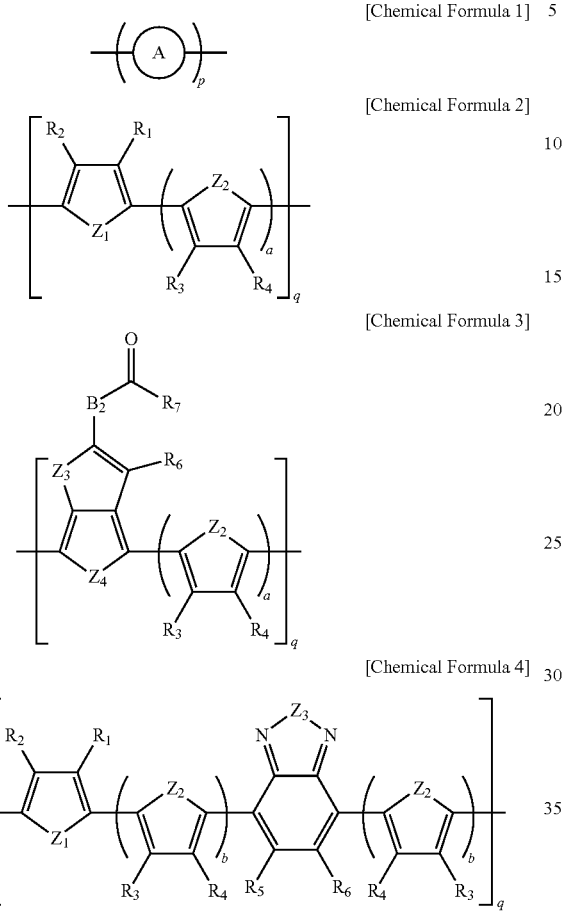

[Chemical Formula 1]

[Chemical Formula 2]

[Chemical Formula 3]

[Chemical Formula 4]

wherein

Ⓐ is an organic radical which is $C_3$-$C_{30}$ heteroarylene, a condensed polycyclic organic radical of $C_3$-$C_{30}$ heteroarylene, or a combination thereof;

$Z_1$ is S, Se, or O, or —C(R')=C(R')—, in which R' is independently of each other hydrogen, $C_1$-$C_{30}$ alkyl, $C_1$-$C_{30}$ alkoxy, or hydroxy$C_1$-$C_{30}$ alkyl;

$Z_2$ to $Z_4$ are independently of one another S, Se, or O;

$R_1$ is hydroxy$C_1$-$C_{30}$ alkyl or —$B_1$—C(=O)R'', in which $B_1$ is a single bond or $C_1$-$C_{30}$ alkylene, and R'' is $C_1$-$C_{30}$ alkyl, $C_1$-$C_{30}$ alkoxy, or —NR$^a$R$^b$, in which R$^a$ and R$^b$ are independently of each other hydrogen or $C_1$-$C_{30}$ alkyl;

$R_2$ to $R_6$ are independently of one another hydrogen, a halogen, $C_1$-$C_{30}$ alkyl, $C_1$-$C_{30}$ alkoxy, $C_6$-$C_{30}$ aryl, or $C_3$-$C_{30}$ heteroaryl;

$R_7$ is $C_1$-$C_{30}$ alkyl, $C_1$-$C_{30}$ alkoxy, or —NR$^a$R$^b$, in which R$^a$ and R$^b$ are independently of each other hydrogen or $C_1$-$C_{30}$ alkyl;

$B_2$ is a single bond or $C_1$-$C_{30}$ alkylene;

a is independently of each other an integer of 1 to 5;

b is independently of each other an integer of 0 to 5;

p and q satisfy 0<p<1, 0<q<1, and p+q=1, as a mole fraction; and the organic radical which is heteroarylene, a condensed polycyclic organic radical of heteroarylene, or a combination thereof of Ⓐ may be further substituted by one or more substituents selected from the group consisting of halogens, hydroxy, cyano, $C_1$-$C_{30}$ alkyl, $C_1$-$C_{30}$ alkoxy, $C_6$-$C_{30}$ aryl, and $C_6$-$C_{30}$ aryl$C_1$-$C_{30}$ alkyl, and the heteroarylene includes one or more selected from the group consisting of B, N, O, S, P(=O), Si, and P.

By introducing one or more repeating units having a polar functional group, selected from Chemical Formulae 2 to 4 to the polymer according to the present invention, the polymer implements a very high power conversion efficiency even in the case of being prepared at a significantly lower process temperature than a usual process temperature.

The polymer according to an exemplary embodiment of the present invention may include a repeating unit represented by the following Chemical Formulae 1 and 2 or the following Chemical Formulae 1 and 4:

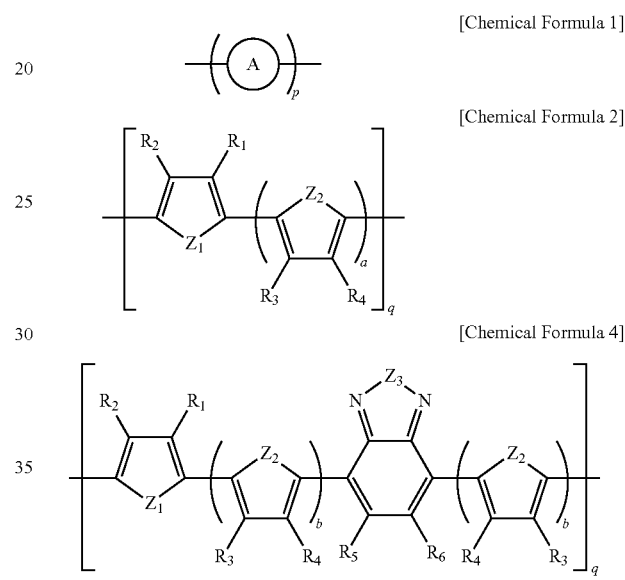

[Chemical Formula 1]

[Chemical Formula 2]

[Chemical Formula 4]

wherein

Ⓐ is an organic radical which is $C_3$-$C_{30}$ heteroarylene, a condensed polycyclic organic radical of $C_3$-$C_{30}$ heteroarylene, or a combination thereof;

$Z_1$ is S, Se, or O, or —C(R')=C(R')—, in which R' is independently of each other hydrogen, $C_1$-$C_{30}$ alkyl, $C_1$-$C_{30}$ alkoxy, or hydroxy$C_1$-$C_{30}$ alkyl;

$Z_2$ and $Z_3$ are independently of each other S, Se, or O;

$R_1$ is hydroxy$C_1$-$C_{30}$ alkyl;

$R_2$ to $R_6$ are independently of one another hydrogen, a halogen, $C_1$-$C_{30}$ alkyl, $C_1$-$C_{30}$ alkoxy, $C_6$-$C_{30}$ aryl, or $C_3$-$C_{30}$ heteroaryl;

a is an integer of 1 to 5;

b is independently of each other an integer of 0 to 5;

p and q satisfy 0<p<1, 0<q<1, and p+q=1, as a mole fraction; and the organic radical which is heteroarylene, a condensed polycyclic organic radical of heteroarylene, or a combination thereof of Ⓐ may be further substituted by one or more substituents selected from the group consisting of halogens, hydroxy, cyano, $C_1$-$C_{30}$ alkyl, $C_1$-$C_{30}$ alkoxy, $C_6$-$C_{30}$ aryl, and $C_6$-$C_{30}$ aryl$C_1$-$C_{30}$ alkyl, and the heteroarylene includes one or more selected from the group consisting of B, N, O, S, P(=O), Si, and P.

The polymer according to an exemplary embodiment of the present invention may include a repeating unit represented by the following Chemical Formulae 1 and 2-1, or a repeating unit represented by the following Chemical Formulae 1 and 3:

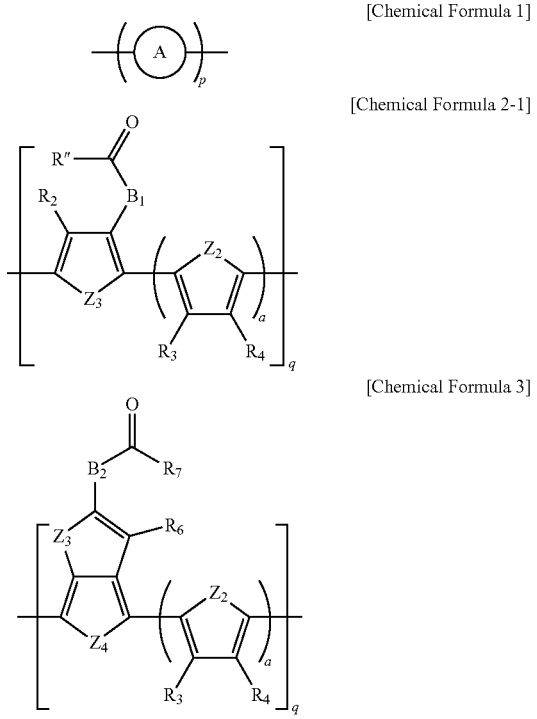

[Chemical Formula 1]

[Chemical Formula 2-1]

[Chemical Formula 3]

wherein

Ⓐ is an organic radical which is $C_3$-$C_{30}$ heteroarylene, a condensed polycyclic organic radical of $C_3$-$C_{30}$ heteroarylene, or a combination thereof;

$Z_2$ to $Z_4$ are independently of one another S, Se, or O;

$R_2$ to $R_4$ and $R_6$ are independently of one another hydrogen, a halogen, $C_1$-$C_{30}$ alkyl, $C_1$-$C_{30}$ alkoxy, $C_6$-$C_{30}$ aryl, or $C_3$-$C_{30}$ heteroaryl;

R" and $R_7$ are independently of each other $C_1$-$C_{30}$ alkyl, $C_1$-$C_{30}$ alkoxy, or —$NR^aR^b$, in which $R^a$ and $R^b$ are independently of each other hydrogen or $C_1$-$C_{30}$ alkyl;

$B_1$ and $B_2$ are independently of each other a single bond or $C_1$-$C_{30}$ alkylene;

a is independently of each other an integer of 1 to 5;

p and q satisfy 0<p<1, 0<q<1, and p+q=1, as a mole fraction; and the organic radical which is heteroarylene, a condensed polycyclic organic radical of heteroarylene, or a combination thereof of Ⓐ may be further substituted by one or more substituents selected from the group consisting of halogens, hydroxy, cyano, $C_1$-$C_{30}$ alkyl, $C_1$-$C_{30}$ alkoxy, $C_6$-$C_{30}$ aryl, and $C_6$-$C_{30}$ aryl$C_1$-$C_{30}$ alkyl, and the heteroarylene includes one or more selected from the group consisting of B, N, O, S, P(=O), Si, and P.

By introducing a repeating unit represented by Chemical Formula 2, 2-1, 3, 4, or a combination thereof to a monomer used as an electron donor of the organic electronic device represented by Chemical Formula 1 by polymerization, the polymer of the present invention has an asymmetric polymer structure instead of a regular repeating unit of the polymer, and thus, has an improved solubility in an organic solvent, so that an organic electronic device may be manufactured by a solution process.

In addition, by partially introducing a repeating unit having a polar functional group to the polymer of the present invention, a module of an organic electronic device adopting the polymer has a very high power conversion efficiency even in the case of being manufactured at a very low temperature, the power conversion efficiency is maintained constant even in the case in which a mixing ratio with an electron receptor varies, and thus, the polymer may be variously applied to various processes such as an $R_2R$ (roll to roll) process to raise a commercialization level.

Furthermore, by partially introducing a repeating unit having a polar functional group represented by Chemical Formula 2, 2-1, 3, 4, or a combination thereof to the polymer of the present invention, attraction to a polar surface of an electron receptor, a hole transport layer, an electron transport layer, and the like is increased, and thus, the photoactive layer adopting the polymer has very high stability.

By introducing a repeating unit having a polar functional group described in detail in Chemical Formula 1 to the polymer of the present invention, the polymer has an improved power conversion efficiency and stability as compared with the polymer having only the repeating unit represented by Chemical Formula 1 usually used as an organic semiconductor compound, and the process is significantly improved, so that commercialization is very easy.

In terms of an excellent power conversion efficiency and increasing stability and commercialization level, in the polymer according to an exemplary embodiment of the present invention, specifically the mole fractions of p and q may be 0.5<p<1, 0<q<0.5, and p+q=1, more specifically the mole fractions of p and q may be 0.7<p<1, 0<q<0.3, and p+q=1, and most specifically the mole fractions of p and q may be 0.89<p<1, 0.01<q<0.11, and p+q=1.

In terms of an excellent power conversion efficiency and increasing stability and commercialization level of an organic electronic device, specifically, A of the polymer according to an exemplary embodiment of the present invention may be an organic radical which is $C_3$-$C_{30}$ heteroarylene; a benzocondensed cyclic organic radical of heteroarylene selected from the group consisting of naphthobisthiadiazolylene, benzothiadiazolylene, benzofuranylene, benzothiopheneylene, isobenzofuranylene, benzoimidazolylene, benzothiazolylene, benzoisothiazolylene, benzoisoxazolylene, benzoxazolylene, benzoxadiazolylene, isoindolylene, indolylene, indazolylene, quinolylene, isoquinolylene, cinnolinylene, quinazolinylene, quinoxalinylene, carbazolylene, phenanthridinylene, benzodioxolylene, dibenzofuranylene, dibenzothiophenylene, thiadiazolopyridinylene, thiadiazolonaphthothiadiazolylene, and the like; or a combination thereof; $Z_1$ may be S or —CH=C(R')—, in which R' is hydroxy$C_1$-$C_{30}$ alkyl or —$B_1$—C(=O)R", in which $B_1$ is a single bond or $C_1$-$C_{30}$ alkylene, and R" is $C_1$-$C_{30}$ alkyl, $C_1$-$C_{30}$ alkoxy, or —$NR^aR^b$, in which $R^a$ and $R^b$ are independently of each other hydrogen or $C_1$-$C_{30}$ alkyl; $R_2$ to $R_6$ may be independently of one another hydrogen, a halogen, or $C_1$-$C_{30}$ alkyl; $R_7$ may be $C_1$-$C_{30}$ alkyl, $C_1$-$C_{30}$ alkoxy, or —$NR^aR^b$, in which $R_a$ and $R_b$ are independently of each other hydrogen or $C_1$-$C_{30}$ alkyl; a may be independently of each other an integer of 1 to 3; b may be independently of each other an integer of 0 to 3; the organic radical which is heteroarylene, a condensed polycyclic organic radical of heteroarylene, or a combination thereof of A may be further substituted by one or more substituents selected from the group consisting of halogens, hydroxy, cyano, $C_1$-$C_{30}$ alkyl, $C_1$-$C_{30}$ alkoxy, $C_6$-$C_{30}$ aryl, $C_6$-$C_{30}$ aryl$C_1$-$C_{30}$ alkyl, and the like, and the heteroarylene may include one or more selected from the group consisting of B, N, O, S, P(=O), Si, P, and the like.

More specifically, in the repeating unit represented by Chemical Formula 2 of the polymer according to an exemplary embodiment of the present invention, $Z_1$ may be S or —CH=C(R')—, R' may be hydroxy$C_1$-$C_{30}$ alkyl; and $Z_2$ may be S.

As an example, in Chemical Formula 2, $Z_1$ may be S or —CH=C(R')—, R' may be hydroxy$C_1$-$C_{10}$ alkyl; and $Z_2$ may be S.

As an example, in Chemical Formula 2, $Z_1$ may be S or —CH=C(R')—, R' may be hydroxy$C_1$-$C_7$ alkyl; and $Z_2$ may be S.

As an example, in Chemical Formula 2, $Z_1$ may be S or —CH=C(R')—, R' may be hydroxy$C_1$-$C_4$ alkyl; and $Z_2$ may be S.

As an example, in Chemical Formula 2, $Z_1$ may be —$B_1$—C(=O)R", in which $B_1$ is a single bond or $C_1$-$C_{10}$ alkylene, R" is $C_1$-$C_{10}$ alkyl, $C_1$-$C_{10}$ alkoxy, or —NR$^a$R$^b$, in which R$^a$ and R$^b$ are independently of each other hydrogen or $C_1$-$C_{10}$ alkyl; and $Z_2$ may be S.

More specifically, in the repeating unit represented by Chemical Formula 3 of the polymer according to an exemplary embodiment of the present invention, $Z_2$ to $Z_4$ may be S.

More specifically, in the repeating unit represented by Chemical Formula 4 of the polymer according to an exemplary embodiment of the present invention, $Z_1$ may be S or —CH=C(R')—, R' may be hydroxy$C_1$-$C_{30}$ alkyl; and $Z_2$ and $Z_3$ may be S.

As an example, in Chemical Formula 4, $Z_1$ may be S or —CH=C(R')—, in which R' is hydroxy$C_1$-$C_{10}$ alkyl; and $Z_2$ and $Z_3$ may be S.

As an example, in Chemical Formula 4, $Z_1$ may be S or —CH=C(R')—, in which R' is hydroxy$C_1$-$C_7$ alkyl; and $Z_2$ and $Z_3$ may be S.

As an example, in Chemical Formula 4, $Z_1$ may be S or —CH=C(R')—, in which R' is hydroxy$C_1$-$C_4$ alkyl; and $Z_2$ and $Z_3$ may be S.

In terms of implementing a very high power conversion efficiency even in the case of preparation at a low temperature, specifically, the repeating unit represented by Chemical Formula 1 of the polymer according to an exemplary embodiment of the present invention may be the repeating unit represented by Chemical Formula 4-1 or 4-2, and these may include the repeating unit having a polar functional group described above at the same time.

[Chemical Formula 4-1]

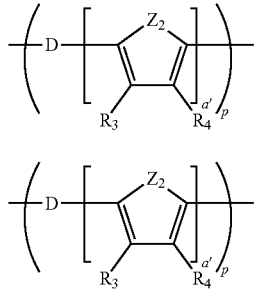

[Chemical Formula 4-2]

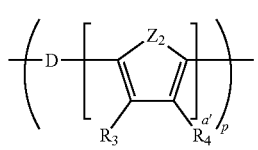

wherein

D is independently of each other an organic radical which is $C_3$-$C_{30}$ heteroarylene; a condensed polycyclic organic radical of heteroarylene selected from the group consisting of naphthobisthiadiazolylene, benzothiadiazolylene, benzofuranylene, benzothiopheneylene, isobenzofuranylene, benzoimidazolylene, benzothiazolylene, benzoisothiazolylene, benzoisoxazolylene, benzoxazolylene, benzoxadiazolylene, isoindolylene, indolylene, indazolylene, quinolylene, isoquinolylene, cinnolinylene, quinazolinylene, quinoxalinylene, carbazolylene, phenanthridinylene, benzodioxolylene, dibenzofuranylene, dibenzothiophenylene, thiadiazolopyridinylene, and thiadiazolonaphthothiadiazolylene; or a combination thereof;

$Z_2$ is independently of each other S, Se, or O;

$R_3$ and $R_4$ are independently of each other hydrogen, a halogen, $C_1$-$C_{30}$ alkyl, $C_1$-$C_{30}$ alkoxy, $C_6$-$C_{30}$ aryl, or $C_3$-$C_{30}$ heteroaryl;

a' is an integer of 0 to 5;

a" is independently of each other an integer of 1 to 5;

p satisfies 0<p<1, as a mole fraction; and the organic radical which is heteroarylene, a benzocondensed cyclic organic radical of heteroarylene, or a combination thereof of D may be further substituted by one or more substituents selected from the group consisting of halogens, hydroxy, cyano, $C_1$-$C_{30}$ alkyl, $C_1$-$C_{30}$ alkoxy, $C_6$-$C_{30}$ aryl, $C_6$-$C_{30}$ aryl$C_1$-$C_{30}$ alkyl, and the like, and the heteroarylene includes one or more selected from the group consisting of B, N, O, S, P(=O), Si, and P.

Specifically, in the repeating unit represented by Chemical Formula 4-1 or 4-2 of the polymer according to an exemplary embodiment of the present invention, $R_3$ and $R_4$ are preferably independently of each other hydrogen or a halogen.

Specifically in the repeating unit represented by Chemical Formula 4-1 or 4-2 of the polymer according to an exemplary embodiment of the present invention, D may be selected from the following structural formulae:

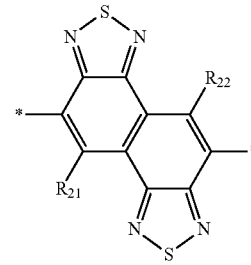

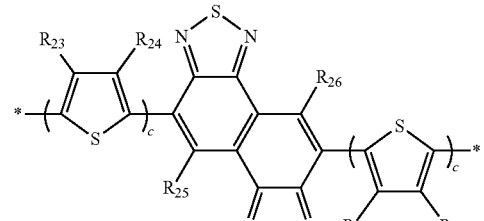

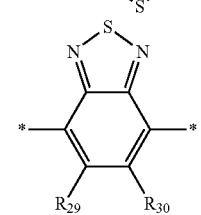

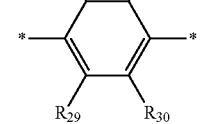

-continued

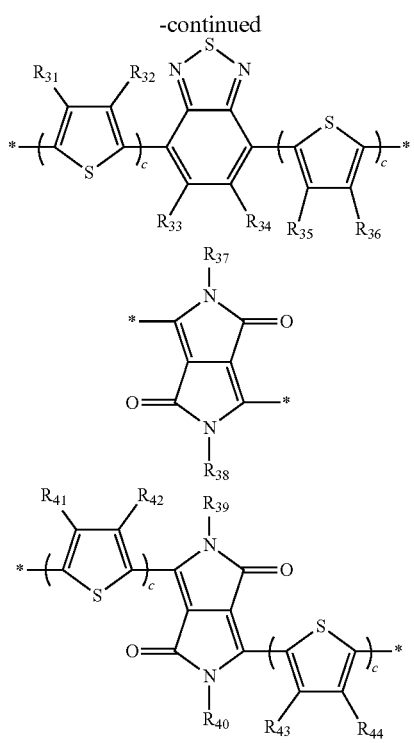

wherein $R_{21}$ to $R_{36}$ and $R_{41}$ to $R_{44}$ are independently of one another hydrogen, a halogen, $C_1$-$C_{30}$ alkyl, or $C_1$-$C_{30}$ alkoxy;

c is an integer of 1 or 2, and when c is 2, substituents of the repeating unit may be identical to or different from each other, and at least one of the substituents of each repeating unit is $C_1$-$C_{30}$ alkyl or $C_1$-$C_{30}$ alkoxy; and $R_{37}$ to $R_{40}$ are independently of one another hydrogen or $C_1$-$C_{30}$ alkyl.

Specifically, the polymer according to an exemplary embodiment of the present invention may be represented by the following Chemical Formulae 11 to 13:

[Chemical Formula 11]

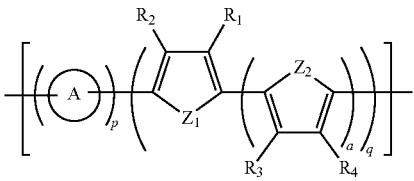

[Chemical Formula 12]

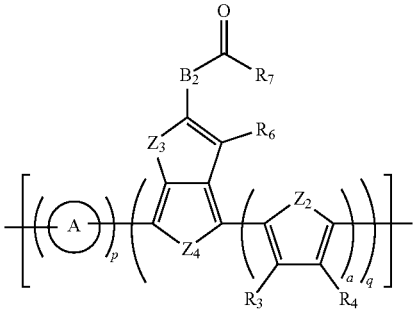

[Chemical Formula 13]

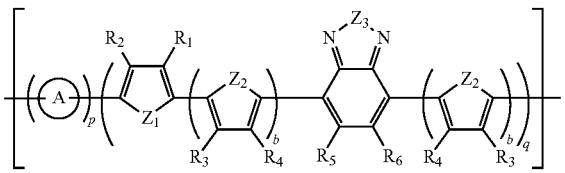

wherein each substituent is as defined in claim 1.

More specifically, the polymer according to an exemplary embodiment of the present invention may be selected from the following compounds, but is limited thereto:

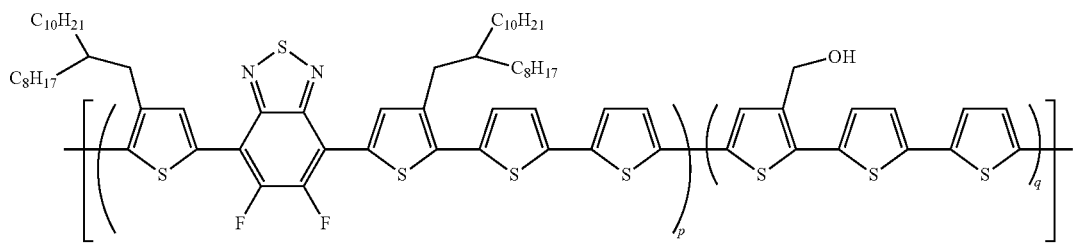

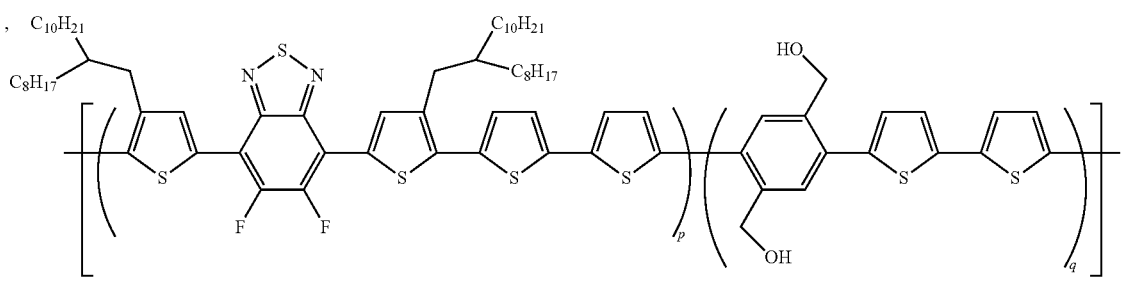

-continued
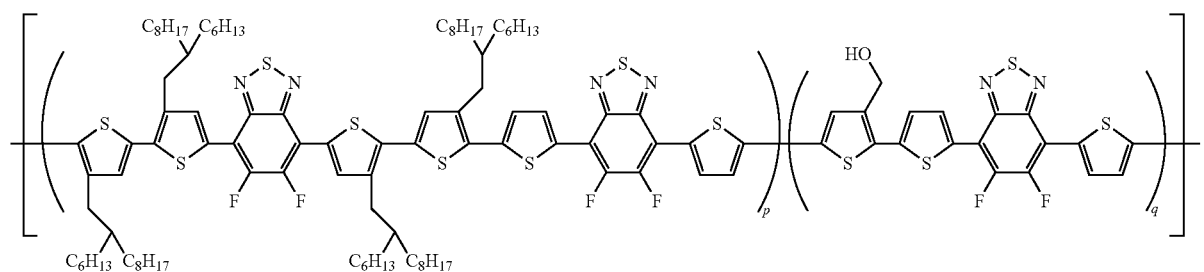
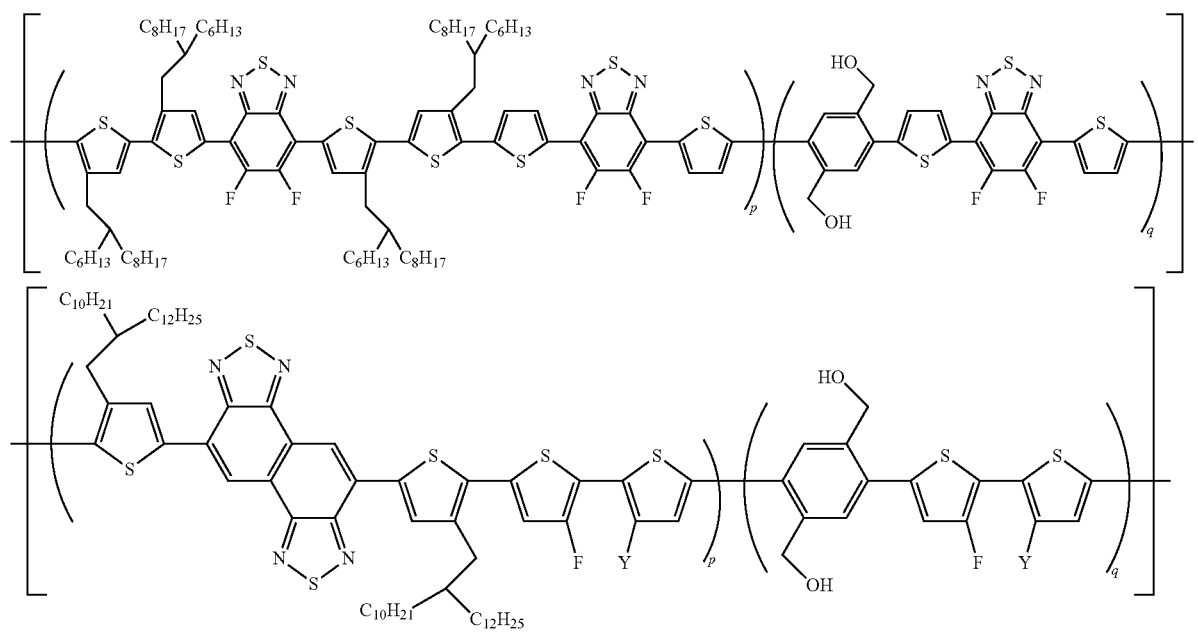
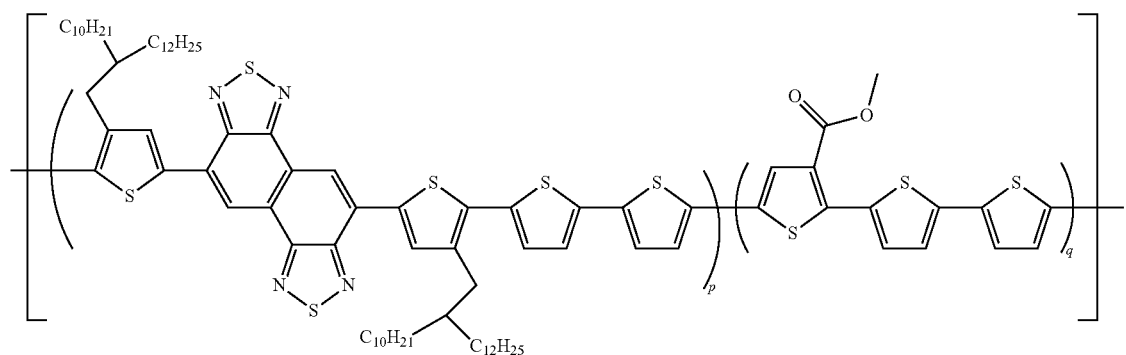
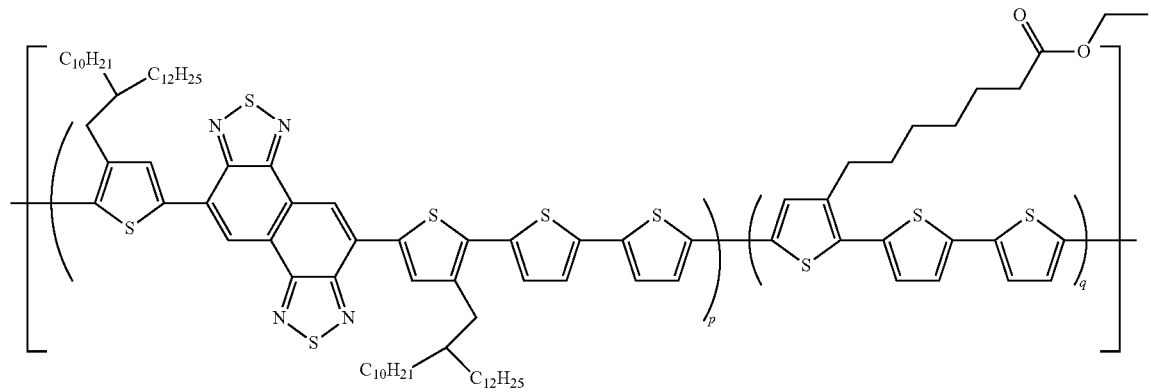

-continued
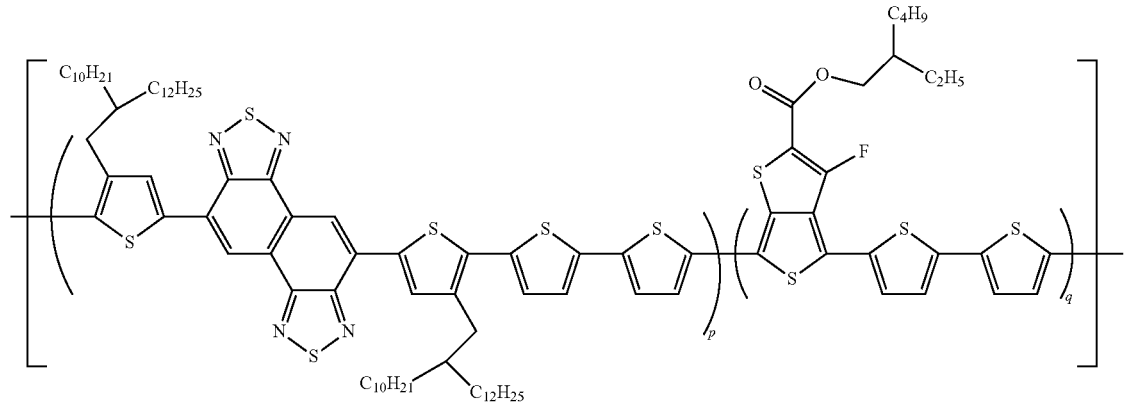
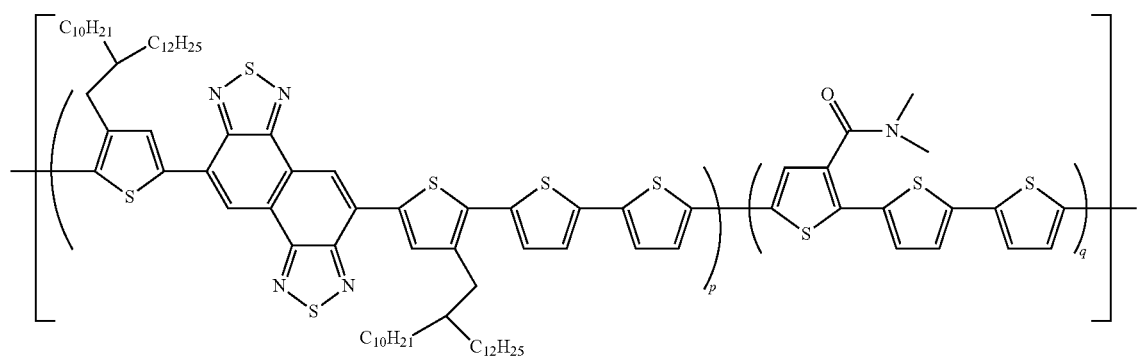
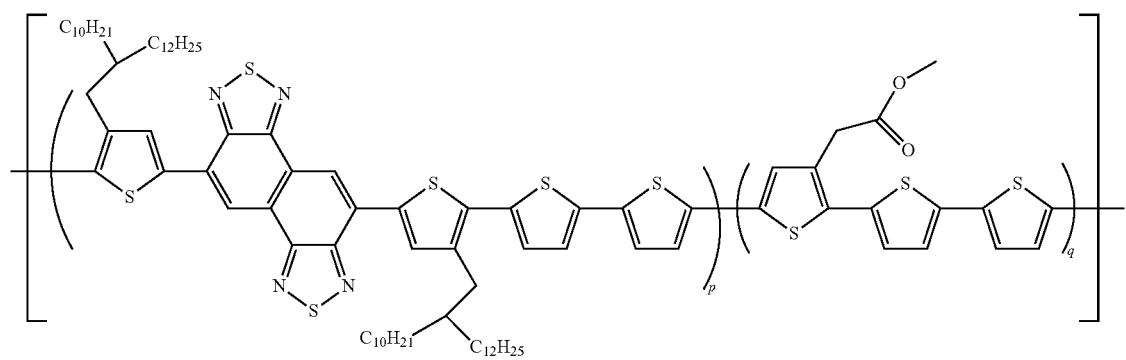
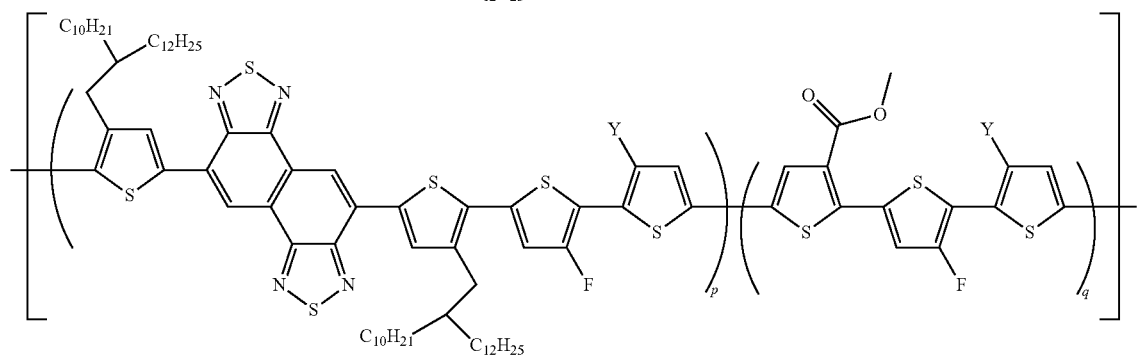

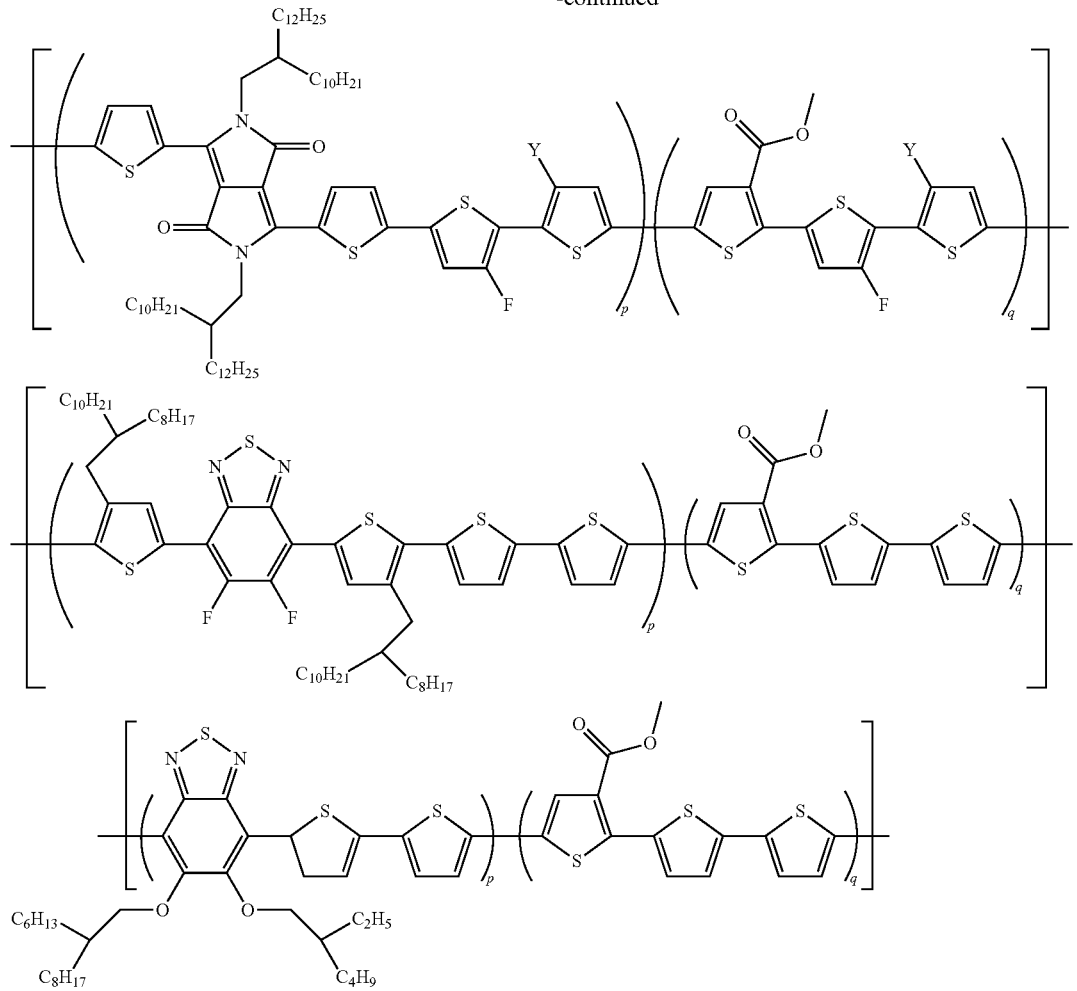

wherein

Y is hydrogen or fluorine; and fraction.

In terms of an excellent power conversion efficiency and increasing stability and commercialization level, it is preferred that the mole fraction of the exemplary embodiment is satisfied for imparting significant synergy.

As an example, in the above compound, the mole fractions of p and q may be specifically 0.5<p<1, 0<q<0.5, and p+q=1.

As an example, in the above compound, the mole fractions of p and q may be more specifically 0.7<p<1, 0<q<0.3, and p+q=1.

As an example, in the above compound, the mole fractions of p and q may be most specifically 0.89<p<1, 0.01<q<0.11, and p+q=1.

In addition, the polymer according to an exemplary embodiment of the present invention may have a weight average molecular weight of 1,000 to 1,000,000 g/mol. In terms of having a high power conversion efficiency and not having a lowered solubility to allow formation and preparation of a uniform thin film, the weight average molecular weight may be specifically 10,000 to 400,000 g/mol, and more specifically 10,000 to 200,000 g/mol, but is not limited thereto.

In addition, the polymer according to an exemplary embodiment of the present invention may include the repeating unit represented by Chemical Formulae 1 and 2 or the repeating unit represented by Chemical Formulae 1 and 3, and a polymerized product of each repeating unit represented by Chemical Formula 2 or 3 being alternately or randomly polymerized with Chemical Formula 1 may also be an exemplary embodiment of the present invention.

Hereinafter, the method of preparing a polymer according to the present invention will be described.

The polymer of the present invention may be prepared by a method of preparing a polymer, including: polymerizing the following Chemical Formulae 5 and 6 with the following Chemical Formula 7 or 8 (preparation method 1):

[Chemical Formula 5]

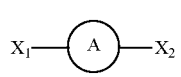

[Chemical Formula 6]

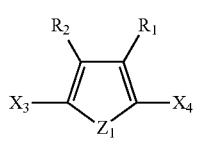

[Chemical Formula 7]

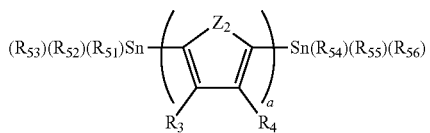

[Chemical Formula 8]

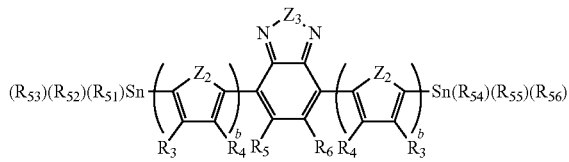

wherein

Ⓐ is an organic radical which is $C_3$-$C_{30}$ heteroarylene, a condensed polycyclic organic radical of $C_3$-$C_{30}$ heteroarylene, or a combination thereof;

$Z_1$ is S, Se, or O, or —C(R')=C(R')—, in which R' is independently of each other hydrogen, $C_1$-$C_{30}$ alkyl, $C_1$-$C_{30}$ alkoxy, or hydroxy$C_1$-$C_{30}$ alkyl;

$Z_2$ and $Z_3$ are independently of each other S, Se, or O;

$R_1$ is hydroxy$C_1$-$C_{30}$ alkyl;

$R_2$ to $R_6$ are independently of one another hydrogen, a halogen, $C_1$-$C_{30}$ alkyl, $C_1$-$C_{30}$ alkoxy, $C_6$-$C_{30}$ aryl, or $C_3$-$C_{30}$ heteroaryl;

$X_1$ to $X_4$ are independently of one another a halogen;

$R_{51}$ to $R_{56}$ are independently of one another hydrogen or $C_1$-$C_{30}$ alkyl;

a is an integer of 1 to 5;

b is independently of each other an integer of 0 to 5;

p and q satisfy 0<p<1, 0<q<1, and p+q=1, as a mole fraction; and the organic radical which is heteroarylene, a condensed polycyclic organic radical of heteroarylene, or a combination thereof of Ⓐ may be further substituted by one or more substituents selected from the group consisting of halogens, hydroxy, cyano, $C_1$-$C_{30}$ alkyl, $C_1$-$C_{30}$ alkoxy, $C_6$-$C_{30}$ aryl, $C_6$-$C_{30}$ aryl$C_1$-$C_{30}$ alkyl, and the like, and the heteroarylene includes one or more selected from the group consisting of B, N, O, S, P(=O), Si, P, and the like.

Specifically, the polymer of the present invention may be prepared by polymerizing Chemical Formulae 5, 6, and 7, or polymerizing Chemical Formulae 5, 6, and 8, and may be prepared by polymerizing 0.03 to 0.97 moles of the compound represented by Chemical Formula 5 and 0.03 to 0.97 moles of the compound represented by Chemical Formula 7 with 1 mole of the compound represented by Chemical Formula 6. However, the sum of moles of the compounds represented by Chemical Formulae 5 and 7 is 1 mole. Likewise, the polymer may be prepared by polymerizing 0.03 to 0.97 moles of the compound represented by Chemical Formula 5 and 0.03 to 0.97 moles of the compound represented by Chemical Formula 8 with 1 mole of the compound represented by Chemical Formula 6. However, the sum of moles of the compounds represented by Chemical Formulae 5 and 8 is 1 mole. Specifically, the polymer may be prepared by polymerizing 0.99 to 0.5 moles of the compound represented by Chemical Formula 5 and 0.01 to 0.5 moles of the compound represented by Chemical Formula 7 or 8 with 1 mole of the compound represented by Chemical Formula 6. More specifically, the mole ratio of each compound used may follow the mole fractions of p and q described above.

The polymer of the present invention is adjusted to have the mole ratio in the above range and is polymerized so that a monomer to which a polar functional group is partially introduced is included, thereby having a significantly improved power conversion efficiency and commercialization characteristics (for example, stability over time) as compared with the polymer having only a single repeating unit represented by Chemical Formula 5.

In addition, any polymerization according to an exemplary embodiment of the present invention is possible as long as it is performed by a known method which may be recognized by a person skilled in the art, and specifically, the polymerization may be performed under a palladium-based catalyst. Here, as the palladium-based catalyst, a commonly used palladium-based catalyst such as Pd(II)acetate (Pd(OAc)$_2$), palladium chloride (PdCl$_2$), and tetrakis(triphenylphosphine)palladium (Pd(PPh$_3$)$_4$) may be used, and specifically tris(dibenzylideneacetone) dipalladium (Pd$_2$(dba)$_3$) may be used, but the present invention is not limited thereto. In addition, an added amount of the palladium-based catalyst may be at a ratio of 0.01 to 1 mole, and more specifically 0.01 to 0.1 mole with respect to 1 mole of the compound represented by Chemical Formula 6, but is not limited thereto.

In addition, in the course of the polymerization, when the palladium-based catalyst is used, any one or two or more phosphine ligands selected from the group consisting of tri(o-tolyl)phosphine (P(o-Tol)$_3$), triphenylphosphine (PPh$_3$), tri-tert-butylphosphine (P(t-bu)$_3$), and the like may be used in combination, and the phosphine ligand may stabilize palladium electronically to assist regeneration of a palladium compound having a reaction activity, and act as a compliment to maintain a palladium catalysis cycle. An added amount of the phosphine ligand may be at a ratio of 0.01 to 1 mole, and specifically 0.01 to 0.5 mole with respect to 1 mole of the compound represented by Chemical Formula 6, but is not limited thereto.

In addition, a microwave may be added to the polymerization and used.

In addition, polymerization temperature and time may vary depending on the kind and amount of monomers, and are not limited, but as an example, polymerization may proceed at 100 to 200° C. for 30 minutes to 2 hours.

In the preparation method according to an exemplary embodiment of the present invention, a solvent used in the polymerization is not limited as long as it is a common organic solvent, but may include methylene chloride (MC), chlorobenzene, toluene, benzene, chloromethane, chloroform, carbon tetrachloride, 1,1-dichloroethane, 1,2-dichloroethane, ethyl chloride, trichloroethane, 1-chloropropane, 2-chloropropane, and the like.

In addition, the polymer of the present invention may be prepared by a method of preparing a polymer, including: polymerizing the following Chemical Formulae 5 and 7 with the following Chemical Formula 9 or 10 (preparation method 2):

[Chemical Formula 5]

[Chemical Formula 7]

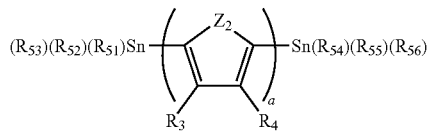

[Chemical Formula 9]

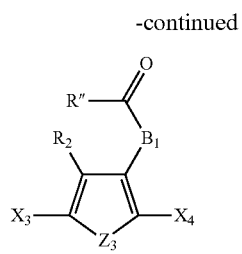

[Chemical Formula 10]

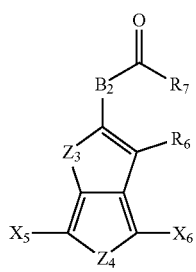

wherein $X_1$ and $X_6$ are independently of each other a halogen;

Ⓐ is an organic radical which is $C_3$-$C_{30}$ heteroarylene, a condensed polycyclic organic radical of $C_3$-$C_{30}$ heteroarylene, or a combination thereof;

$B_1$ and $B_2$ are independently of each other a single bond or $C_1$-$C_{30}$ alkylene;

$Z_2$ to $Z_4$ are independently of one another S, Se, or O;

R″ and $R_7$ are independently of each other $C_1$-$C_{30}$ alkyl, $C_1$-$C_{30}$ alkoxy, or —$NR^aR^b$, in which $R^a$ and $R^b$ are independently of each other hydrogen or $C_1$-$C_{30}$ alkyl;

$R_2$ to $R_4$ and $R_6$ are independently of one another hydrogen, a halogen, $C_1$-$C_{30}$ alkyl, $C_1$-$C_{30}$ alkoxy, $C_6$-$C_{30}$ aryl, or $C_3$-$C_{30}$ heteroaryl;

$R_{51}$ to $R_{56}$ are independently of one another hydrogen or $C_1$-$C_{30}$ alkyl;

the organic radical which is heteroarylene, a condensed polycyclic organic radical of heteroarylene, or a combination thereof of Ⓐ may be further substituted by one or more substituents selected from the group consisting of halogens, hydroxy, cyano, $C_1$-$C_{30}$ alkyl, $C_1$-$C_{30}$ alkoxy, $C_6$-$C_{30}$ aryl, and $C_6$-$C_{30}$ aryl$C_1$-$C_{30}$ alkyl; and a is an integer of 1 to 5.

The related description of the preparation method 2 described later will be omitted, since the preparation method 2 may be performed in similar process conditions to the preparation method 1.

Hereinafter, an organic electronic device adopting the polymer according to the present invention will be described.

The organic electronic device of the present invention necessarily includes the polymer of the present invention, and specifically, may be used as an electron receptor.

The organic electronic device of the present invention may be any one selected from the group consisting of an organic light emitting diode (OLED), an organic solar cell (OSC), an organic thin-film transistor (OTFT), an organic photodetector (OPD) drum, an organic memory device, and the like. Any organic electronic device is possible as long as it is a common organic electronic device which may be recognized by a person skilled in the art, and the polymer of the present invention may further improve performance of the organic electronic device by combination with various other electron receptors included in the organic electronic device.

The polymer according to the present invention may form a film by a solution process in which the polymer is dissolved in an organic solvent and applied to a substrate, and used as the organic electronic device, and specifically, the polymer may form a film by application and coating by any one method selected from the group consisting of $R_2R$, a spin coating method, a slot die coating method, an inkjet printing method, a screen printing method, a doctor blade method, and the like, but the present invention is not limited thereto.

The organic solar cell according to an exemplary embodiment of the present invention will be described.

The organic solar cell according to the present invention may include a first electrode; a photoactive layer including the polymer, disposed on the first electrode; and a second electrode, disposed on the photoactive layer.

In addition, the organic solar cell according to the present invention may further include a substrate. The substrate may be a transparent substrate. The substrate may be plastic or glass such as polyethylene terephthalate (PET), polypropylene (PP), polyimide (PI), polyethylene naphthalate (PEN), and triacetyl cellulose (TAC), and may or may not be used in the organic solar cell of the present invention.

The first electrode may be a transparent electrode, and also, may be a negative electrode. Specifically, the first electrode may be an indium tin oxide (ITO) film, an indium oxide (IO) film, a tin oxide (TO) film, a fluorinated tin oxide (FTO) film, an indium zinc oxide (IZO) film, or a zinc oxide (ZO) film. In addition, a first charge transport layer may be further formed between the first electrode and the photoactive layer. In addition, a second charge transport layer may be further formed between the photoactive layer and the second electrode. The first charge transport layer may be a hole transport layer. For example, it may be a metal oxide layer such as poly(3,4-ethylenedioxythiophene):poly(styrenesulfonate) (PEDOT:PSS), $MoO_3$, and $WO_3$.

The photoactive layer may use the polymer of the present invention as an electron donor and $PC_{71}BM$ as an electron receptor. In addition, the power conversion material of the photoactive layer is preferably a combination of 50 to 600 parts by weight of $PC_{71}BM$ with 100 parts by weight of the polymer of the present invention. Here, the content is not particularly limited as long as the object of the present invention is achieved, but when the content of $PC_{71}BM$ with respect to the content of the polymer of the present invention satisfies the above range, an electron acceptance action of $PC_{71}BM$ actively occurs, so that mobility of produced electrons is very good and light absorption of the polymer is efficiently performed, which is thus preferred. As the electron receptor, a fullerene-based acceptor material such as $PC_{61}BM$ and a non-fullerene-based monomolecule or high molecule which has a deeper LUMO level than a donor high molecule material may be used.

The power conversion material which is prepared by combining the polymer of the present invention and $PC_{71}BM$ is dissolved in a single organic solvent or two or more organic solvents having different boiling points to prepare a solution. As the organic solvent used, a mixture of any one or more organic solvents selected from the group consisting of chloroform, chlorobenzene, 1,2-dichlorobenzene, toluene, xylene, trimethylbenzene, and the like and an organic solvent selected from the group consisting of 1,8-diiodooctane, 1-chloronaphthalene, dimethylether, and the like may be used, but the present invention is not limited thereto. It is preferred to prepare the solution so that a solid content of an organic active material in the organic solvent is 1.0 to 3.0 wt %. Here, the content is not particularly limited as long as the object of the present invention is achieved, but when the range is satisfied, the polymer and $PC_{71}BM$ are effectively dissolved, so that the power conversion material in the form of being dissolved in the solvent may be effectively prepared, and when the organic active material is coated to form a film, a thin film having an appropriate thickness may be formed, which is thus preferred.

Thereafter, the solution in which the organic active material is dissolved is applied or coated by any one method selected from the group consisting of $R_2R$, a spin coating method, a slot die coating method, a screen printing method, an inkjet printing method, a doctor blade method to prepare a photoactive layer having a thickness of 30 to 800 nm, preferably 80 to 400 nm.

The second electrode layer may be laminated on the photoactive layer by subjecting a metal material having a low work function such as aluminum to vacuum thermal deposition with 80 to 200 nm, under a vacuum degree of about $10^{-6}$ torr or less, in the state that the photoactive layer is introduced. A material which may be used as the second electrode may include, specifically gold, aluminum, copper, silver, or an alloy thereof, a calcium/aluminum alloy, a magnesium/silver alloy, an aluminum/lithium alloy, and the like, and preferably aluminum or an aluminum/calcium alloy may be used, but the present invention is not limited thereto.

Hereinafter, the polymer of the present invention to which a polar functional group is partially introduced, the method of preparing the same, and the organic electronic device including the same will be described in more detail, using the examples. However, the following Examples are only a reference for describing the present invention in detail, and the present invention is not limited thereto, and may be implemented in various forms.

In addition, unless otherwise defined, all technical terms and scientific terms have the same meanings as those commonly understood by a person skilled in the art to which the present invention pertains. The terms used herein are only for effectively describing a certain exemplary embodiment, and not intended to limit the present invention.

Further, unless otherwise stated, the unit of added materials herein may be wt %.

[Measurement Method of Physical Properties]

1. NMR Spectroscopic Analysis $^1H$ NMR and $^{13}C$ NMR spectroscopic analyses were performed using a Bruker AM-300, AM-400, or AM-500 spectrometer.

2. Weight Average Molecular Weight Measurement

A weight average molecular weight is a weight average molecular weight value in terms of standard polystyrene by gel permeation chromatography (GPC) measurement using chloroform or hexafluoroisopropanol as a solvent.

GPC equipment: M930 manufactured by Young Lin Instrument Co., Ltd

Column: PLgel 5 um Mixed-D manufactured by Agilent Technologies, Inc.

Column temperature: 30° C.

Introduction amount: 300 μl

Flow rate: 1.0 ml/min

Preparation Example 1

Preparation of 2,5-dibromo-1,4-benzenedimethanol

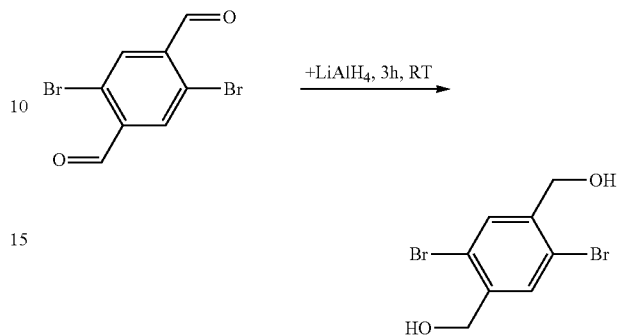

0.52 g (1.78 mmol) of 2,5-dibromoterephthalaldehyde was added to 20 ml of anhydrous tetrahydrofuran (THF) and dissolved therein, in a flask under an argon atmosphere. After lowering the temperature to 0° C., an excess amount which was about 0.27 g (7.12 mmol) of lithium aluminum hydride ($LiAlH_4$) was added, and the reaction was performed for 3 hours. 3 mL of water was added to the reaction solution to complete the reaction, and filtered through celite to remove a catalyst and separate a mixture. An organic layer was separated and the solvent was removed using a rotary evaporator to remove a colorless solid, which was filtered and dried to obtain 0.41 g of pure 2,5-dibromo-1,4-benzenedimethanol (yield: 78%).

$^1H$ NMR (400 MHz, CD3OD): δ (ppm) 7.69 (s, 1H), 4.61 (s, 2H).

MS (EI): Calcd m/z=295.96. found M+=296.

Preparation Example 2

Preparation of (2,5-dibromothiophen-3-yl)methanol

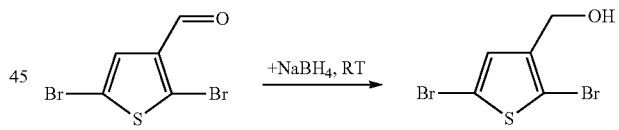

0.46 g (1.70 mmol) of 2,5-dibromothiophene-3-carbaldehyde was added to 20 ml of anhydrous ethanol and dissolved therein, in a flask under an argon atmosphere. After lowering the temperature to 0° C., an excess amount which was about 77 mg (2.00 mmol) of sodium borohydride ($NaBH_4$) was added. The temperature of the reactants was raised to room temperature (25° C.) and the reaction was performed until the reactants all disappeared. 30 mL of water was added to the reaction solution to complete the reaction, diethyl ether was added and an organic layer was extracted. The extracted organic layer was dehydrated with anhydrous magnesium sulfate ($MgSO_4$) and the solvent was removed using a rotary evaporator. 0.38 g of pure (2,5-dibromothiophen-3-yl) methanol was obtained by column chromatography using a solvent of hexane:ethyl acetate=9:1 as a mobile phase (yield: 82%).

$^1H$ NMR (400 MHz, CDCl3): δ (ppm) 7.02 (s, 1H), 4.57 (d, 2H, J=6.4 Hz), 1.69 (t, 1H, J=6 Hz).

MS (EI): Calcd m/z=. found M+=272.

Example 1

Preparation of Polymer PffBT4T-2OD-5TM

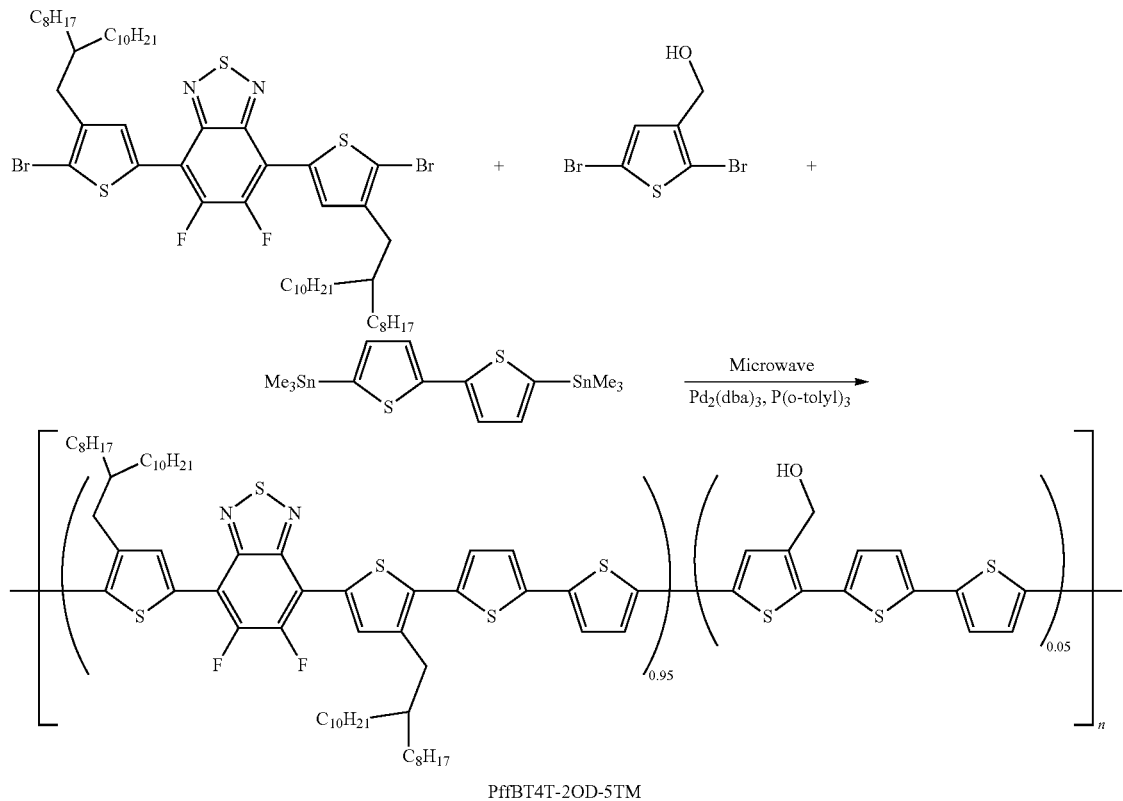

Polymerization was performed using 200.5 mg (0.19 mmol) of 4,7-bis(5-bromo-4-(2-octyldodecyl)thiophen-2-yl)-2,1,3-benzothiadiazole, 2.7 mg (0.01 mmol) of (2,5-dibromothiophen-3-yl)methanol synthesized in Preparation Example 2, and 98.4 mg (0.2 mmol) of 5,5'-bis-(trimethyl-stannyl)-2,2'-bithiophene. After completing the polymerization, a low molecular polymer was removed by Soxhlet extraction using methanol and dichloromethane, and the final polymer was obtained by extraction using chloroform (yield: 91%, 186 mg).

GPC: Mn=77 kDa, PDI=2.14

Example 2

Preparation of Polymer PffBT4T-2OD-5BM

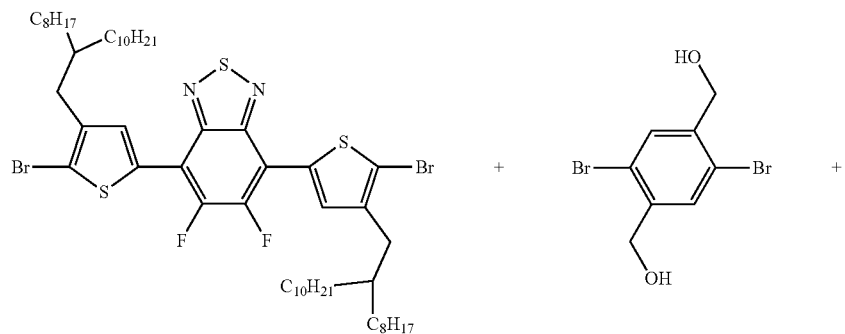

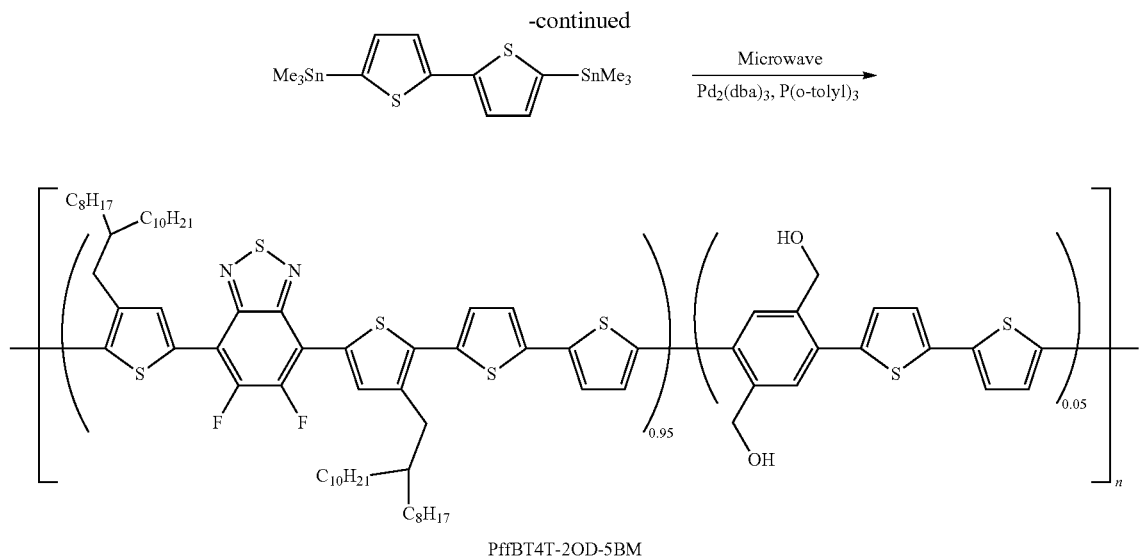

PfBT4T-2OD-5BM

Polymerization was performed using 200.5 mg (0.19 mmol) of 4,7-bis(5-bromo-4-(2-octyldodecyl)thiophen-2-yl)-2,1,3-benzothiadiazole, 3.0 mg (0.01 mmol) of 2,5-dibromo-1,4-benzenedimethanol synthesized in Preparation Example 1, and 98.4 mg (0.2 mmol) of 5,5'-bis-(trimethylstannyl)-2,2'-bithiophene. After completing the polymerization, a low molecular polymer was removed by Soxhlet extraction using methanol and dichloromethane, and the final polymer was obtained using chloroform (yield: 92%, 188 mg).

GPC: Mn=72 kDa, PDI=1.86

Example 3

Preparation of Polymers PffBT4T-T3-3TM, PffBT4T-T3-5TM, and PffBT4T-T3-10TM

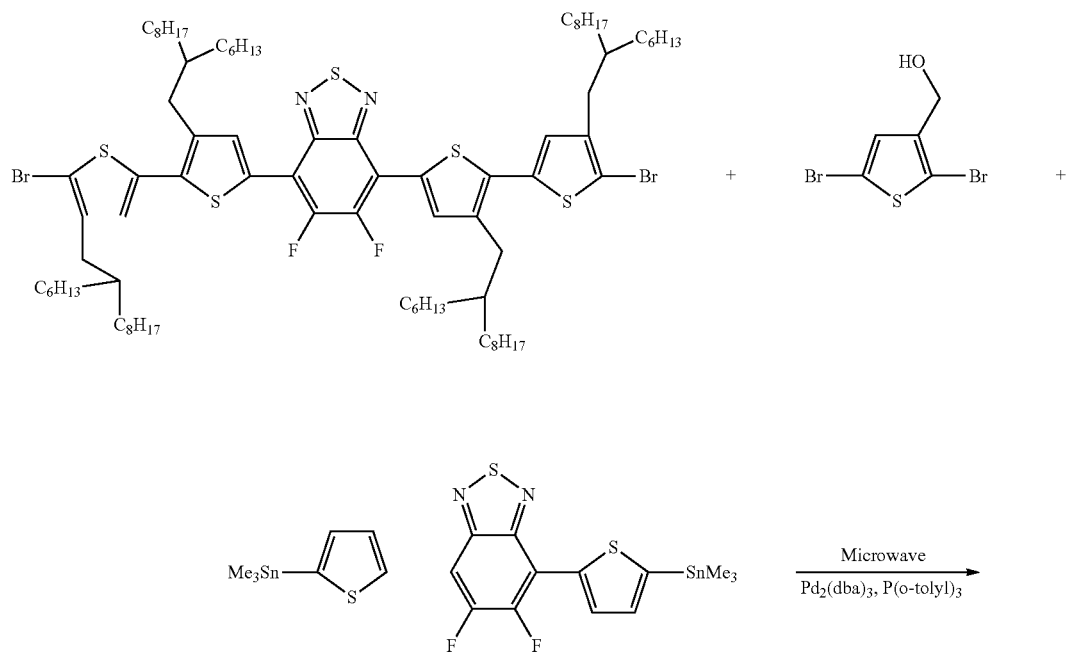

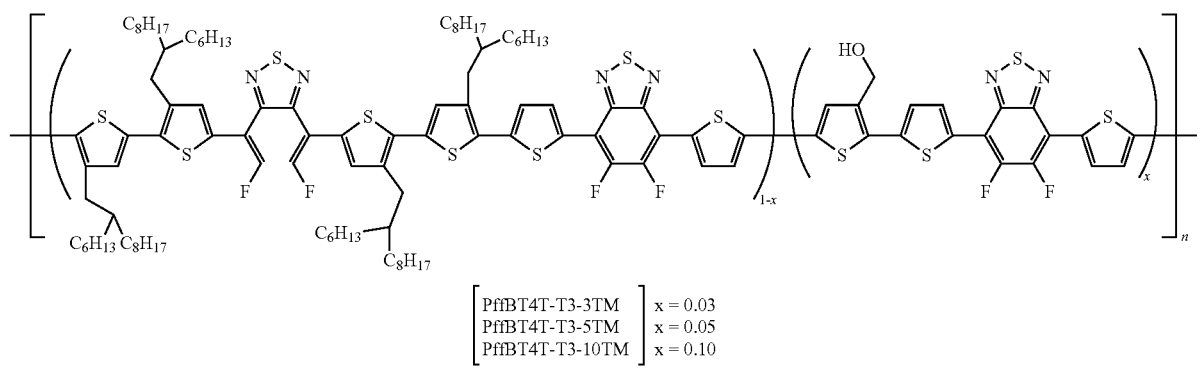

[PffBT4T-T3-3TM] x = 0.03
[PffBT4T-T3-5TM] x = 0.05
[PffBT4T-T3-10TM] x = 0.10 a. PffBT4T-T3-3TM (A:B:C=194:6:200, Mole Ratio)

Polymerization was performed using 301.9 mg (0.194 mmol) of 5,6-difluoro-4,7-bis(5'-bromo-3,4'-bis(2-hexyldecyl)-[2,2'-bithiophen]-5-yl)-2,1,3-benzothiadiazole (A), 1.6 mg (0.006 mmol) of (2,5-dibromothiophen-3-yl)methanol (B) synthesized in Preparation Example 2, and 132.4 mg (0.2 mmol) of 5,6-difluoro-4,7-bis(5-(trimethylstannyl)thiophen-2-yl)-2,1,3-benzothiadiazole (C). After completing the polymerization, a low molecular polymer was removed by Soxhlet extraction using methanol and dichloromethane, and the final polymer was obtained by extraction using chloroform (yield: 48%, 161 mg).

GPC: Mn=219 kDa, PDI=2.39 b. PffBT4T-T3-5TM (A:B:C=190:10:200, Mole Ratio)

Polymerization was performed in the same manner as in method a of Example 3, except that the mole ratio of the starting material was different, thereby obtaining the final polymer (yield: 88%, 294 mg).

GPC: Mn=154 kDa, PDI=2.10 c. PffBT4T-T3-10TM (A:B:C=180:20:200, Mole Ratio)

Polymerization was performed in the same manner as in method a of Example 3, except that the mole ratio of the starting material was different, thereby obtaining the final polymer (yield: 91%, 292 mg).

GPC: Mn=186 kDa, PDI=2.34

Example 4

Preparation of PffBT4T-T3-3BM, PffBT4T-T3-5BM, and PffBT4T-T3-10BM

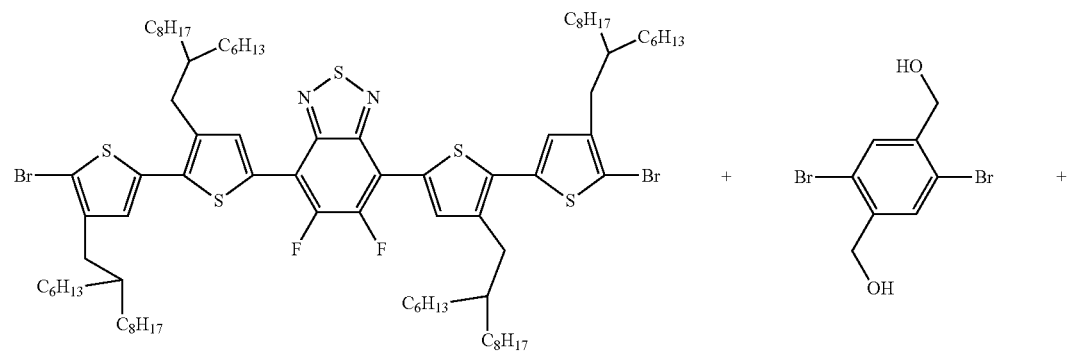

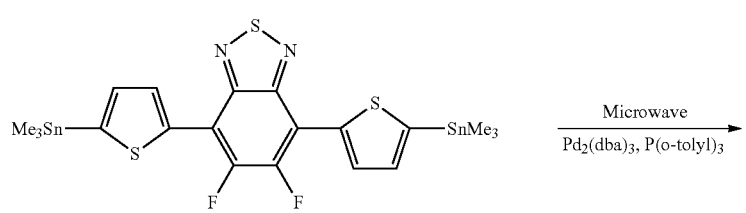

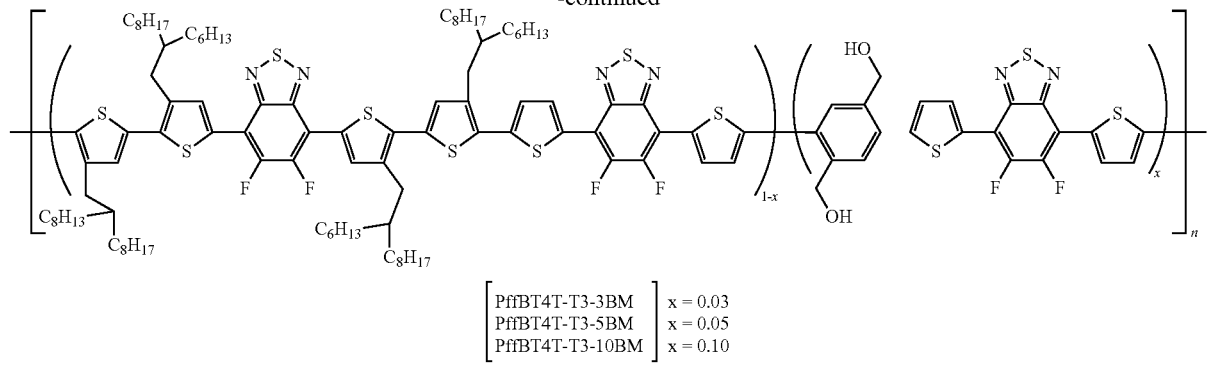

| | |
|---|---|
| PffBT4T-T3-3BM | x = 0.03 |
| PffBT4T-T3-5BM | x = 0.05 |
| PffBT4T-T3-10BM | x = 0.10 | a. PffBT4T-T3-3BM (A:B:C=200:6:200, Mole Ratio)

311.2 mg (0.2 mmol) of 5,6-difluoro-4,7-bis(5'-bromo-3,4'-bis(2-hexyldecyl)-[2,2'-bithiophen]-5-yl)-2,1,3-benzothiadiazole (A), 1.8 mg (0.006 mmol) of 2,5-dibromo-1,4-benzenedimethanol (B) synthesized in Preparation Example 1, and 132.4 mg (0.2 mmol) of 5,6-difluoro-4,7-bis(5-(trimethylstannyl)thiophen-2-yl)-2,1,3-benzothiadiazole (C) were added to a 5 mL microwave reaction tube. 3.6 mg (4 μmol) of tridibenzylideneacetone dipalladium (Pd$_2$(dba)$_3$) and 4.9 mg (16 μmol) of tri(o-tolyl)phosphine (P(o-tolyl)$_3$) were added, respectively, in a glove box and the reaction tube was capped. 2.6 mL of anhydrous chlorobenzene was injected using a syringe, and the reaction was performed at 150° C. for 100 minutes in a microwave reactor. After the reaction was completed, the mixture was completely dissolved in hot chlorobenzene, and then was precipitated in 300 mL of methanol and 15 mL of hydrochloric acid (HCl). Stirring was performed for 3 hours, and the precipitate was filtered to recover the precipitated solid. The produced precipitate was Soxhlet-extracted using methanol, dichloromethane, and chloroform to remove a low molecular weight polymer, and the final polymer was obtained by performing extraction using chlorobenzene, precipitating the recovered polymer in methanol, and drying (yield: 80%, 270 mg).

GPC: Mn=95 kDa, PDI=2.78 b. PffBT4T-T3-5BM (A:B:C=190:10:200, Mole Ratio)

Polymerization was performed in the same manner as in method a of Example 4, except that the mole ratio of the starting material was different, thereby obtaining the final polymer (yield: 86%, 287 mg).

GPC: Mn=86 kDa, PDI=1.98 c. PffBT4T-T3-10BM (A:B:C=180:20:200, Mole Ratio)

Polymerization was performed in the same manner as in method a of Example 4, except that the mole ratio of the starting material was different, thereby obtaining the final polymer (yield: 67%, 214 mg).

GPC: Mn=79 kDa, PDI=2.43

Example 5

Preparation of PNTz4T-1F-5BM

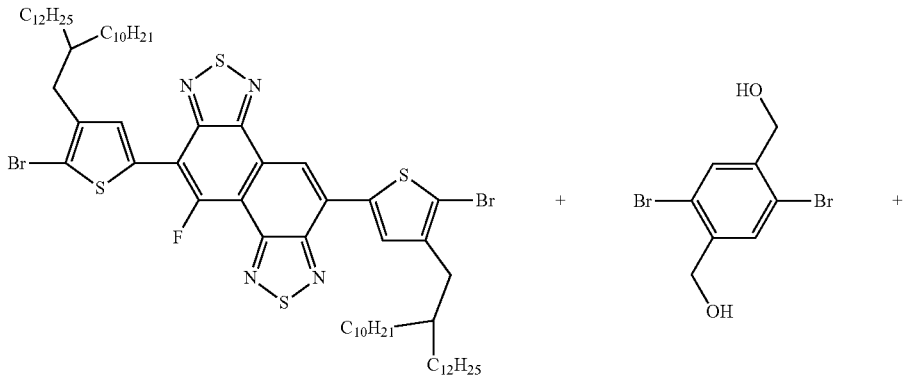

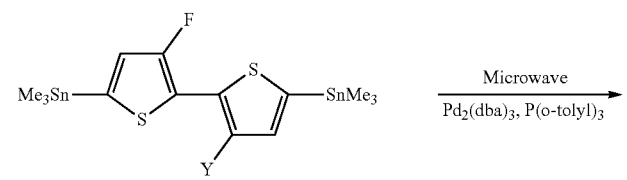

-continued

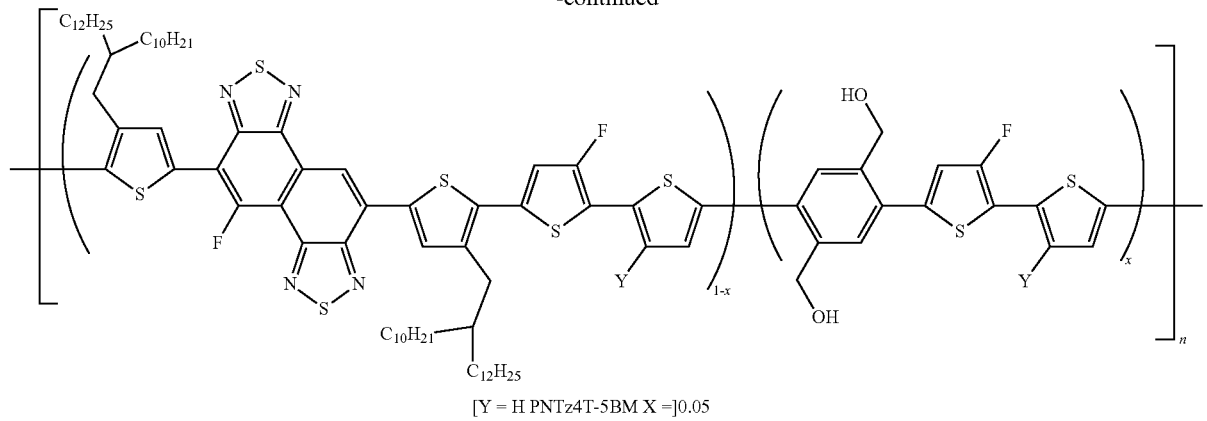

[Y = H PNTz4T-5BM X =]0.05

248.0 mg (0.2 mmol) of 4,9-bis(5-bromo-4-(2-decyltetradecyl)thiophen-2-yl)naphtho[1,2-c:5,6 c']bis[1,2,5]thiadiazole (A), 3.0 mg (0.01 mmol) of 2,5-dibromo-1,4-benzenedimethanol (B) synthesized in Preparation Example 1, and 101.2 mg (0.2 mmol) of 3-fluoro-5,5'-bis-(trimethylstannyl)-2,2'-bithiophene were added to 5 mL microwave reaction tube. 3.6 mg (4 μmol) of tridibenzylideneacetone dipalladium (Pd$_2$(dba)$_3$) and 4.9 mg (16 μmol) of tri(o-tolyl) phosphine (P(o-tolyl)$_3$) were added in a glove box and the reaction tube was capped. 2.4 mL of anhydrous chlorobenzene was injected using a syringe, and the reaction was performed at 150° C. for 70 minutes in a microwave reactor. After the reaction was completed, the mixture was completely dissolved in hot chlorobenzene, and then was precipitated in 300 mL of methanol and 15 mL of hydrochloric acid (HCl). Stirring was performed for about 3 hours, and the precipitate was filtered to recover the precipitated solid. The produced precipitate was Soxhlet-extracted using methanol, dichloromethane, and chloroform to remove a low molecular weight polymer, and the final polymer was obtained by performing extraction using chlorobenzene, precipitating the recovered polymer in methanol, and drying (yield: 91%, 222 mg).

GPC: Mn=142 kDa, PDI=1.97

Example 6

Preparation of PNTz4T-2F-5BM

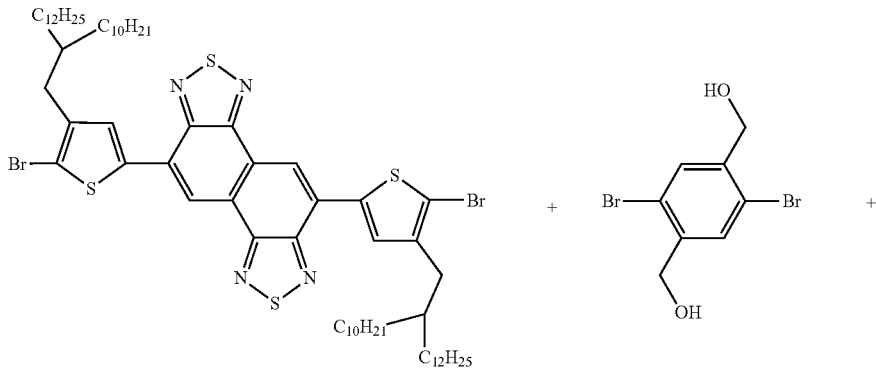

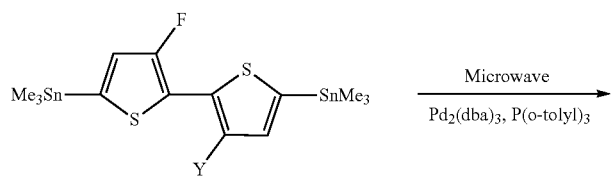

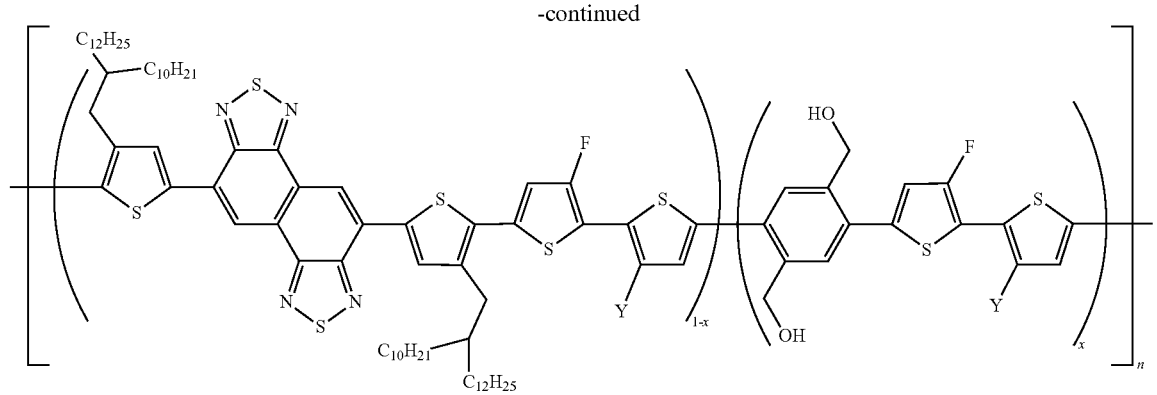

[Y = F　PNTz4T-2F-5BM　x =] 0.05

Polymerization was performed in the same manner as in the method of Example 5, except that 235.5 mg (0.19 mmol) of 4,9-bis(5-bromo-4-(2-decyltetradecyl)thiophen-2-yl)naphtho[1,2-c:5,6-c']bis[1,2,5]thiadiazole (A), 3.0 mg (0.01 mmol) of 2,5-dibromo-1,4-benzenedimethanol (B) synthesized in Preparation Example 1, and 105.6 mg (0.2 mmol) of 3,3'-difluoro-5,5'-bis-(trimethylstannyl)-2,2'-bithiophene (C) were used instead of the starting material of Example 5, thereby obtaining the final polymer (yield: 76%, 189 mg).

GPC: Mn=145 kDa, PDI=2.22

Example 7

Preparation of PNTz4T-MTC$_{0.03}$, PNTz4T-MTC$_{0.05}$, PNTz4T-MTC$_{0.07}$, and PNTz4T-MTC$_{0.10}$

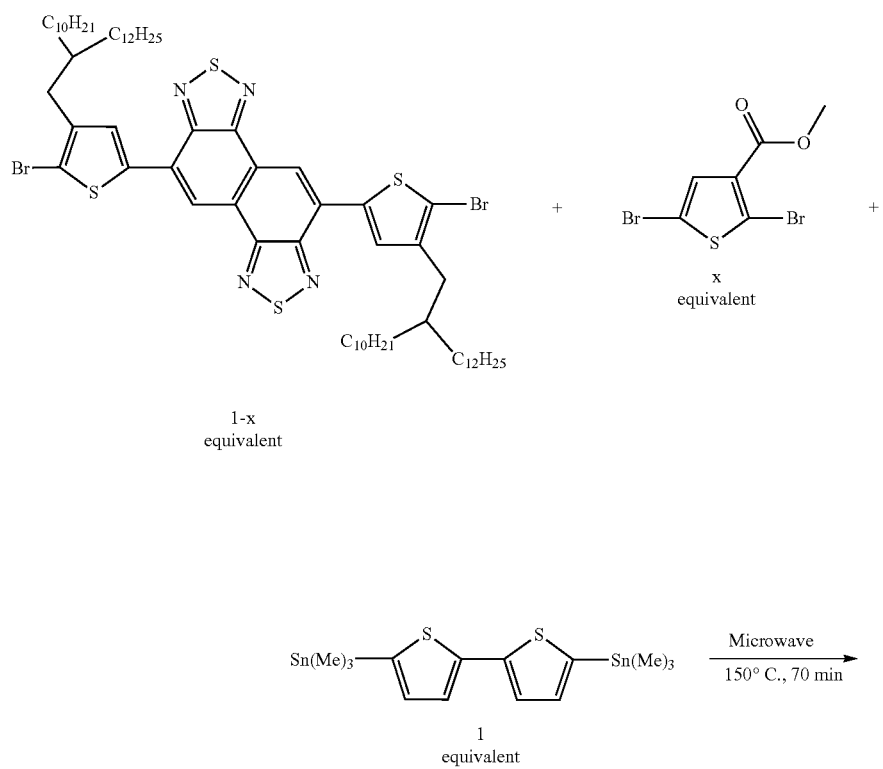

-continued

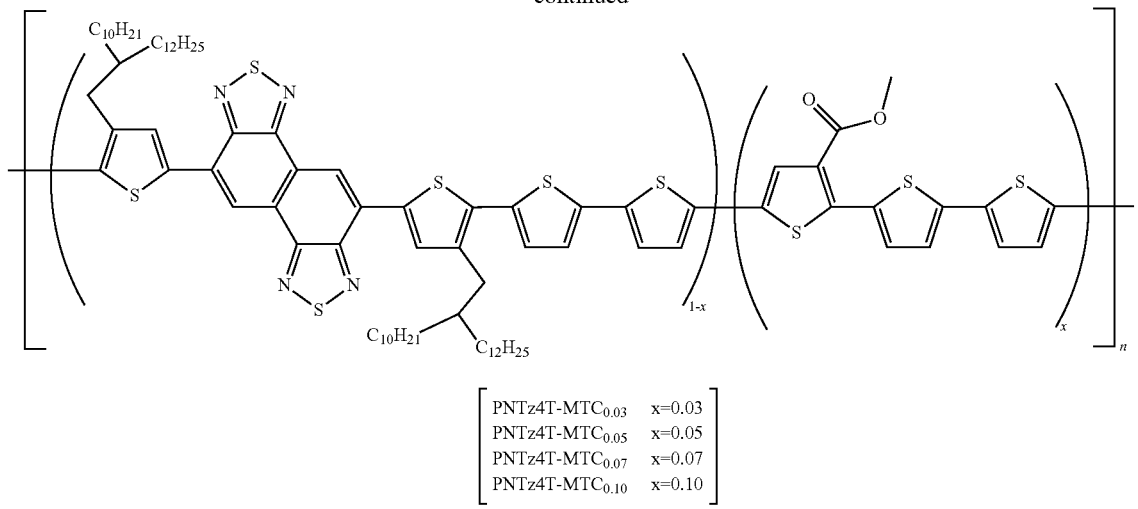

$$\begin{bmatrix} \text{PNTz4T-MTC}_{0.03} & x=0.03 \\ \text{PNTz4T-MTC}_{0.05} & x=0.05 \\ \text{PNTz4T-MTC}_{0.07} & x=0.07 \\ \text{PNTz4T-MTC}_{0.10} & x=0.10 \end{bmatrix}$$

PNTz4T-MTC$_{0.05}$:

117.8 mg (0.095 mmol) of 4,9-bis(5-bromo-4-(2-decyltetradecyl)thiophen-2-yl)naphtho[1,2-c:5,6-c']bis[1,2,5]thiadiazole, 1.5 mg (0.005 mmol) of methyl 2,5-dibromothiophene-3-carboxylate, and 49.2 mg (0.1 mmol) of 5,5'-bis-(trimethylstannyl)-2,2'-bithiophene were added to a 5 mL tube for a microwave reactor in a glove box, and then 1.8 mg (2 μmol) of Pd$_2$(dba)$_3$ and 2.4 mg (8 μmol) of P(o-tol)$_3$ were added to a catalyst system, which was then sealed. 1.2 mL of anhydrous chlorobenzene was injected using a syringe, and the reaction was performed at 150° C. for 70 minutes in a microwave reactor. The reaction solution was dissolved in a small amount of hot chlorobenzene, added to 300 ml of methanol and 15 ml of hydrochloric acid, and stirred for 3 hours. The solution was filtered to obtain a solid, the solid was added to Soxhlet extraction paper, washed with methanol and dichloromethane, extracted with chloroform, precipitated in acetone after removal of the solvent, and dried under a vacuum, thereby obtaining 111 mg (93%) of PNTz4T-MTC$_{0.05}$ as the final polymer.

GPC: Mn=121 kDa, PDI: 1.83

Elem. Anal. Calcd for (C$_{74}$H$_{106}$N$_4$S$_6$)$_{0.95}$(C$_{14}$H$_8$O$_2$S$_3$)$_{0.05}$: C, 71.24; H, 8.51; N, 4.45; S, 15.67; O, 0.13. Found: C, 71.22; H, 8.57; N, 4.47; S, 15.50; O, 0.29.

IR: 3061, 2918, 2850, 1717, 1554, 1530, 1501, 1434, 1377, 1290, 1235, 1196, 1117, 1072, 933, 886, 871, 836, 779, 752, 719, 690, 622, 612, 550

PNTz4T-MTC$_{0.03}$:

Polymerization was performed in the same manner as in the synthesis of PNTz4T-MTC$_{0.05}$, except that the ratios of the starting materials were different as follows: 120.2 mg (0.097 mmol) of 4,9-bis(5-bromo-4-(2-decyltetradecyl)thiophen-2-yl)naphtho[1,2-c:5,6-c']bis[1,2,5]thiadiazole, 0.9 mg (0.003 mmol) of methyl 2,5-dibromothiophene-3-carboxylate, and 49.2 mg (0.1 mmol) of 5,5'-bis-(trimethylstannyl)-2,2'-bithiophene, thereby obtaining 109 mg (90%) of PNTz4T-MTC$_{0.03}$ as the final polymer.

GPC: Mn=114 kDa, PDI: 1.96

Elem. Anal. Calcd for (C$_{74}$H$_{106}$N$_4$S$_6$)$_{0.93}$(C$_{14}$H$_8$O$_2$S$_3$)$_{0.07}$: C, 71.33; H, 8.54; N, 4.47; S, 15.58; O, 0.08. Found: C, 71.61; H, 8.55; N, 4.45; S, 16.80; O, 0.27.

IR: 3061, 2918, 2850, 1717, 1554, 1530, 1501, 1434, 1377, 1290, 1235, 1196, 1117, 1072, 933, 886, 871, 836, 779, 752, 719, 690, 622, 612, 550

PNTz4T-MTC$_{0.07}$:

Polymerization was performed in the same manner as in the synthesis of PNTz4T-MTC$_{0.05}$, except that the ratios of the starting materials were different as follows: 115.3 mg (0.093 mmol) of 4,9-bis(5-bromo-4-(2-decyltetradecyl)thiophen-2-yl)naphtho[1,2-c:5,6-c']bis[1,2,5]thiadiazole, 2.1 mg (0.007 mmol) of methyl 2,5-dibromothiophene-3-carboxylate, and 49.2 mg (0.1 mmol) of 5,5'-bis-(trimethylstannyl)-2,2'-bithiophene, thereby obtaining 107 mg (91%) of PNTz4T-MTC$_{0.07}$ as the final polymer.

GPC: Mn=86 kDa, PDI: 1.97

Elem. Anal. Calcd for (C$_{74}$H$_{106}$N$_4$S$_6$)$_{0.93}$(C$_{14}$H$_8$O$_2$S$_3$)$_{0.07}$: C, 71.15; H, 8.48; N, 4.42; S, 15.75; O, 0.19. Found: C, 71.21; H, 8.47; N, 4.42; S, 16.80; O, 0.19.

IR: 3061, 2918, 2850, 1717, 1554, 1530, 1501, 1434, 1377, 1290, 1235, 1196, 1117, 1072, 933, 886, 871, 836, 779, 752, 719, 690, 622, 612, 550

PNTz4T-MTC$_{0.10}$:

Polymerization was performed in the same manner as in the synthesis of PNTz4T-MTC$_{0.05}$, except that the ratios of the starting materials were different as follows: 111.6 mg (0.09 mmol) of 4,9-bis(5-bromo-4-(2-decyltetradecyl)thiophen-2-yl)naphtho[1,2-c:5,6-c']bis[1,2,5]thiadiazole, 3.0 mg (0010 mmol) of methyl 2,5-dibromothiophene-3-carboxylate, and 49.2 mg (0.1 mmol) of 5,5'-bis-(trimethylstannyl)-2,2'-bithiophene, thereby obtaining 103 mg (90%) of PNTz4T-MTC$_{0.10}$ as the final polymer.

GPC: Mn=79 kDa, PDI: 1.73

Elem. Anal. Calcd for (C$_{74}$H$_{106}$N$_4$S$_6$)$_{0.9}$(C$_{14}$H$_8$O$_2$S$_3$)$_{0.1}$: C, 71.02; H, 8.43; N, 4.38; S, 15.89; O, 0.28. Found: C, 70.96; H, 8.44; N, 4.45; S, 16.59; O, 0.31.

IR: 3061, 2918, 2850, 1717, 1554, 1530, 1501, 1434, 1377, 1290, 1235, 1196, 1117, 1072, 933, 886, 871, 836, 779, 752, 719, 690, 622, 612, 550

Example 8

Preparation of PNTz4T-ETC$_{0.10}$, PNTz4T-ETC$_{0.15}$

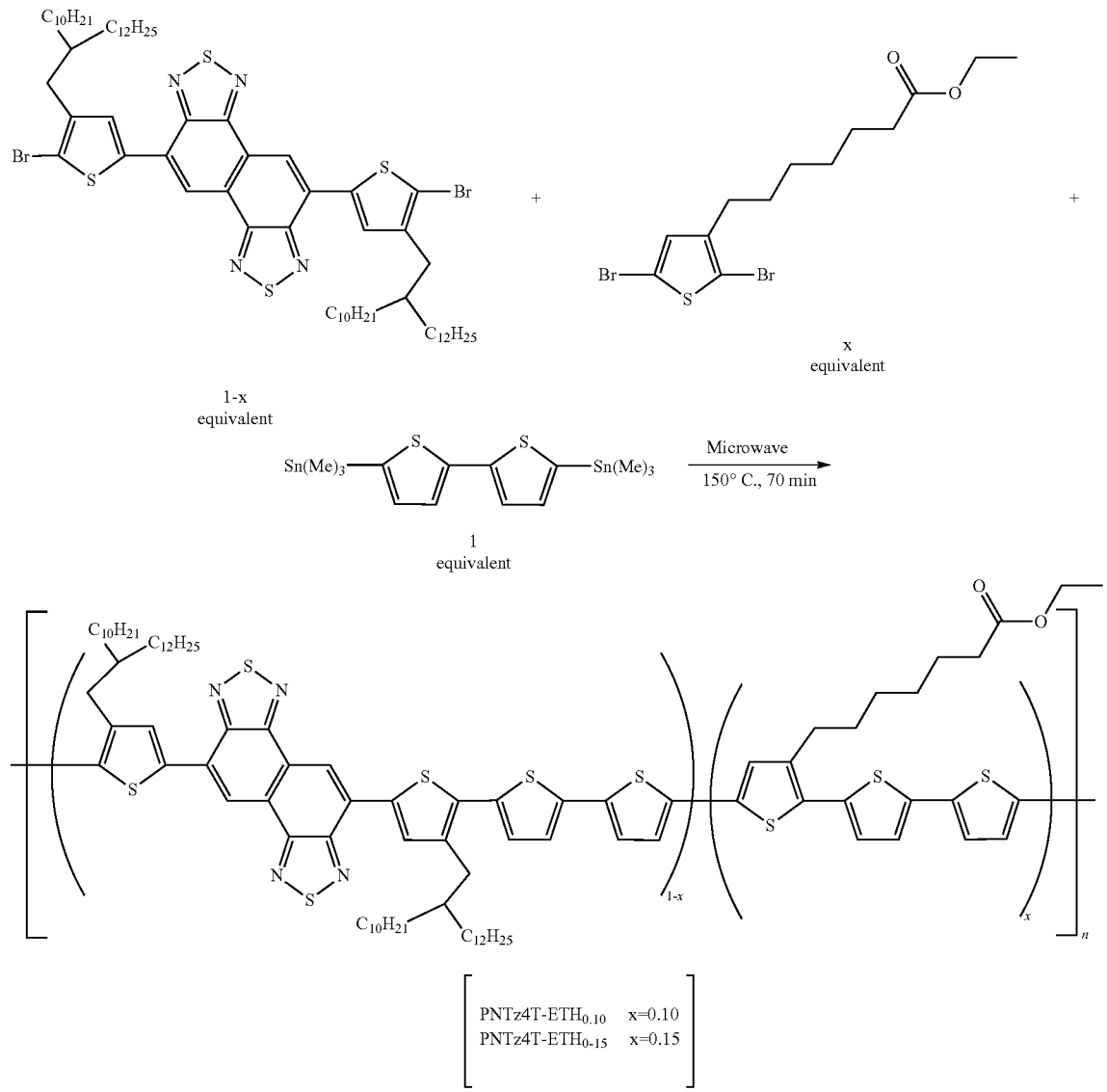

PNTz4T-ETH$_{0.10}$:

Polymerization was performed in the same manner as in Example 7, except that the ratios and the kinds of starting materials were different as follows: 111.6 mg (0.09 mmol) of 4,9-bis(5-bromo-4-(2-decyltetradecyl)thiophen-2-yl)naphtho[1,2-c:5,6-c']bis[1,2,5]thiadiazole, 4.0 mg (0.010 mmol) of ethyl 2,5-dibromothiophene-3-heptanoate, and 49.2 mg (0.1 mmol) 5,5'-bis-(trimethylstannyl)-2,2'-bithiophene, thereby obtaining 106 mg (91%) of PNTz4T-ETH$_{0.10}$ as the final polymer.

GPC: Mn=174 kDa, PDI: 2.57

Elem. Anal. Calcd for $(C_{74}H_{106}N_4S_6)_{0.9}(C_{21}H_{22}O_2S_3)_{0.1}$: C, 71.14; H, 8.48; N, 4.35; S, 15.75; O, 0.28. Found: C, 71.60; H, 8.49; N, 4.33; S, 16.83; O, 0.51.

IR: 3061, 2919, 2850, 1739, 1553, 1530, 1501, 1436, 1376, 1290, 1236, 1196, 1117, 1071, 934, 887, 871, 836, 780, 720, 690, 623, 612, 549

PNTz4T-ETH$_{0.15}$:

Polymerization was performed in the same manner as in Example 7, except that the ratios and the kinds of starting materials were different as follows: 105.4 mg (0.085 mmol) of 4,9-bis(5-bromo-4-(2-decyltetradecyl)thiophen-2-yl) naphtho[1,2-c:5,6-c']bis[1,2,5]thiadiazole, 6.0 mg (0.015 mmol) of ethyl 2,5-dibromothiophene-3-heptanoate, and 49.2 mg (0.1 mmol) 5,5'-bis-(trimethylstannyl)-2,2'-bithiophene, thereby obtaining 97 mg (87%) of PNTz4T-ETH$_{0.15}$ as the final polymer.

GPC: Mn=139 kDa, PDI: 2.27

Elem. Anal. Calcd for $(C_{74}H_{106}N_4S_6)_{0.85}(C_{21}H_{22}O_2S_3)_{0.15}$: C, 70.97; H, 8.42; N, 4.26; S, 15.92; O, 0.43. Found: C, 70.59; H, 8.41; N, 4.25; S, 16.66; O, 0.60.

IR: 3061, 2919, 2850, 1739, 1553, 1530, 1501, 1436, 1376, 1290, 1236, 1196, 1117, 1071, 934, 887, 871, 836, 780, 720, 690, 623, 612, 549

Example 9

Preparation of PNTz4T-FTC$_{0.05}$ and PNTz4T-FTC$_{0.10}$

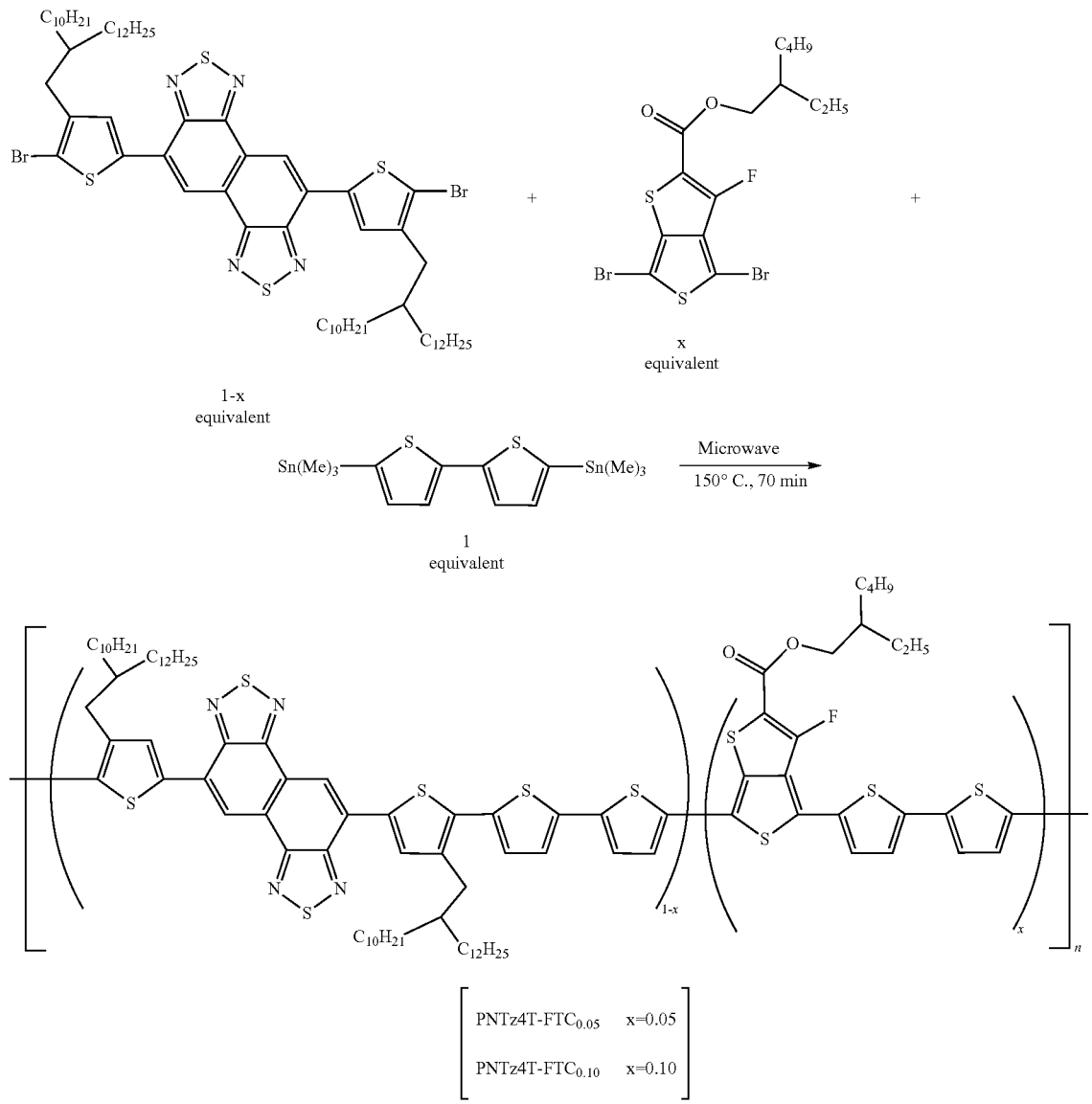

PNTz4T-FTC$_{0.05}$  x=0.05

PNTz4T-FTC$_{0.10}$  x=0.10

PNTz4T-FTC$_{0.05}$:

Polymerization was performed in the same manner as in Example 7, except that 117.8 mg (0.095 mmol) of 4,9-bis(5-bromo-4-(2-decyltetradecyl)thiophen-2-yl)naphtho[1,2-c:5,6-c']bis[1,2,5]thiadiazole, 2.4 mg (0.005 mmol) of 2-ethylhexyl 4,6-dibromo-3-fluorothieno[3,4-b]thiophene-2-carboxylate, and 49.2 mg (0.1 mmol) of 5,5'-bis-(trimethylstannyl)-2,2'-bithiophene were used, thereby obtaining 111 mg (92%) of PNTz4T-FTC$_{0.05}$ as the final polymer.

GPC: Mn=167 kDa, PDI: 2.47

Elem. Anal. Calcd for (C$_{74}$H$_{106}$N$_4$S$_6$)$_{0.95}$(C$_{23}$H$_{21}$FO$_2$S$_4$)$_{0.05}$: C, 71.18; H, 8.51; F, 0.08; N, 4.41; S, 15.69; O, 0.13. Found: C, 71.00; H, 8.44; N, 4.43; S, 16.60; O, 0.27.

IR: 3061, 2919, 1657, 1553, 1530, 1501, 1434, 1377, 1290, 1236, 1196, 1117, 1072, 934, 886, 871, 836, 780, 720, 690, 623, 612, 549

PNTz4T-FTC$_{0.10}$:

Polymerization was performed in the same manner as in Example 7, except that 111.6 mg (0.09 mmol) of 4,9-bis(5-bromo-4-(2-decyltetradecyl)thiophen-2-yl)naphtho[1,2-c:5,6-c']bis[1,2,5]thiadiazole, 4.7 mg (0.01 mmol) of 2-ethylhexyl 4,6-dibromo-3-fluorothieno[3,4-b]thiophene-2-carboxylate, and 49.2 mg (0.1 mmol) of 5,5'-bis-(trimethylstannyl)-2,2'-bithiophene were used, thereby obtaining 109 mg (92%) of PNTz4T-FTC$_{0.10}$ as the final polymer.

GPC: Mn=117 kDa, PDI: 2.84

Elem. Anal. Calcd for (C$_{74}$H$_{106}$N$_4$S$_6$)$_{0.9}$(C$_{23}$H$_{21}$FO$_2$S$_4$)$_{0.1}$: C, 70.89; H, 8.42; F, 0.16; N, 4.32; S, 15.93; O, 0.27. Found: C, 70.68; H, 8.45; N, 4.36; S, 15.98; O, 0.36.

IR: 3061, 2919, 1657, 1553, 1530, 1501, 1434, 1377, 1290, 1236, 1196, 1117, 1072, 934, 886, 871, 836, 780, 720, 690, 623, 612, 549

Example 10
Preparation of PNTz4T-DTC$_{0.05}$
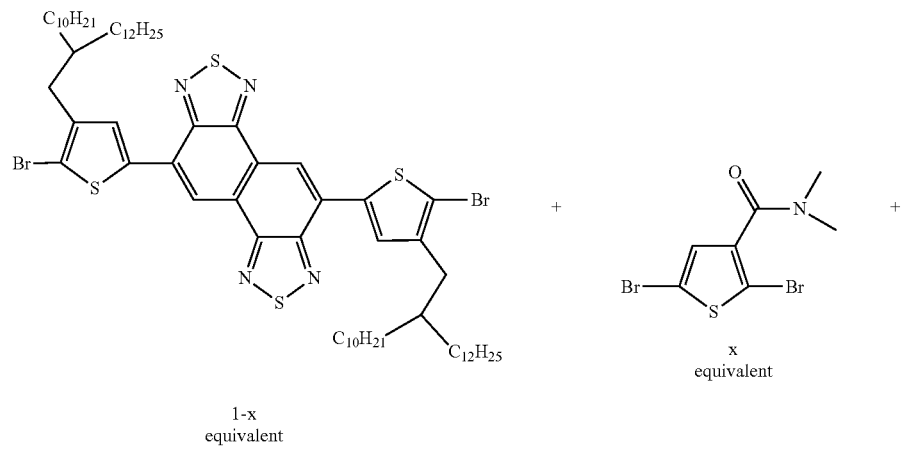
1-x equivalent
x equivalent
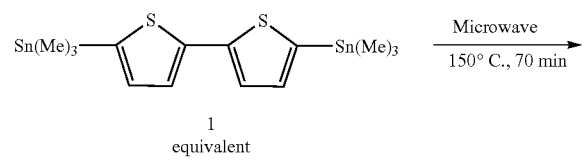
1 equivalent
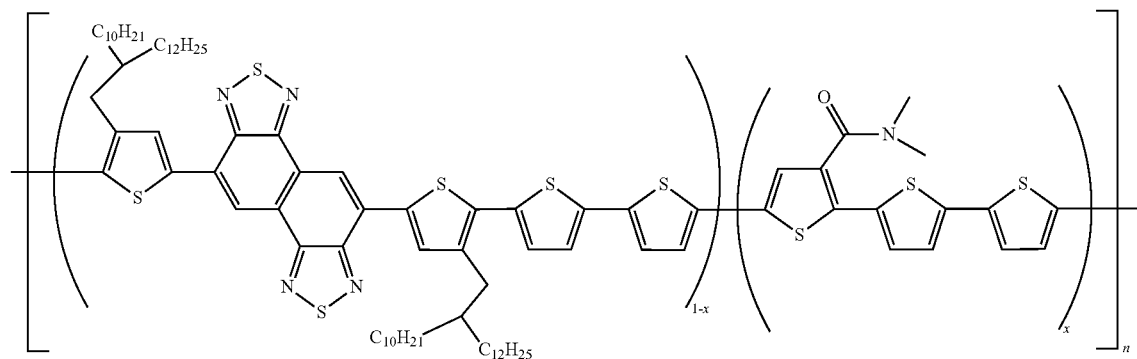
[PNTz4T-DTC$_{0.05}$  x=0-05]

PNTz4T-DTC$_{0.05}$:

Polymerization was performed in the same manner as in Example 1, except that 117.8 mg (0.095 mmol) of 4,9-bis(5-bromo-4-(2-decyltetradecyl)thiophen-2-yl)naphtho[1,2-c:5,6-c']bis[1,2,5]thiadiazole, 1.6 mg (0.005 mmol) of N,N-dimethyl 2,5-dibromothiophene-3-carboxamide, and 49.2 mg (0.1 mmol) of 5,5'-bis-(trimethylstannyl)-2,2'-bithiophene were used, thereby obtaining 109 mg (91%) of PNTz4T-DTC$_{0.05}$ as the final polymer.

GPC: Mn=137 kDa, PDI: 2.01

Elem. Anal. Calcd for $(C_{74}H_{106}N_4S_6)_{0.95}(C_{15}H_{10}NOS_3)_{0.05}$: C, 71.25; H, 8.52; N, 4.50; S, 15.66; O, 0.07. Found: C, 71.02; H, 8.51; N, 4.41; S, 15.85; O, 0.23.

IR: 3061, 2919, 2850, 1647, 1553, 1530, 1501, 1441, 1377, 1290, 1236, 1197, 1117, 1071, 934, 887, 871, 836, 780, 720, 690, 623, 612, 550

Example 11

Preparation of PNTz4T-MTA$_{0.05}$

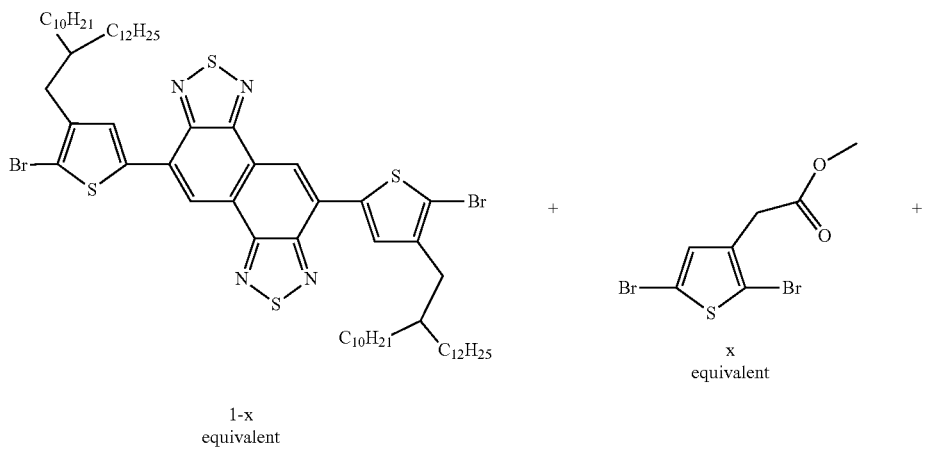

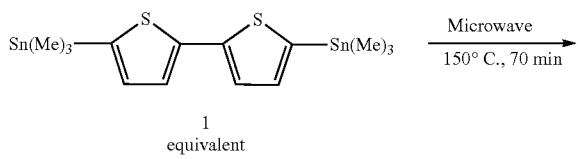

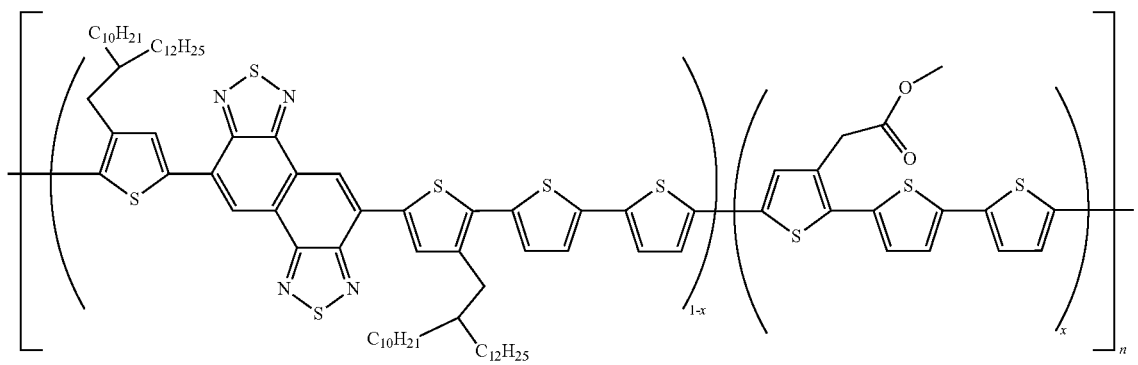

PNTz4T-MTA$_{0.05}$:

Polymerization was performed in the same manner as in Example 7, except that 117.8 mg (0.095 mmol) of 4,9-bis(5-bromo-4-(2-decyltetradecyl)thiophen-2-yl)naphtho[1,2-c:5,6-c']bis[1,2,5]thiadiazole, 1.6 mg (0.005 mmol) of methyl 2,5-dibromothiophene-3-acetate, and 49.2 mg (0.1 mmol) of 5,5'-bis-(trimethylstannyl)-2,2'-bithiophene were used, thereby obtaining 109 mg (91%) of PNTz4T-MTA$_{0.05}$ as the final polymer.

GPC: Mn=158 kDa, PDI: 1.78

Elem. Anal. Calcd for $(C_{74}H_{106}N_4S_6)_{0.95}(C_{15}H_{10}O_2S_3)_{0.05}$: C, 71.25; H, 8.52; N, 4.44; S, 15.66; O, 0.13. Found: C, 71.99; H, 8.61; N, 4.43; S, 15.93; O, 0.18.

IR: 3061, 2915, 2845, 1724, 1527, 1499, 1429, 1375, 1289, 1234, 1194, 1117, 1072, 933, 889, 869, 835, 778, 752, 719, 691, 622, 612, 550

Example 12

Preparation of PNTz4T-1F-MTC$_{0.05}$ and PNTz4T-2F-MTC$_{0.05}$

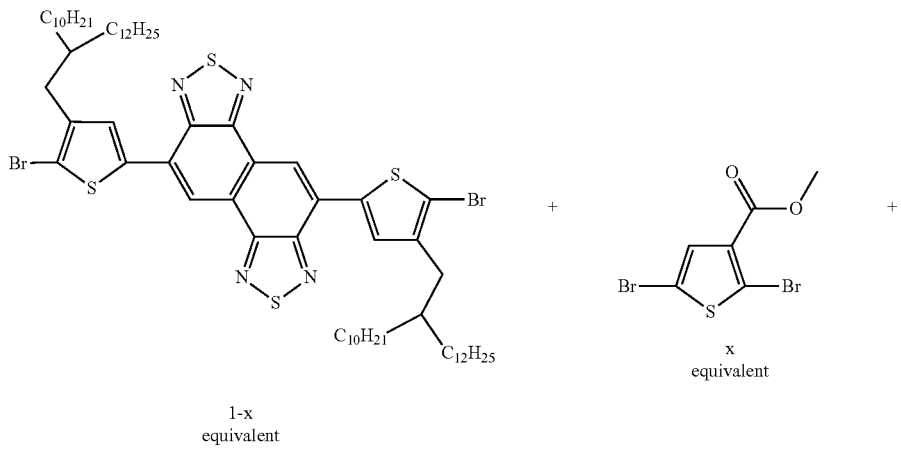

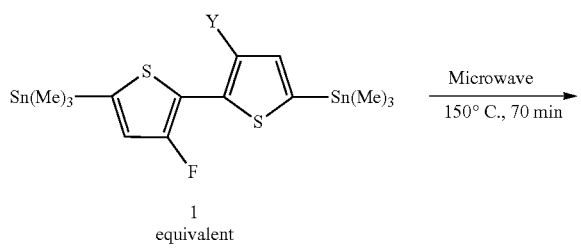

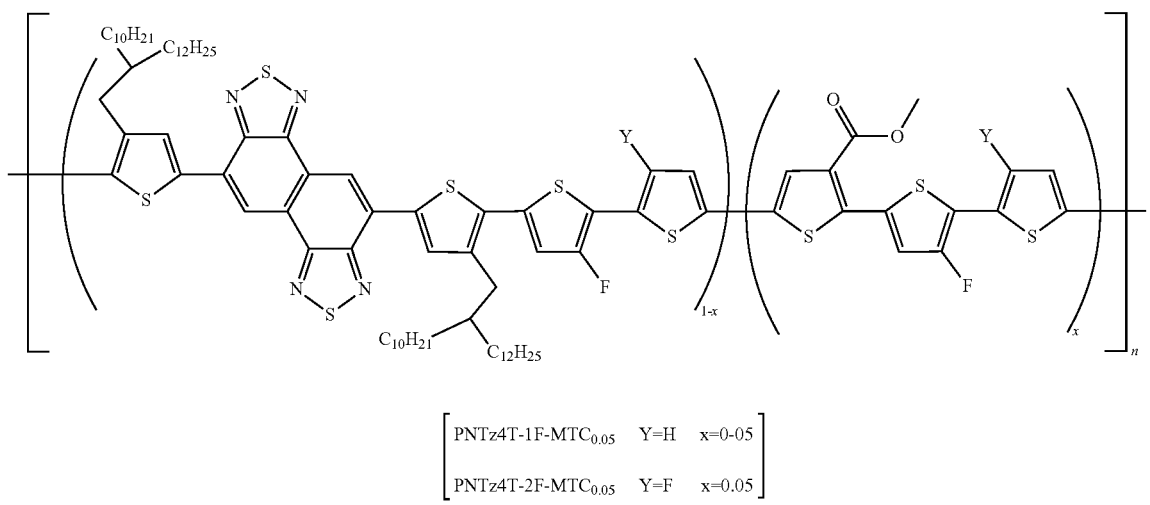

PNTz4T-1F-MTC$_{0.05}$:

Polymerization was performed in the same manner as in Example 7, except that 117.8 mg (0.095 mmol) of 4,9-bis(5-bromo-4-(2-decyltetradecyl)thiophen-2-yl)naphtho[1,2-c:5,6-c']bis[1,2,5]thiadiazole, 1.5 mg (0.005 mmol) of methyl 2,5-dibromothiophene-3-carboxylate, and 50.1 mg (0.1 mmol) of 5,5'-bis-(trimethylstannyl)-3-fluoro-2,2'-bithiophene were used, thereby obtaining 103 mg (85%) of PNTz4T-1F-MTC$_{0.05}$ as the final polymer.

GPC: Mn=69 kDa, PDI: 2.32

Elem. Anal. Calcd for (C$_{74}$H$_{105}$FN$_4$S$_6$)$_{0.95}$(C$_{14}$H$_7$FO$_2$S$_3$)$_{0.05}$: C, 70.18; H, 8.30; F, 1.56; N, 4.38; S, 15.44; O, 0.13. Found: C, 70.11; H, 8.33; N, 4.36; S, 16.22; O, 1.34.

IR: 2919, 2850, 1717, 1554, 1531, 1501, 1453, 1377, 1236, 1201, 1168, 1114, 1025, 935, 886, 872, 837, 800, 780, 719, 690, 622, 611, 551

PNTz4T-2F-MTC$_{0.05}$:

Polymerization was performed in the same manner as in Example 7, except that 117.8 mg (0.095 mmol) of 4,9-bis(5-bromo-4-(2-decyltetradecyl)thiophen-2-yl)naphtho[1,2-c:5,6-c']bis[1,2,5]thiadiazole, 1.5 mg (0.005 mmol) of methyl 2,5-dibromothiophene-3-carboxylate, and 52.8 mg (0.1 mmol) of 5,5'-bis-(trimethylstannyl)-3,3'-difluoro-2,2'-bithiophene were used, thereby obtaining 104 mg (84%) of PNTz4T-2F-MTC$_{0.05}$ as the final polymer.

GPC: Mn=83 kDa, PDI: 2.09

Elem. Anal. Calcd for (C$_{74}$H$_{104}$F$_2$N$_4$S$_6$)$_{0.95}$(C$_{14}$H$_6$F$_2$O$_2$S$_3$)$_{0.05}$: C, 69.16; H, 8.10; F, 3.08; N, 4.32; S, 15.21; O, 0.13. Found: C, 69.02; H, 8.13; N, 4.30; S, 16.07; O, 1.44.

IR: 2919, 2850, 1719, 1555, 1536, 1502, 1445, 1375, 1290, 1236, 1205, 1173, 1117, 974, 935, 874, 838, 799, 774, 720, 691, 623, 612, 593, 558

Example 13

Preparation of PDPPz4T-1F-MTC$_{0.05}$ and PDPPz4T-2F-MTC$_{0.05}$

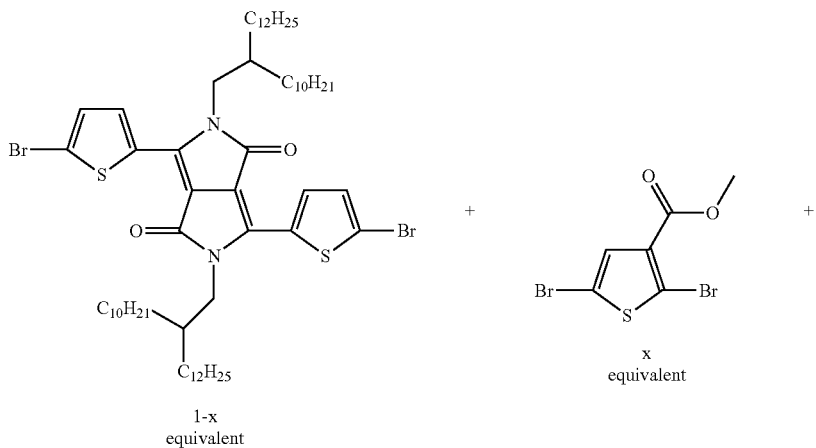

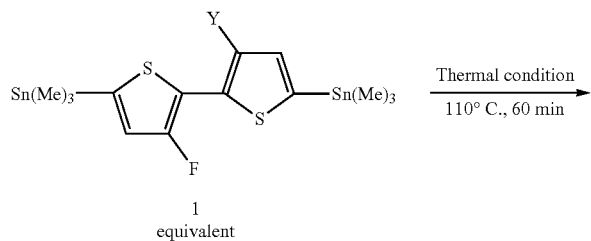

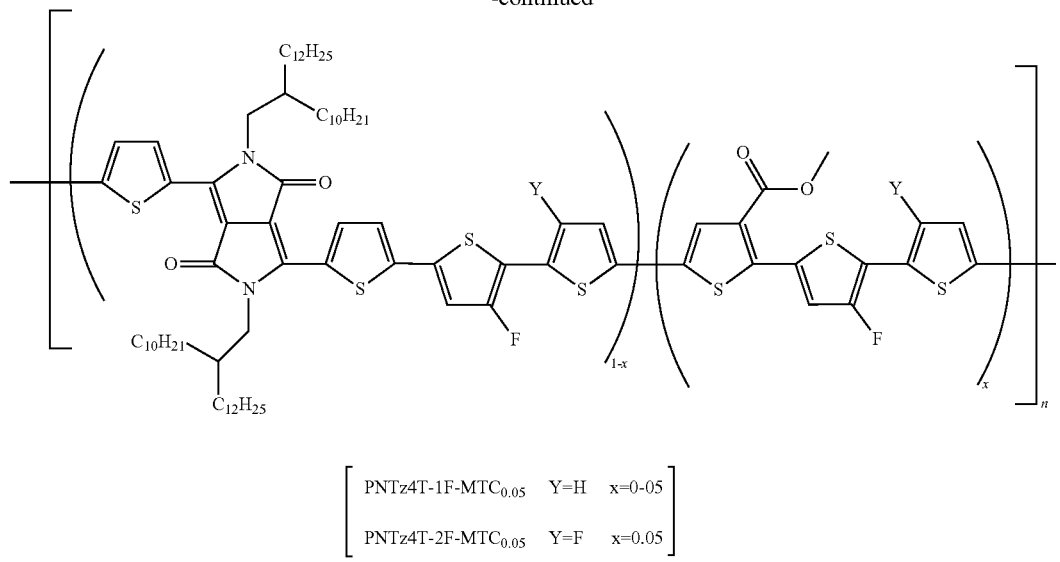

$$\begin{bmatrix} \text{PNTz4T-1F-MTC}_{0.05} & Y=H & x=0\text{-}05 \\ \text{PNTz4T-2F-MTC}_{0.05} & Y=F & x=0.05 \end{bmatrix}$$

PDPPz4T-1F-MTC$_{0.05}$:

107.5 mg (0.095 mmol) of 3,6-di(2-bromothien-5-yl)-2,5-di(2-decyltetradecyl)-pyrrolo[3,4-c]pyrrole-1,4-dione, 1.5 mg (0.005 mmol) of methyl 2,5-dibromothiophene-3-carboxylate, and 50.1 mg (0.1 mmol) of 5,5'-bis-(trimethylstannyl)-3-fluoro-2,2'-bithiophene were added to a 25 mL 2-neck round bottom flask in a glove box, 3.5 mg (3 μmol) of Pd(PPh$_3$)$_4$ was added thereto, and the flask was sealed. 5 mL of a mixed solvent of anhydrous toluene and DMF at a 4:1 volume ratio was injected using a syringe, and the reaction was performed at 110° C. for 60 minutes. The reaction solution was dissolved in a small amount of hot chlorobenzene, added to 300 ml of methanol and 15 ml of hydrochloric acid, and stirred for 3 hours. The solution was filtered to obtain a solid, the solid was added to Soxhlet extraction paper, washed with methanol and dichloromethane, extracted with chloroform, precipitated in acetone after removal of the solvent, and dried under a vacuum, thereby obtaining 101 mg (91%) of PDPPz4T-1F-MTC$_{0.05}$ as the final polymer.

GPC: Mn=86 kDa, PDI: 2.92

Elem. Anal. Calcd for (C$_{70}$H$_{105}$FN$_2$O$_2$S$_4$)$_{0.95}$(C$_{14}$H$_7$FO$_2$S$_3$)$_{0.05}$: C, 72.57; H, 9.07; F, 1.71; N, 2.39; S, 11.39; O, 2.88. Found: C, 72.76; H, 9.11; N, 2.48; S, 11.76; O, 3.30.

IR: 3063, 2919, 2850, 1663, 1550, 1532, 1491, 1430, 1401, 1342, 1224, 1156, 1105, 1072, 1018, 908, 854, 802, 783, 732, 709, 634, 585, 567

PDPPz4T-2F-MTC$_{0.05}$:

Polymerization was performed in the same manner as in the preparation of PDPPz4T-1F-MTC$_{0.05}$, except that 107.5 mg (0.095 mmol) of 3,6-di(2-bromothien-5-yl)-2,5-di(2-decyltetradecyl)-pyrrolo[3,4-c]pyrrole-1,4-dione, 1.5 mg (0.005 mmol) of methyl 2,5-dibromothiophene-3-carboxylate, and 52.8 mg (0.1 mmol) of 5,5'-bis-(trimethylstannyl)-3,3'-difluoro-2,2'-bithiophene were used in a glove box, thereby obtaining 98 mg (91%) of PDPPz4T-2F-MTC$_{0.05}$ as the final polymer.

GPC: Mn=59 kDa, PDI: 1.53

Elem. Anal. Calcd for (C$_{70}$H$_{104}$F$_2$N$_2$O$_2$S$_4$)$_{0.95}$(C$_{14}$H$_6$F$_2$O$_2$S$_3$)$_{0.05}$: C, 71.41; H, 8.84; F, 3.36; N, 2.35; S, 11.20; O, 2.83. Found: C, 71.39; H, 8.91; N, 2.39; S, 11.49; O, 4.03.

IR: 3077, 2919, 2850, 1663, 1550, 1498, 1432, 1390, 1359, 1304, 1261, 1220, 1158, 1104, 1071, 1024, 988, 901, 856, 801, 732, 707, 633, 614, 584

Example 14

Preparation of PfTz4T-2OD-MTC$_{0.05}$

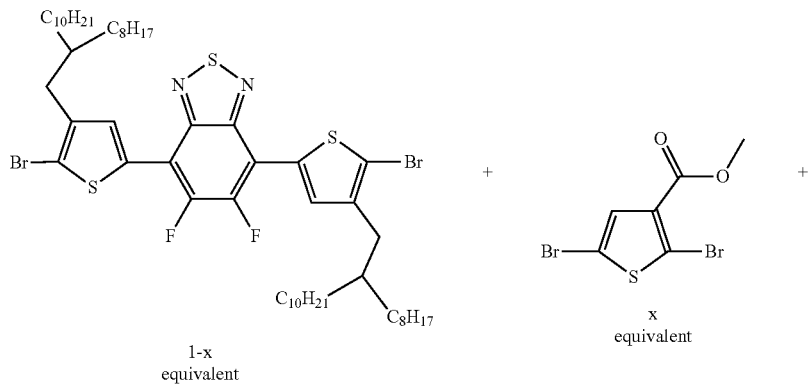

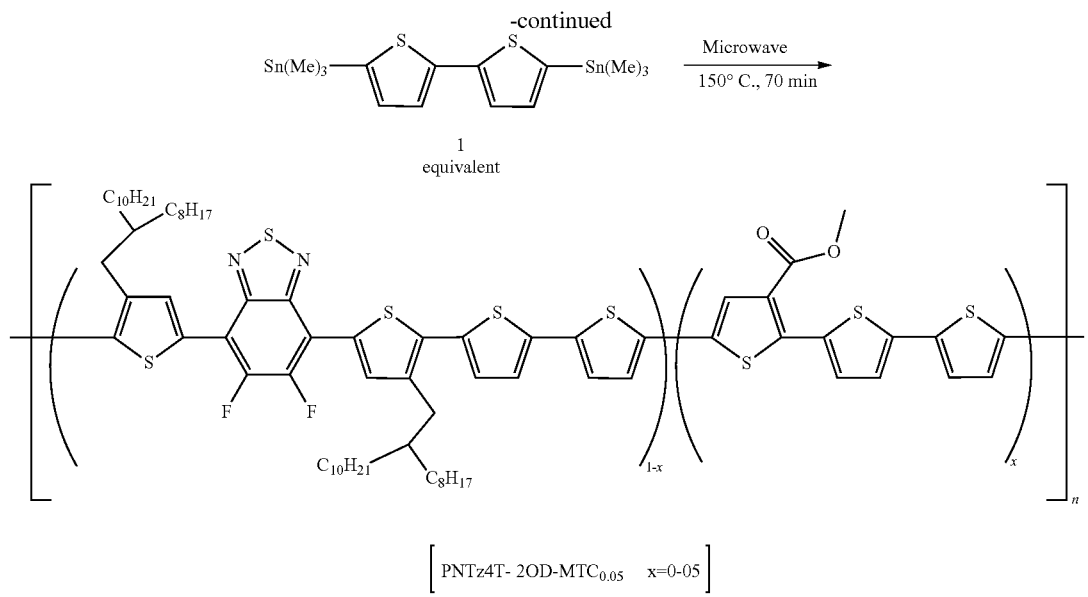

[PNTz4T- 2OD-MTC$_{0.05}$ x=0-05]

Polymerization was performed in the same manner as in the method of polymerizing PNTz4T-MTC$_{0.05}$ in Example 1, except that 100.2 mg (0.095 mmol) of 4,7-bis(5-bromo-4-(2-octyldodecyl)thiophen-2-yl)-2,1,3-benzothiadiazole, 1.5 mg (0.005 mmol) of methyl 2,5-dibromothiophene-3-carboxylate, and 49.2 mg (0.1 mmol) of 5,5'-bis-(trimethylstannyl)-2,2'-bithiophene as monomers, and 0.9 mL of anhydrous chlorobenzene as a solvent were used, thereby obtaining 91 mg (89%) of PffTz4T-2OD-MTC$_{0.05}$ as the final polymer.

GPC: Mn=24 kDa, PDI: 3.04

Elem. Anal. Calcd for $(C_{62}H_{88}F_2N_2S_5)_{0.95}(C_{14}H_8O_2S_3)_{0.05}$: C, 70.05; H, 8.29; F, 3.53; N, 2.60; S, 15.37; O, 0.16. Found: C, 69.95; H, 8.40; N, 2.62; S, 15.49; O, 1.35.

IR: 3061, 2920, 2851, 1725, 1583, 1539, 1482, 1429, 1377, 1327, 1291, 1216, 1115, 1080, 1011, 1071, 894, 851, 779, 746, 721, 702, 676, 657, 594

Example 15

Preparation of PBT-EHHDBT-1MTC$_{0.05}$

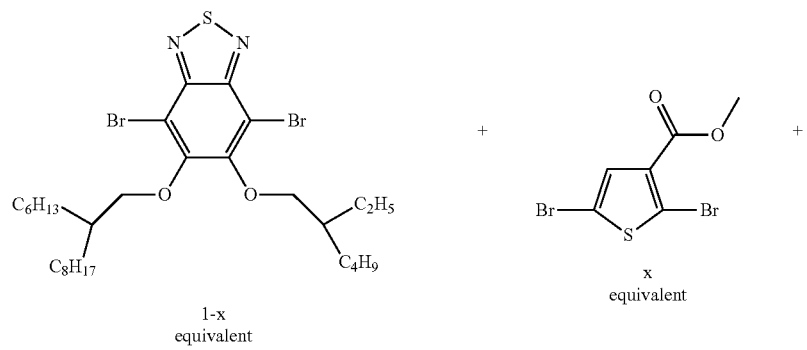

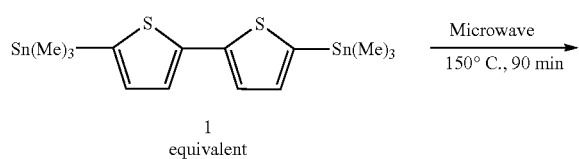

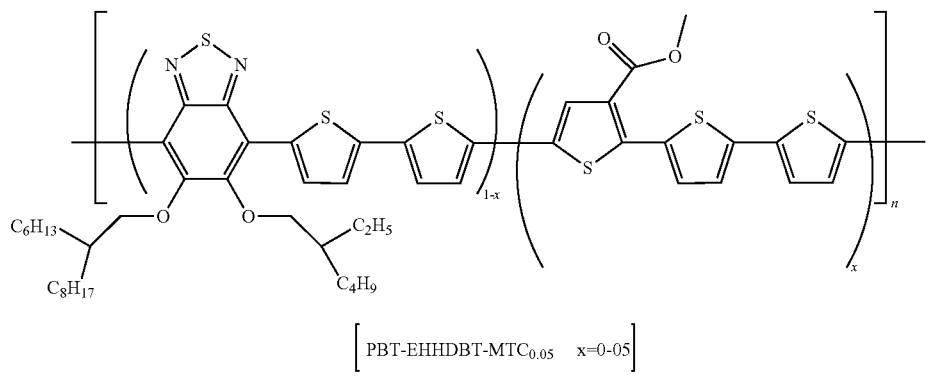

[PBT-EHHDBT-MTC$_{0.05}$  x=0-05]

PBT-EHHDBT-1MTC$_{0.05}$:

63.0 mg (0.095 mmol) of 4,7-dibromo-5-ethylhexyloxy-6-hexyldecyloxy-benzo[c][1,2,5]thiadiazole, 1.5 mg (0.005 mmol) of methyl 2,5-dibromothiophene-3-carboxylate, and 49.2 mg (0.1 mmol) of 5,5'-bis-(trimethylstannyl)-2,2'-bithiophene were added to a 5 mL tube for a microwave reactor in a glove box, and then 1.8 mg (2 μmol) of Pd$_2$(dba)$_3$ and 2.4 mg (8 μmol) of P(o-tol)$_3$ were added to a catalyst system, which was then sealed. 0.8 mL of anhydrous chlorobenzene was injected using a syringe, and the reaction was performed at 150° C. for 90 minutes in a microwave reactor. The reaction solution was dissolved in a small amount of hot chloroform, added to 300 ml of methanol and 15 ml of hydrochloric acid, and stirred for 3 hours. The solution was filtered to obtain a solid, the solid was added to Soxhlet extraction paper, washed with methanol, hexane, and dichloromethane, extracted with chloroform, precipitated in acetone after removal of the solvent, and dried under a vacuum, thereby obtaining 49 mg (76%) of PBT-EHHDBT-1MTC$_{0.05}$ as the final polymer.

GPC: Mn=39 kDa, PDI: 2.55

Elem. Anal. Calcd for $(C_{38}H_{54}N_2O_2S_3)_{0.95}(C_{14}H_8O_2S_3)_{0.05}$: C, 68.11; H, 8.03; N, 4.10; S, 14.82; O, 4.93. Found: C, 68.06; H, 7.95; N, 4.19; S, 14.77; O, 4.75.

IR: 3067, 2922, 2853, 1718, 1560, 1509, 1458, 1439, 1414, 1377, 1281, 1201, 1174, 1100, 1024, 957, 890, 852, 793, 756, 722, 681, 595

Comparative Examples 1 to 4

Polymerization was performed in the same manner as in Examples 1 to 4, except that the compound of Preparation Example 1 or 2 was not used, thereby obtaining the final polymer. The compound corresponding to each comparative example is shown in Table 1.

TABLE 1

| Structure | Yield (%), GPC |
|---|---|
|  | 71%, Mn = 86 kDa, PDI = 2.52 |

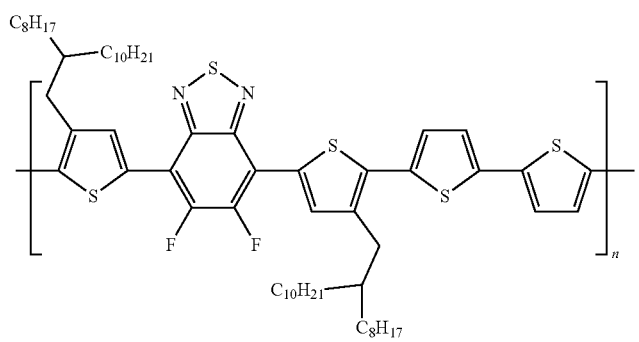

Comparative Example 1 (PffBT4T-2OD)

TABLE 1-continued
| Structure | Yield (%), GPC |
|---|---|
| 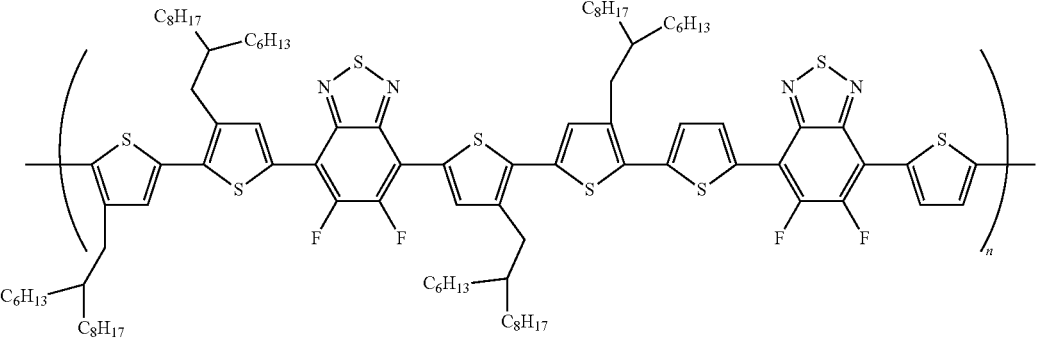Comparative Example 2 (PffBT4T-T3) | 77%, Mn = 121 kDa, PDI = 1.83 |
| 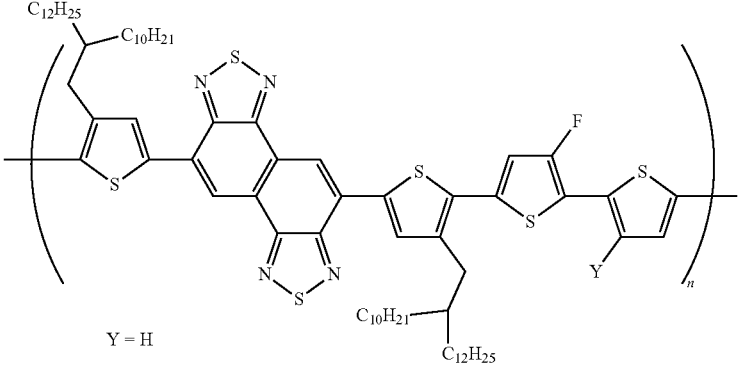Y = H<br>Comparative Example 3 (PNTz4T-1F) | 79%, Mn = 87 kDa, PDI = 2.10 |
| 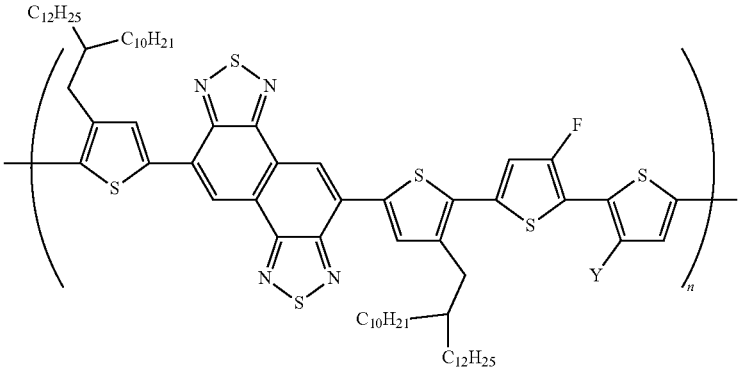Comparative Example 4 (PNTz4T-2F) | 49%, Mn = 174 kDa, PDI = 2.27 |

Comparative Example 5
Preparation of PNTz4T
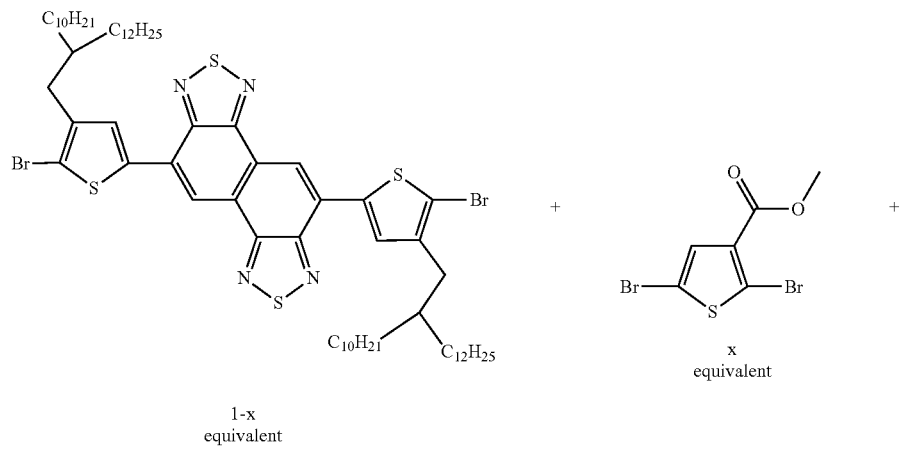
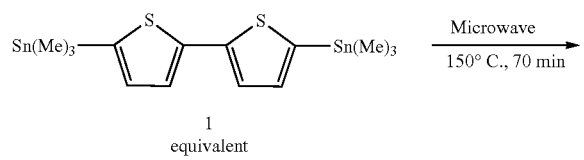
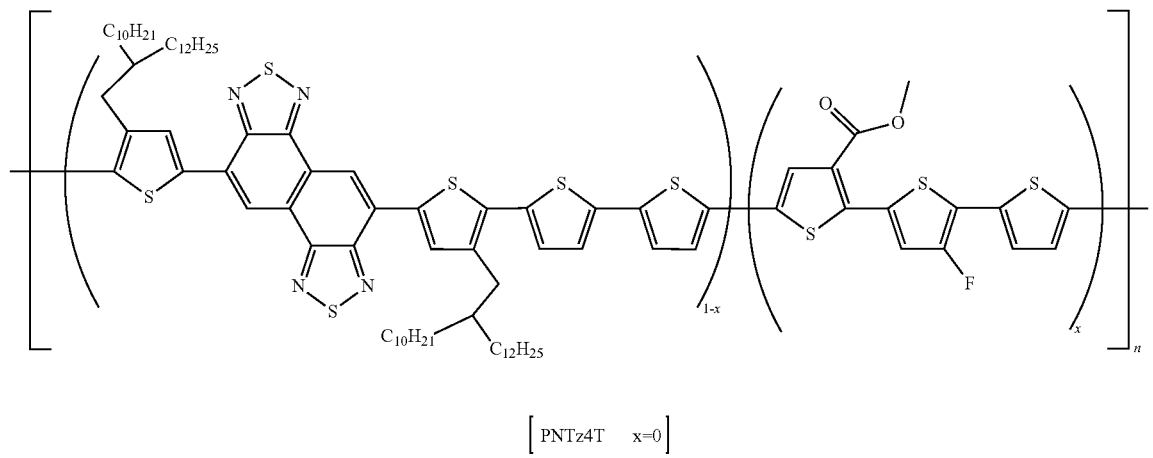
[PNTz4T  x=0]

The reaction was performed in the same manner as in Example 7, except that 4,9-Bis(5-bromo-4-(2-decyltetradecyl)thiophen-2-yl)naphtho[1,2-c:5,6-c']bis[1,2,5]thiadiazole and 5,5'-bis-(trimethylstannyl)-2,2'-bithiophene were reacted at a 1:1 equivalent without using methyl 2,5-dibromothiophene-3-carboxylate, and the solid added to Soxhlet extraction paper was washed with methanol, dichloromethane, and chloroform in the course of purification, and then extracted with chlorobenzene to prepare a polymer, PNTz4T (98 mg, 79%).

GPC: Mn=87 kDa, PDI=2.1

Elem. Anal. Calcd for $C_{74}H_{106}N_4S_6$: C, 71.45; H, 8.59; N, 4.50; S, 15.46. Found: C, 71.35; H, 8.62; N, 4.53; S, 15.85.

IR: 3061, 2918, 2850, 1554, 1530, 1501, 1434, 1377, 1290, 1235, 1196, 1117, 1072, 933, 886, 871, 836, 779, 752, 719, 690, 622, 612, 550

Comparative Example 6

Preparation of PNTz4T-1F and PNTz4T-2F

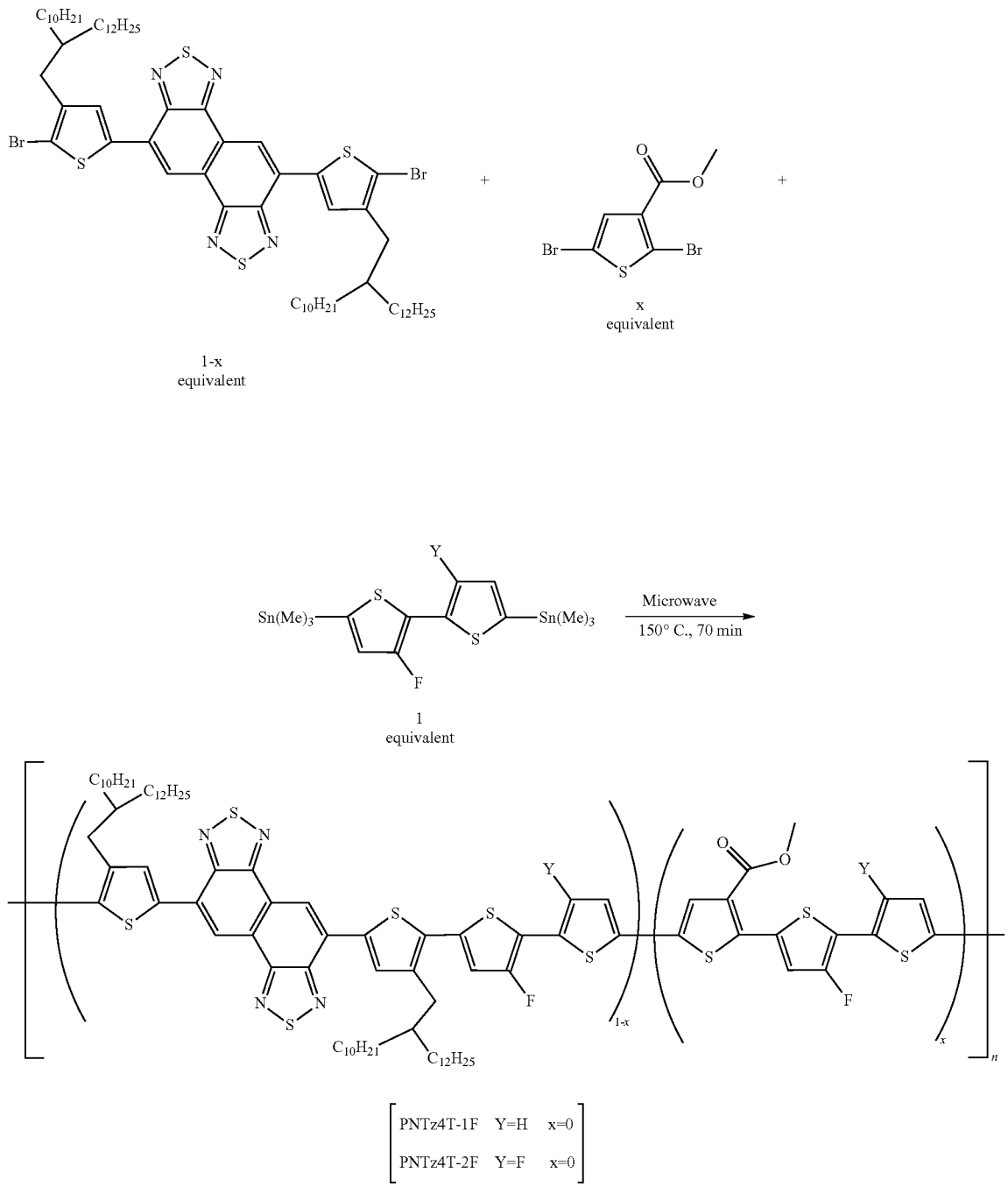

PNTz4T-1-F:

Polymerization was performed in the same manner as in Example 7, except that 124 mg (0.1 mmol) of 4,9-bis(5-bromo-4-(2-decyltetradecyl)thiophen-2-yl)naphtho[1,2-c:5,6-c']bis[1,2,5]thiadiazole and 50.1 mg (0.1 mmol) of 5,5'-bis-(trimethylstannyl)-3-fluoro-2,2'-bithiophene were used, thereby obtaining 105 mg (83%) of PNTz4T-1-F as the final polymer.

GPC: Mn=65 kDa, PDI: 2.13

Elem. Anal. Calcd for $C_{74}H_{105}FN_4S_6$: C, 70.43; H, 8.39; F, 1.51; N, 4.44; S, 15.24. Found: C, 70.42; H, 8.41; N, 4.40; S, 15.38.

IR: 2919, 2850, 1554, 1531, 1501, 1454, 1377, 1290, 1236, 1201, 1117, 1025, 935, 872, 837, 800, 780, 720, 691, 623, 612, 593, 552

PNTz4T-2F:

Polymerization was performed in the same manner as in Example 7, except 124 mg (0.1 mmol) of 4,9-bis(5-bromo-4-(2-decyltetradecyl)thiophen-2-yl)naphtho[1,2-c:5,6-c']bis[1,2,5]thiadiazole and 52.8 mg (0.1 mmol) of 5,5'-bis-(trimethylstannyl)-3,3'-difluoro-2,2'-bithiophene were used, thereby obtaining 100 mg (78%) of PNTz4T-2F as the final polymer.

GPC: Mn=73 kDa, PDI: 1.96

Elem. Anal. Calcd for $C_{74}H_{104}F_2N_4S_6$: C, 69.44; H, 8.19; F, 2.97; N, 4.38; S, 15.03. Found: 69.44; H, 8.19; N, 4.38; S, 15.03.

IR: 2919, 2850, 1553, 1530, 1501, 1435, 1377, 1290, 1235, 1196, 1117, 1071, 933, 871, 836, 780, 720, 690, 623, 612, 593, 550

Comparative Example 7

Preparation of PDPPz4T-1F and PDPPz4T-2F

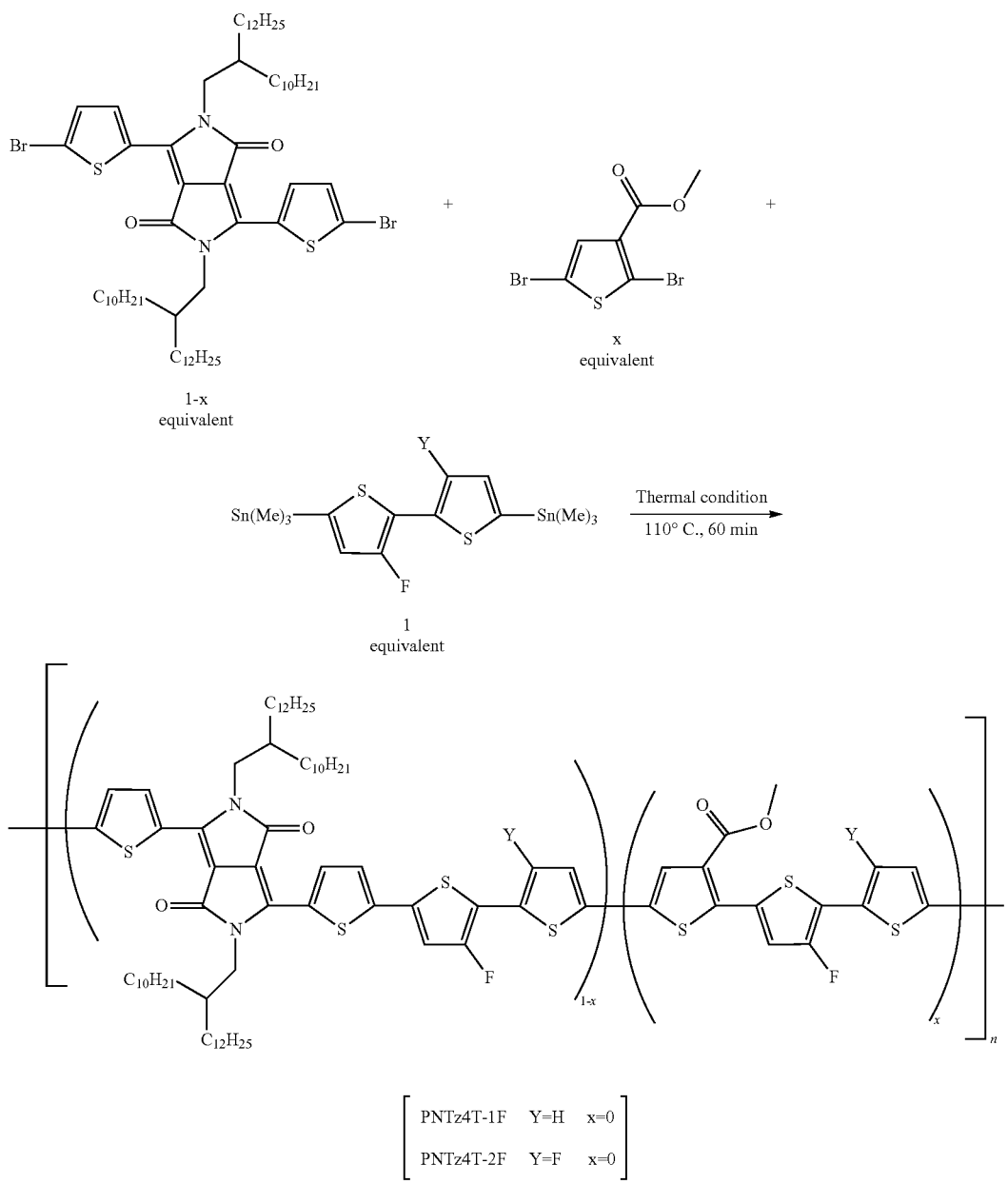

PDPPz4T-1F:

Polymerization was performed in the same manner as in Example 13, except that 113.1 mg (0.01 mmol) of 3,6-di(2-bromothiene-5-yl)-2,5-di(2-decyltetradecyl)-pyrrolo[3,4-c]pyrrole-1,4-dione and 50.1 mg (0.1 mmol) of 5,5'-bis-(trimethylstannyl)-3-fluoro-2,2'-bithiophene were used in a glove box, thereby obtaining PDPPz4T-1F as the final polymer.

GPC: Mn=130 kDa, PDI: 1.31

Elem. Anal. Calcd for $C_{70}H_{105}FN_2O_2S_4$: C, 72.87; H, 9.17; F, 1.65; N, 2.42; S, 11.11; O, 2.77. Found: C, 72.93; H, 9.17; N, 2.43; S, 11.16; O, 3.44.

IR: 3062, 2918, 2849, 1663, 1549, 1531, 1491, 1429, 1402, 1343, 1224, 1155, 1106, 1072, 1017, 908, 854, 801, 782, 731, 708, 633, 585, 567

PDPPz4T-2F:

Polymerization was performed in the same manner as in Example 13, except that 113.1 mg (0.01 mmol) of 3,6-di(2-bromothiene-5-yl)-2,5-di(2-decyltetradecyl)-pyrrolo[3,4-c]pyrrole-1,4-dione and 52.8 mg (0.1 mmol) of 5,5'-bis-(trimethylstannyl)-3,3'-difluoro-2,2-bithiophene were used in a glove box, thereby obtaining PDPPz4T-2F as the final polymer.

GPC: Mn=98 kDa, PDI: 3.06

Elem. Anal. Calcd for $(C_{70}H_{105}FN_2O_2S_4)_{0.95}(C_{14}H_7FO_2S_3)_{0.05}$: C, 71.75; H, 8.95; F, 3.24; N, 2.39; S, 10.94; O, 2.73. Found C, 72.02; H, 9.12; N, 2.40; S, 10.89; O, 3.55.

IR: 3077, 2919, 2850, 1663, 1550, 1498, 1432, 1390, 1359, 1304, 1261, 1220, 1158, 1104, 1071, 1024, 988, 901, 856, 801, 732, 707, 633, 614, 584

Comparative Example 8

Preparation of PffTz4T-2OD

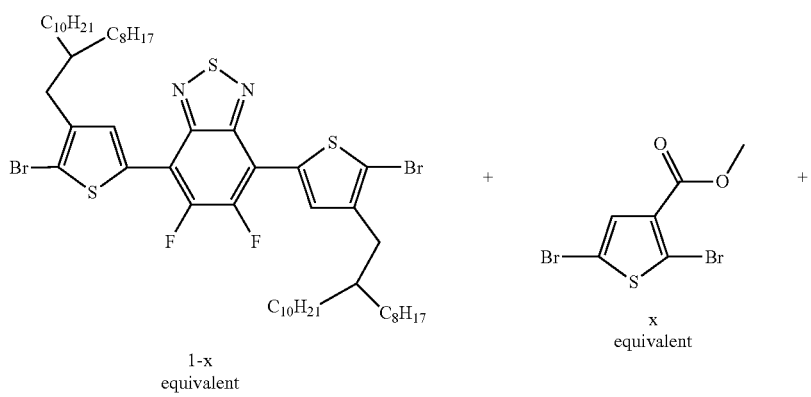

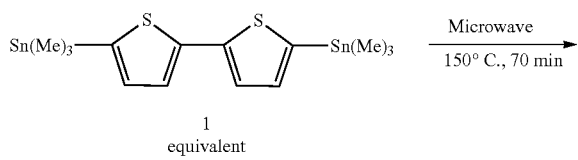

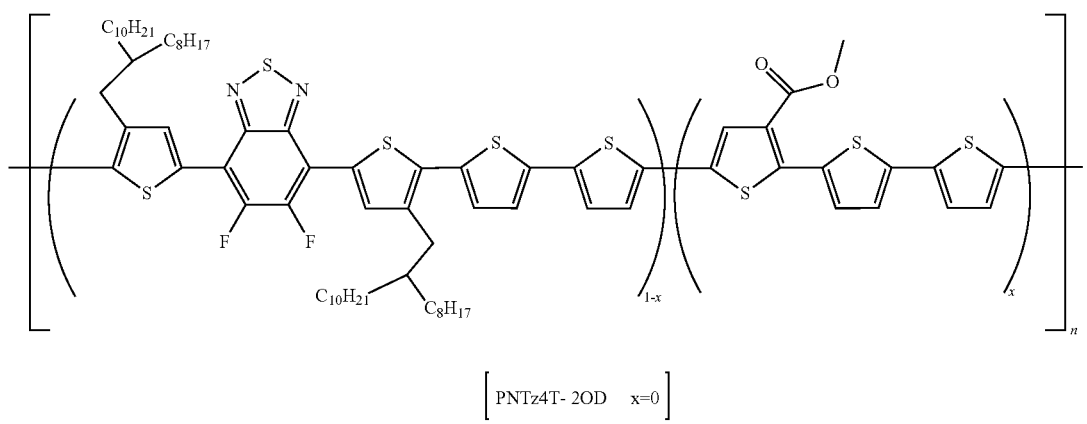

Polymerization was performed in the same manner as in the method of polymerizing PNTz4T in Comparative Example 1, except that 105.5 mg (0.1 mmol) of 4,7-bis(5-bromo-4-(2-octyldodecyl)thiophen-2-yl)-2,1,3-benzothiadiazole and 49.2 mg (0.1 mmol) of 5,5'-bis-(trimethylstannyl)-2,2'-bithiophene as monomers, and 1 mL of anhydrous chlorobenzene as a solvent were used, thereby obtaining 76 mg (72%) of PffTz4T-2OD-MTC0.05 as the final polymer.

GPC: Mn=15 kDa, PDI: 2.91

Elem. Anal. Calcd for $C_{62}H_{88}F_2N_2S_5$: C, 70.27; H, 8.37; F, 3.59; N, 2.64; S, 15.13. Found: C, 70.01; H, 8.40; N, 2.71; S, 15.35.

IR: 3061, 2920, 2851, 1583, 1539, 1482, 1429, 1377, 1327, 1291, 1216, 1115, 1080, 1011, 1071, 894, 851, 779, 746, 721, 70, 676, 657, 594

Comparative Example 9

Preparation of PBT-EHHDBT

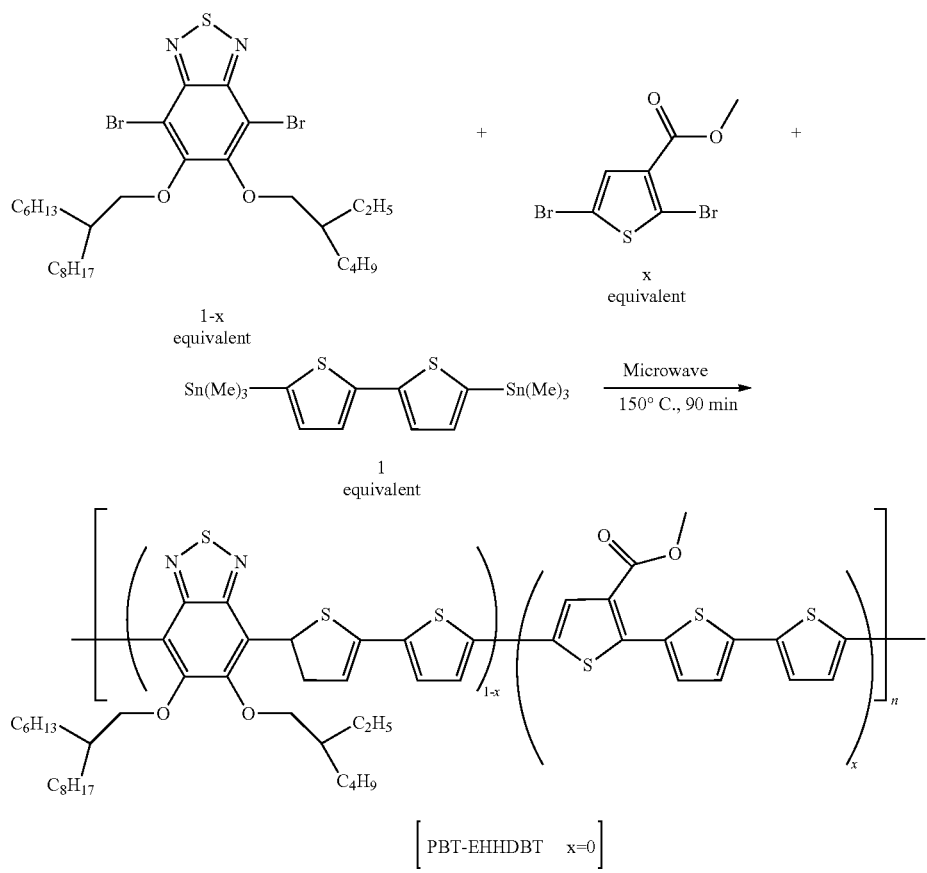

Polymerization was performed in the same manner as in Example 15, except that 66.3 mg (0.1 mmol) of 4,7-dibromo-5-ethylhexyloxy-6-hexyldecyloxy-benzo[c][1,2,5]thiadiazole and 49.2 mg (0.1 mmol) of 5,5'-bis-(trimethylstannyl)-2,2'-bithiophene as monomers were used, thereby obtaining 59 mg (88%) of PBT-EHHDBT as the final polymer.

GPC: Mn=32 kDa, PDI: 1.56

Elem. Anal. Calcd for $C_{38}H_{54}N_2O_2S_3$: C, 68.42; H, 8.16; N, 4.20; S, 14.42; O, 4.80. Found: C, 68.45; H, 8.13; N, 4.17; S, 14.28; O, 4.92.

IR: 3067, 2922, 2853, 1560, 1509, 1459, 1439, 1414, 1377, 1281, 1201, 1174, 1100, 1025, 958, 890, 852, 793, 756, 722, 681, 595

Examples 16 to 30, and Comparative Examples 10 to 18

Manufacture of Organic Solar Cell

A glass substrate coated with indium tin oxide (ITO) as a transparent electrode (first electrode) was soaked in deionized water containing a washing solution, washed for 15 minutes in a ultrasonic cleaner, cleaned again with deionized water, acetone, and IPA three times, respectively, and then dried in an oven at 130° C. for 5 hours. The ITO glass substrate washed as described above was subjected to UV/ozone treatment for 15 minutes, and then the ITO substrate was spin-coated with ZnO·NPs having a thickness of 30 nm. Then, the substrate coated with ZnO·NPs was heat-treated on a hot plate at 100° C. for 10 minutes.

The ZnO·NPs layer was spin-coated with a 0.5 wt % poly(ethyleneimine)-ethoxylated (PEIE) solution to have a thickness of 3 nm.

Then, in order to coat the photoactive layer, the device was transferred to a glove box filled with argon. The photoactive layer was prepared by dissolving the polymer of the example which is the polymer of the present invention or the polymer of the comparative example shown in the following Table 2, and $PC_{71}BM$ (manufactured by EM index Co., Ltd.) at a weight ratio of 1:2 in a xylene solvent including 3% (volume ratio) diphenylether (DPE), and applying the organic semiconductor solution filtered through a 0.45 μm PTFE syringe filter on a PEIE layer, with a thickness of 200 nm by a spin coating method (see Tables 2 and 3 for the process temperature). $MoO_3$ having a thickness of 10 nm and an Ag electrode having a thickness of 100 nm as a top electrode were deposited on the photoactive layer of the obtained device structure, under the vacuum of $3 \times 10^{-6}$ torr in a thermal evaporator, thereby completing an organic solar cell.

Open circuit voltage (Voc), short circuit current (Jsc), fill factor (FF), and power conversion efficiency (PCE) which are electric properties of the manufactured organic solar cell are shown in the following Table 2.

The photoelectric cell current density-voltage (J-V) characteristic of each of the organic solar cells manufactured by the above method was measured by a Newport 1000 W solar simulator under sunlight simulation lighting of 100 mW/cm² (AM 1.5 G). The electric data was recorded using a Keithley 236 source-measure unit, and all characteristics were measured under atmospheric conditions at room temperature. The illuminance was corrected by a standard Si photodiode detector from PV measurements Inc. corrected in the National Renewable Energy Laboratory (NREL). Incident photon-to-current conversion efficiency (IPCE) was measured as a wavelength function in a range of 300 to 1000 nm equipped with a xenon lamp (PV measurement Inc.) as a light source and corrected using a silicon standard photodiode. The thickness of a thin film was measured using a KLA Tencor Alpha-step IQ surface profilometer with the accuracy of ±1 nm.

The results are summarized in Tables 2 and 3. That is, the photovoltaic parameters of open circuit voltage ($V_{oc}$), short circuit current density ($J_{SC}$), fill factor (FF), and power conversion efficiency (PCE) are summarized in the following.

Among those photovoltaic parameters, the fill factor and the power conversion efficiency were calculated by the following Equations 1 and 2:

$$\text{Fill factor} = (V_{mp} \times I_{mp})/(V_{oc} \times J_{SC}) \quad \text{[Equation 1]}$$

wherein $V_{mp}$ is a voltage value at a maximum power point, $I_{mp}$ is current density, $V_{OC}$ is open voltage, and $J_{SC}$ is short circuit current;

$$\text{Power conversion efficiency} = (\text{Fill factor}) \times (J_{SC} \times V_{oc})/100 \quad \text{[Equation 2]}$$

wherein $J_{SC}$ is short circuit current, and $V_{OC}$ is open voltage.

Example 31

Figure 7:
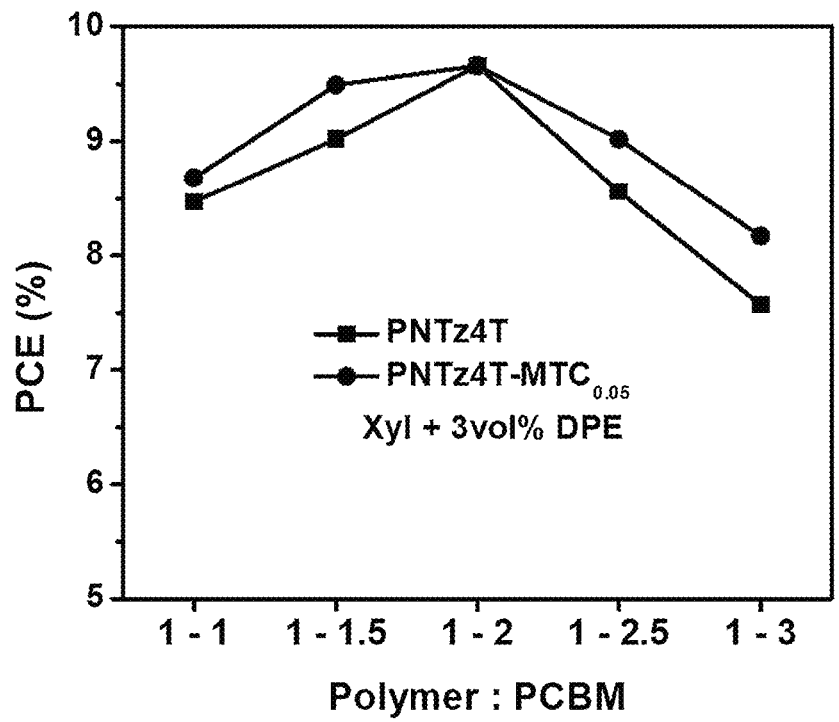
FIG. 7 is a graph representing a power conversion efficiency of an organic solar cell manufactured with different concentrations of an electron receptor, using the polymers of Example 7 and Comparative Example 5 of the present invention.

An organic solar cell was manufactured in the same manner as in Example 22 (weight ratio of 1:2) except that a polymer of PNTz4T-MTC$_{0.05}$ (Example 7) was used and the ratios of the polymer and PCBM were different as follows: 1:1, 1:1.5, 1:2.5, and 1:3 (weight ratio), and the results are shown in FIG. 7.

Example 32

Figure 8:
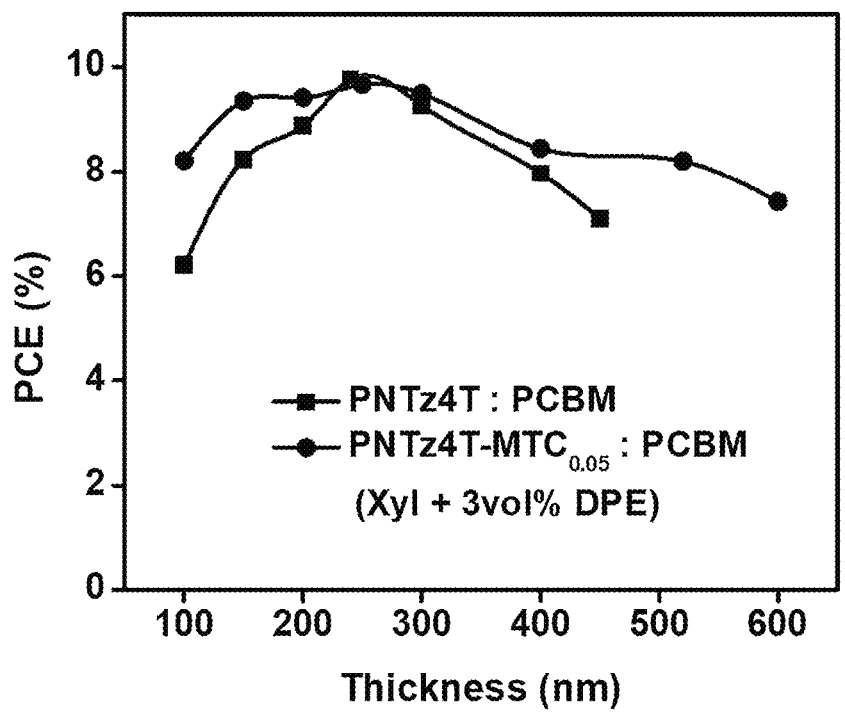
FIG. 8 is a graph representing a power conversion efficiency of an organic solar cell manufactured with different thicknesses of a photoactive layer, using the polymers of Example 7, and Comparative Example 5 of the present invention.

An organic solar cell was manufactured in the same manner as in Example 22 except that the polymer of PNTz4T-MTC$_{0.05}$ (Example 7) was used and the thickness of the photoactive layer was different, and the results are shown in FIG. 8.

Comparative Example 19

An organic solar cell was manufactured in the same manner as in Example 22 except that the polymer of Comparative Example 5 was used instead of the polymer of PNTz4T-MTC$_{0.05}$ (Example 7), and the results are shown in FIG. 8.

Example 33 and Comparative Example 20

Figure 9:
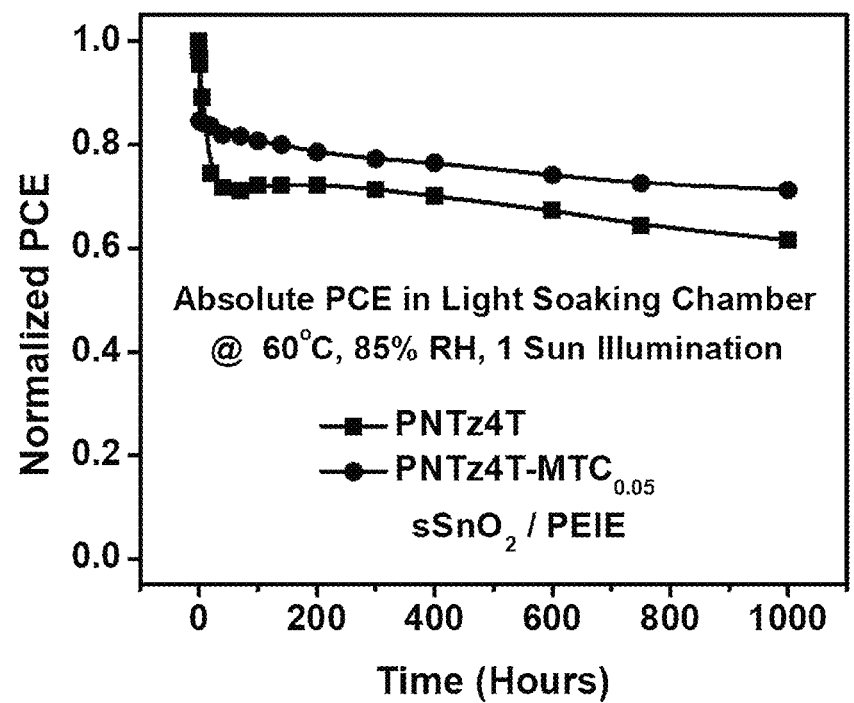
FIG. 9 is a graph representing a power conversion efficiency over time of an organic solar cell manufactured using the polymers of Example 7 and Comparative Example 5 of the present invention.

In order to measure the stability of the organic solar cell, the organic solar cells manufactured in Example 7 and Comparative Example 5 of the present invention were glass-glass encapsulated and allowed to stand for 1000 hours in a weathering chamber of artificial sunlight of 1 Sun, a temperature of 60° C., and an average relative humidity of 20%, the power conversion efficiency was measured, and the results are shown in FIG. 9, in comparison with the initial values of the power conversion efficiency.

TABLE 2

| Polymer | Introduced amount of polar functional group (mole fraction) | Process temperature (solution temperature/ substrate temperature) | $V_{oc}$ (V) | $J_{sc}$ (mA/cm²) | FF (%) | PCE (%) |
|---|---|---|---|---|---|---|
| Example 1 (PffBT4T-2OD-5TM) | 0.05 | RT/RT | 0.76 | 16.18 | 73 | 8.85 ± 0.12 |
| Example 2 (PffBT4T-2OD-5BM) | 0.05 | RT/RT | 0.76 | 16.52 | 70 | 8.70 ± 0.06 |
| Comparative Example 1 (PffBT4T-2OD) | 0.00 | 110° C./100° C. | 0.75 | 17.93 | 72 | 7.90 ± 1.98 |
|  | 0.00 | 90° C./70° C. | 0.73 | 15.14 | 42 | 4.74 |
|  | 0.00 | RT/RT | The photoactive film can't be coated on the substrate. | | | |
| Example 3 (PffBT4T-T3-STM) | 0.05 | 90° C./70° C. | 0.79 | 18.20 | 62 | 9.06 |
|  | 0.05 | 70° C./50° C. | 0.80 | 17.74 | 65 | 9.45 |
|  | 0.05 | 50° C./RT | 0.80 | 18.48 | 66 | 9.97 |
|  | 0.05 | RT/RT | 0.80 | 18.62 | 67 | 10.11 |

TABLE 2-continued

| Polymer | Introduced amount of polar functional group (mole fraction) | Process temperature (solution temperature/substrate temperature) | $V_{oc}$ (V) | $J_{sc}$ (mA/cm$^2$) | FF (%) | PCE (%) |
|---|---|---|---|---|---|---|
| Example 4 | 0.05 | 90° C./70° C. | 0.78 | 17.85 | 64 | 9.03 |
| (PffBT4T-T3-5BM) | 0.05 | 70° C./50° C. | 0.78 | 18.63 | 64 | 9.44 |
| | 0.05 | 50° C./ RT | 0.78 | 18.42 | 65 | 9.55 |
| | 0.05 | RT/RT | 0.78 | 18.90 | 65 | 9.70 |
| Comparative Example 2 | 0.00 | 90° C./70° C. | 0.78 | 17.48 | 69 | 9.54 |
| (PffBT4T-T3) | 0.00 | 70° C./50° C. | 0.78 | 17.40 | 64 | 8.81 |
| | 0.00 | 50° C./RT | 0.75 | 17.17 | 55 | 7.21 |
| | 0.00 | RT/RT | 0.75 | 16.36 | 43 | 5.59 |
| Example 5 (PNTz4T-1F-5BM) | 0.05 | RT/RT | 0.76 | 17.38 | 69 | 8.94 ± 0.12 |
| Comparative Example 3 (PNTz4T-1F) | 0.00 | 110° C./100° C. | 0.77 | 18.80 | 65 | 8.33 ± 1.12 |
| Example 6 (PNTz4T-2F-5BM) | 0.05 | 70° C./50° C. | 0.84 | 18.22 | 61 | 9.19 ± 0.08 |
| Comparative Example 4 (PNTz4T-2F) | 0.00 | 110° C./100° C. | 0.83 | 18.49 | 60 | 8.09 ± 1.11 |

TABLE 3

| | Polymer | Introduced amount of polar functional group (mole fraction) | Process temperature (solution temperature/substrate temperature) | $V_{oc}$ (V) | $J_{sc}$ (mA/cm$^2$) | FF (%) | PCE (%) |
|---|---|---|---|---|---|---|---|
| Example 3 | (PffBT4T-T3-3TM) | 0.03 | RT/RT | 0.80 | 17.63 | 68 | 9.69 |
| | (PffBT4T-T3-5TM) | 0.05 | RT/RT | 0.80 | 18.62 | 67 | 10.11 |
| | (PffBT4T-T3-10TM) | 0.10 | RT/RT | 0.80 | 17.29 | 65 | 9.13 |
| Example 4 | (PffBT4T-T3-3BM) | 0.03 | RT/RT | 0.79 | 18.63 | 65 | 9.63 |
| | (PffBT4T-T3-5BM) | 0.05 | RT/RT | 0.78 | 18.90 | 65 | 9.70 |
| | (PffBT4T-T3-10BM) | 0.10 | RT/RT | 0.79 | 18.37 | 65 | 9.49 |
| Comparative Example 2 | (PffBT4T-T3) | 0.00 | RT/RT | 0.75 | 16.86 | 43 | 5.59 |

As shown in Tables 2 and 3, it was confirmed that the organic solar cell adopting the polymer according to the present invention has high open circuit voltage and short circuit current density, and may represent an excellent power conversion efficiency even at a low temperature. In particular, the organic solar cell according to the present invention represents remarkableness in the effects described above at a lower temperature than a process temperature of spin coating for preparing a common photoactive layer.

In addition, by adopting the polymer to which a polar functional group is partially introduced according to the present invention, an organic solar cell which may further simplify the manufacturing process of an organic electronic device by implement of high solubility in an organic solvent, allows application to a preparation process such as R$_2$R and spin coating, allows mass production simultaneously with allowing high short circuit current density (Jsc) and high open circuit voltage (Voc) to be compatible, and may implement performance of a high power conversion efficiency, may be provided.

Figure 2:
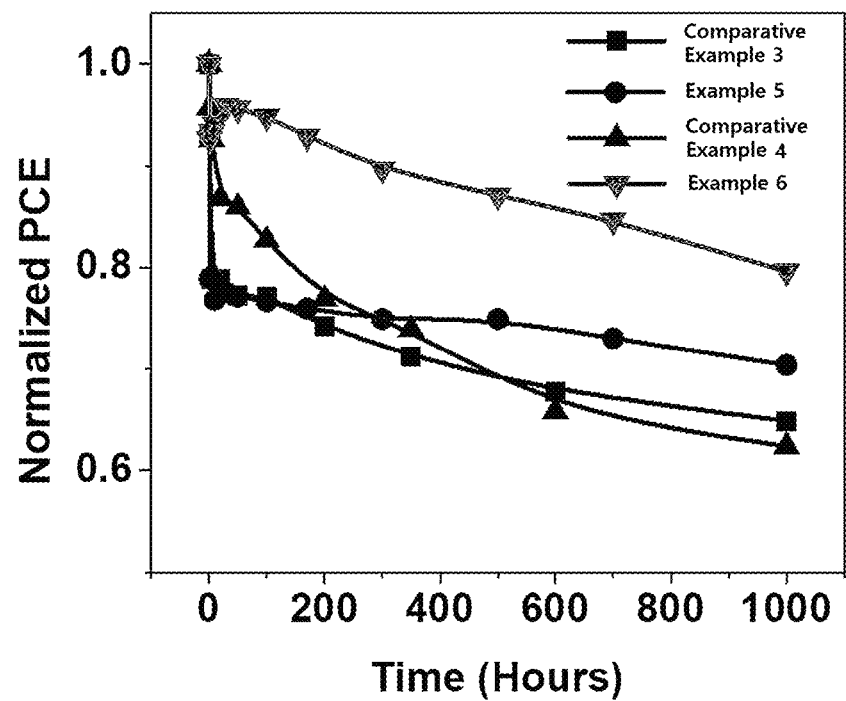
FIG. 2 is a graph representing a power conversion efficiency over time of an organic solar cell manufactured using the polymers of Example 3, Example 4, and Comparative Example 2 of the present invention.
Figure 3:
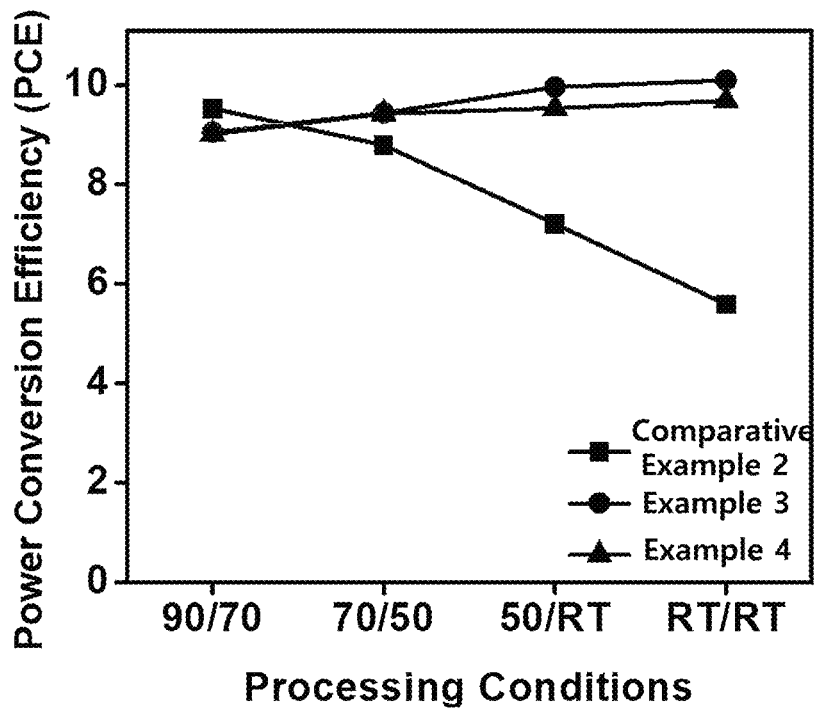
FIG. 3 is a graph representing a power conversion efficiency of an organic solar cell manufactured using the polymers of Example 5, Example 6, Comparative Example 3, and Comparative Example 4 of the present invention, depending on a process temperature (solution temperature/substrate temperature).

In addition, as shown in FIGS. 1 to 3, the organic solar cell adopting the polymer according to the present invention has a high power conversion efficiency even in the case of manufacturing a photoactive layer at a low temperature, has no change in the power conversion efficiency depending on the ratio with the electron receptor or the process temperature, and has very high stability, thereby dramatically raising the commercialization level of the organic solar cell.

In addition, when the photoactive layer is formed using a polymer to which a polar functional group is introduced according to the present invention, it was confirmed that a very uniform layer (for example, thin film) was able to be formed throughout the whole area.

However, when the photoactive layer is formed using a polymer to which a polar functional group is not introduced according to the present invention, it was confirmed that only some areas were coated so that a non-uniform layer is formed, and at a low process temperature, it was impossible to form the layer itself. In addition, in the case of organic solar cell adopting the polymer to which a polar functional group is not introduced according to the present invention, the initial power conversion efficiency was high, but the change in the power conversion efficiency depending on time was large, causing a difficulty in commercialization.

TABLE 4

| Polymer | Introduced amount of polar functional group (mole fraction) | Process temperature (solution temperature/substrate temperature) | $V_{oc}$ (V) | $J_{SC}$ (mA/cm$^2$) | FF (%) | PCE (%) |
|---|---|---|---|---|---|---|
| Example 7 (PNTz4T-MTC$_{0.03}$) | 0.03 | Warm | 0.731 | 18.39 (18.35*) | 71 | 9.59 |

TABLE 4-continued

| Polymer | Introduced amount of polar functional group (mole fraction) | Process temperature (solution temperature/ substrate temperature) | $V_{oc}$ (V) | $J_{SC}$ (mA/ cm$^2$) | FF (%) | PCE (%) |
|---|---|---|---|---|---|---|
| Example 7 (PNTz4T-MTC$_{0.05}$) | 0.05 | Room Temp | 0.738 | 18.07 (18.02*) | 72 | 9.66 |
| Example 7 (PNTz4T-MTC$_{0.07}$) | 0.07 | Room Temp | 0.731 | 15.62 (15.42*) | 65 | 7.47 |
| Example 7 (PNTz4T-MTC$_{0.10}$) | 0.10 | Room Temp | 0.728 | 15.15 (14.85*) | 64 | 7.12 |
| Comparative Example 5 (PNTz4T) | — | Hot | 0.739 | 18.17 | 71 | 9.66 |
| Comparative Example 5 (PNTz4T) | — | Warm | 0.752 | 15.14 | 70 | 8.07 |
| Comparative Example 5 (PNTz4T) | — | Room Temp | 0.742 | 12.17 | 50 | 4.81 |

Room Temp Conditions (solution temperature = 40° C., substrate temperature = room temperature)
Warm Conditions (solution temperature = 70° C., substrate temperature = 60° C.)
Hot Conditions (solution temperature = 110° C., substrate temperature = 100° C.)

Figure 4:
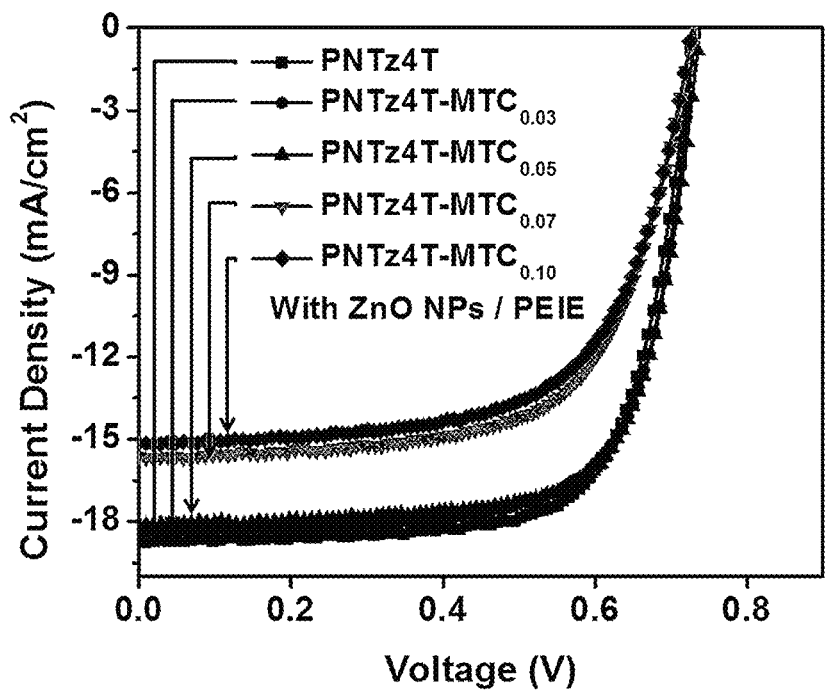
FIG. 4 is a graph of a photocurrent density-voltage characteristic for measuring the power conversion efficiency of the organic solar cell manufactured using the polymers of Example 7 and Comparative Example 5 of the present invention (photoactive layer preparation temperature of PNTz4T: Hot).
Figure 5:
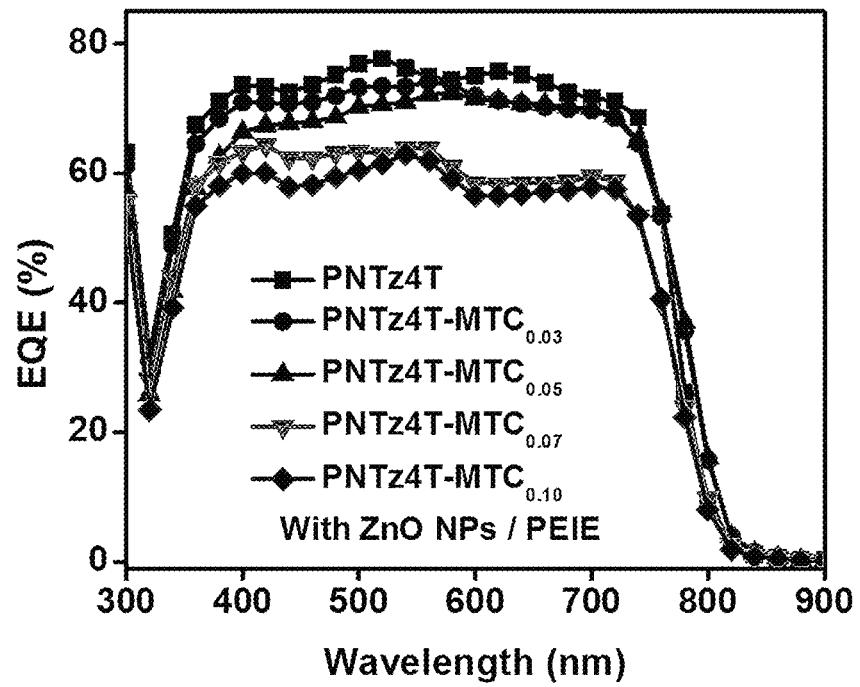
FIG. 5 is a graph of external quantum efficiency of the organic solar cell manufactured using the polymers of Example 7 and Comparative Example 5 of the present invention (photoactive layer preparation temperature of PNTz4T: Hot).
Figure 6:
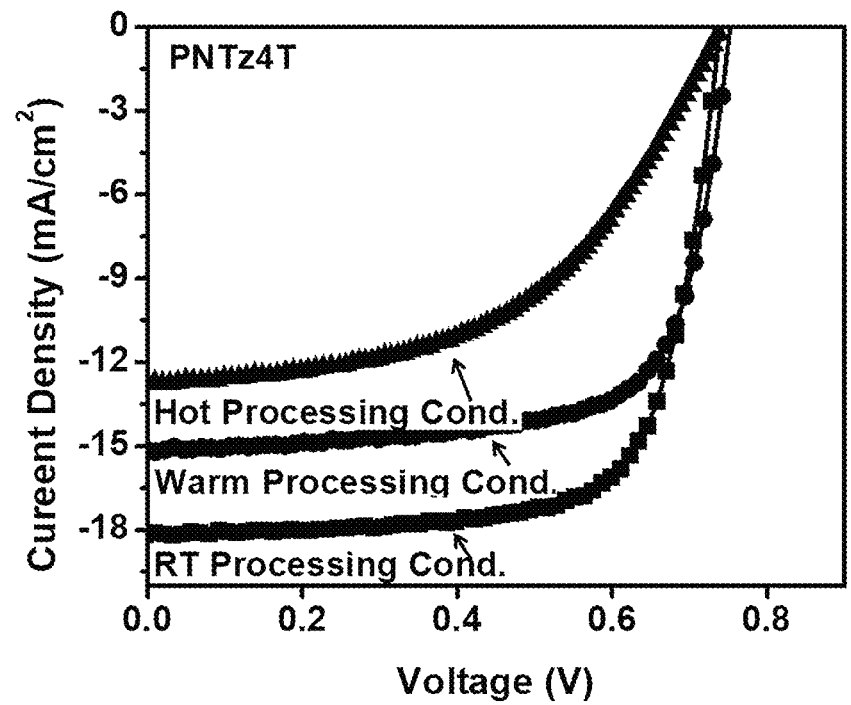
FIG. 6 is a graph of a photocurrent density-voltage characteristic depending on different process temperatures of an organic solar cell manufactured using the polymer of Comparative Example 1.

As shown in Table 4, it is recognized that though the organic solar cell adopting the polymer according to the present invention has a photoactive layer prepared at a low temperature, it has excellent Voc, Jsc, FF, and power conversion efficiency (PCE) as compared with the organic solar cell adopting the polymer of Comparative Example 5 (see FIGS. 4 to 6).

As shown in FIG. 7, it is recognized that the polymer of the present invention maintains the power conversion efficiency well even with the different ratios with PCBM.

As shown in FIG. 8, it is recognized that the polymer of the present invention maintains the power conversion efficiency well even with the different thickness of the photoactive layer, unlike the polymer of the comparative example.

As shown in FIG. 9, it is recognized that the polymer of the present invention maintains the power conversion efficiency well over time as compared with the polymer of Comparative Example 1.

Taken together, the organic solar cell of the present invention adopts a polymer to which a polar functional group is partially introduced, thereby having a high power conversion efficiency even in the case of manufacturing a photoactive layer at a low temperature, having no change in the power conversion efficiency depending on the ratios with an electron receptor, and having very high stability, and thus, the commercialization level of the organic solar cell may be dramatically raised.

In addition, the polymer of the present invention has high solubility in an organic solvent to further simplify the manufacturing process of an organic electronic device, may be applied to a preparation process such as R$_2$R and spin coating to allow mass production simultaneously with allowing high short circuit current density (Jsc) and high open circuit voltage (Voc) to be compatible, thereby implementing performance of a high power conversion efficiency.

As described above, though the Examples of the present invention have been described in detail, a person skilled in the art may make various modifications of the present invention, without departing from the technical idea of the present invention as defined in the claims which follow. Accordingly, future modification of the Examples of the present invention may not depart from the technique of the present invention.

The invention claimed is:
1. A polymer comprising:
a repeating unit represented by the following Chemical Formula 1 and
a repeating unit selected from the following Chemical Formulae 2 to 4:

[Chemical Formula 1]
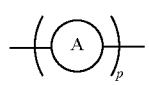

[Chemical Formula 2]
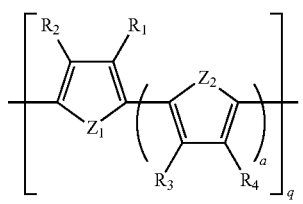

[Chemical Formula 3]
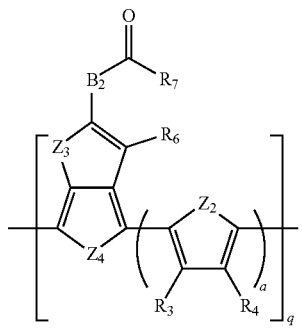

[Chemical Formula 4]
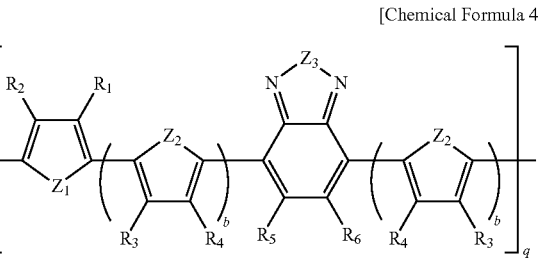

wherein

is

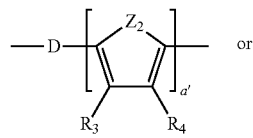 or

-continued

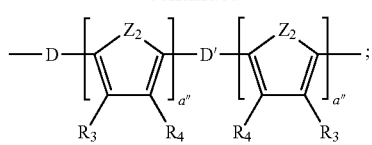

D is selected from the group consisting of the following structural formulas;

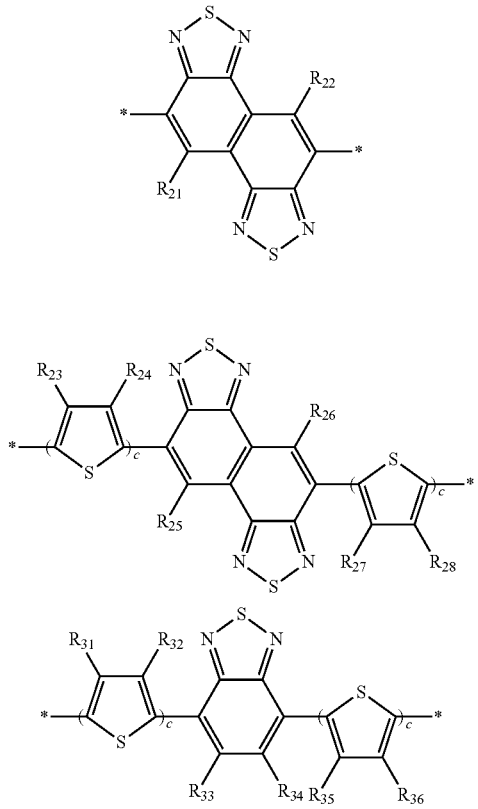

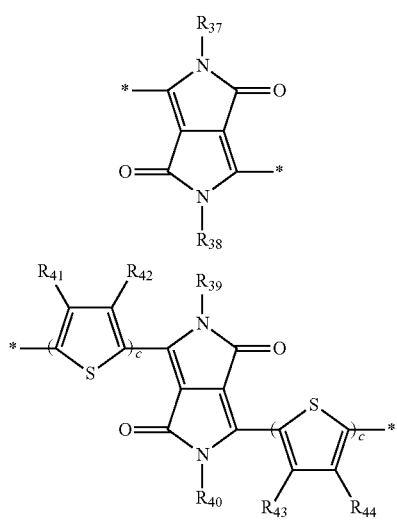

D' is selected from the group consisting of the following structural formulas;

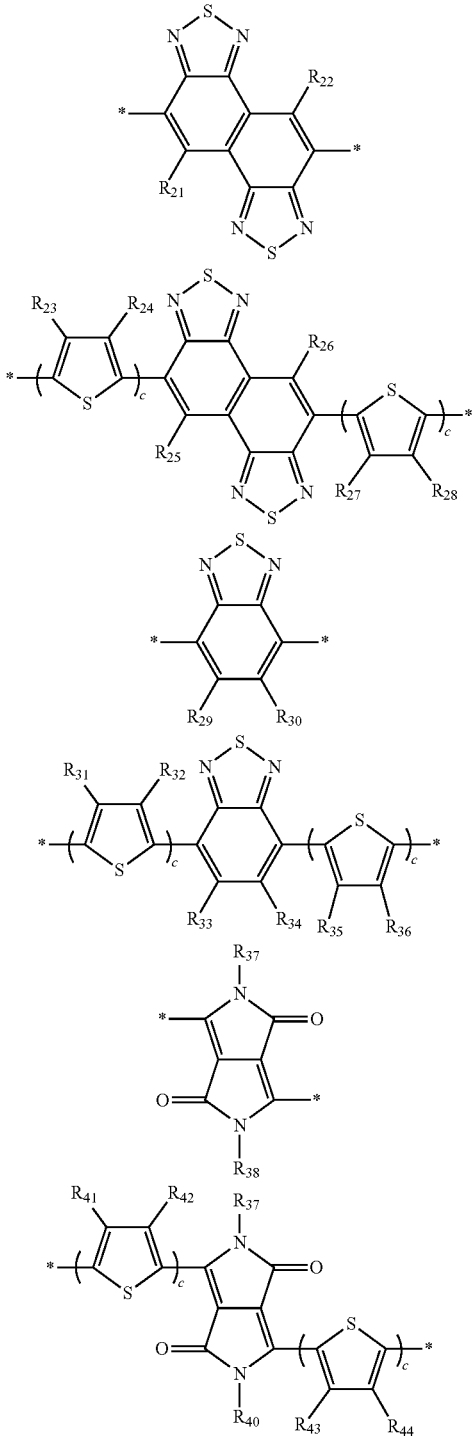

$Z_1$ is S, Se, or O, or —C(R')=C(R')—, in which R' is independently of each other hydrogen, $C_1$-$C_{30}$ alkyl, $C_1$-$C_{30}$ alkoxy, or hydroxy$C_1$-$C_{30}$ alkyl;

$Z_2$ to $Z_4$ are independently of one another S, Se, or O;

$R_1$ is hydroxy$C_1$-$C_{30}$ alkyl or —$B_1$—C(=O)R", in which $B_1$ is a single bond or $C_1$-$C_{30}$ alkylene, and R" is $C_1$-$C_{30}$ alkyl, $C_1$-$C_{30}$ alkoxy, or —$NR^aR^b$, in which $R^a$ and $R^b$ are independently of each other hydrogen or $C_1$-$C_{30}$ alkyl;

$R_2$ to $R_6$ are independently of one another hydrogen, a halogen, $C_1$-$C_{30}$ alkyl, $C_1$-$C_{30}$ alkoxy, $C_6$-$C_{30}$ aryl, or $C_3$-$C_{30}$ heteroaryl;

$R_7$ is $C_1$-$C_{30}$ alkyl, $C_1$-$C_{30}$ alkoxy, or —$NR^aR^b$ in which $R^a$ and $R^b$ are independently of each other hydrogen or $C_1$-$C_{30}$ alkyl;

$B_2$ is a single bond or $C_1$-$C_{30}$ alkylene;

a is independently of each other an integer of 1 to 5;
b is independently of each other an integer of 0 to 5;
a' is an integer of 0 to 5;
a" is, independently of each other, an integer of 1 to 5;
$R_{21}$ to $R_{36}$ and $R_{41}$ to $R_{44}$ are independently of one another hydrogen, a halogen, $C_1$-$C_{30}$ alkyl, or $C_1$-$C_{30}$ alkoxy;

c is, independently of each other, an integer of 1 or 2, and when c is 2, substituents of the repeating unit may be identical to or different from each other, and at least one of the substituents of each repeating unit is $C_1$-$C_{30}$ alkyl or $C_1$-$C_{30}$ alkoxy;

$R_{37}$ to $R_{40}$ are independently of one another hydrogen or $C_1$-$C_{30}$ alkyl; and p and q satisfy 0<p<1, 0<q<1, and p+q=1, as a mole fraction.

2. The polymer of claim 1, wherein the polymer includes:
the repeating units represented by the following Chemical Formulae 1 and 2, or
the repeating units represented by the following Chemical Formulae 1 and 4:

[Chemical Formula 1]

[Chemical Formula 2]

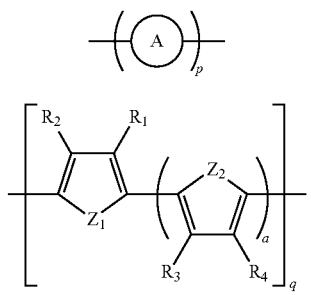

[Chemical Formula 4]

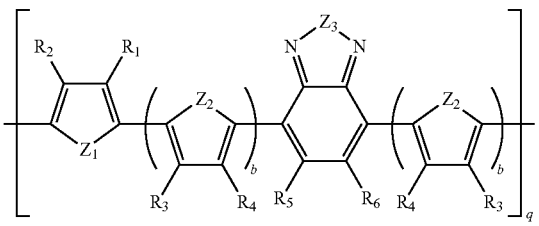

wherein

is as defined in claim 1;

$Z_1$ is S, Se, or O, or —C(R')=C(R')—, in which R' is independently of each other hydrogen, $C_1$-$C_{30}$ alkyl, $C_1$-$C_{30}$ alkoxy, or hydroxy$C_1$-$C_{30}$ alkyl;

$Z_2$ and $Z_3$ are independently of each other S, Se, or O;
$R_1$ is hydroxy$C_1$-$C_{30}$ alkyl;
$R_2$ to $R_6$ are independently of one another hydrogen, a halogen, $C_1$-$C_{30}$ alkyl, $C_1$-$C_{30}$ alkoxy, $C_6$-$C_{30}$ aryl, or $C_3$-$C_{30}$ heteroaryl;

a is an integer of 1 to 5;
b is independently of each other an integer of 0 to 5; and
p and q satisfy 0<p<1, 0<q<1, and p+q=1, as a mole fraction.

3. The polymer of claim 1, wherein the polymer includes:
the repeating units represented by the following Chemical Formulae 1 and 2-1, or
the repeating units represented by the following Chemical Formulae 1 and 3:

[Chemical Formula 1]

[Chemical Formula 2-1]

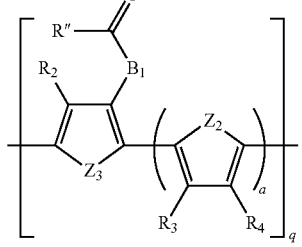

[Chemical Formula 3]

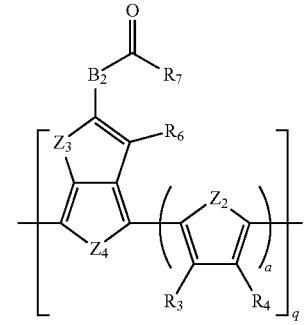

wherein

is as defined in claim 1;
$Z_2$ to $Z_4$ are independently of one another S, Se, or O;
$R_2$ to $R_4$ and $R_6$ are independently of one another hydrogen, a halogen, $C_1$-$C_{30}$ alkyl, $C_1$-$C_{30}$ alkoxy, $C_6$-$C_{30}$ aryl, or $C_3$-$C_{30}$ heteroaryl;

R" and $R_7$ are independently of each other $C_1$-$C_{30}$ alkyl, $C_1$-$C_{30}$ alkoxy, or —$NR^aR^b$, in which $R^a$ and $R^b$ are independently of each other hydrogen or C1-$C_{30}$ alkyl;

$B_1$ and $B_2$ are independently of each other a single bond or $C_1$-$C_{30}$ alkylene;

a is independently of each other an integer of 1 to 5; and
p and q satisfy 0<p<1, 0<q<1, and p+q=1, as a mole fraction.

4. The polymer of claim 1, wherein in the polymer, p and q satisfy 0.5<p<1, 0<q<0.5, and p+q=1, as a mole fraction.

5. The polymer of claim 1, wherein
- $Z_1$ is S or —CH=C(R')—, in which R' is hydroxy$C_1$-$C_{30}$ alkyl; $R_1$ is hydroxy$C_1$-$C_{30}$ alkyl or —$B_1$—C(=O)R", in which $B_1$ is a single bond or $C_1$-$C_{30}$ alkylene, and R" is $C_1$-$C_{30}$ alkyl, $C_1$-$C_{30}$ alkoxy, or —NR$^a$R$^b$, in which R$^a$ and R$^b$ are independently of each other hydrogen or $C_1$-$C_{30}$ alkyl;
- $Z_2$ to $Z_4$ are S or O;
- $R_2$ to $R_6$ are independently of one another hydrogen, a halogen, or $C_1$-$C_{30}$ alkyl;
- $R_7$ is $C_1$-$C_{30}$ alkyl, $C_1$-$C_{30}$ alkoxy, or —NR$^a$R$^b$ in which R$^a$ and R$^b$ are independently of each other hydrogen or $C_1$-$C_{30}$ alkyl;
- a is independently of each other an integer of 1 to 3; and
- b is, independently of each other, an integer of 0 to 3.

6. The polymer of claim 5, wherein in Chemical Formula 2, $Z_1$ is S or —CH=C(R')—, in which R' is hydroxy$C_1$-$C_{30}$ alkyl; $R_1$ is hydroxy$C_1$-$C_{30}$ alkyl or —$B_1$—C(=O)R", in which $B_1$ is a single bond or $C_1$-$C_{30}$ alkylene, and R" is $C_1$-$C_{30}$ alkyl, $C_1$-$C_{30}$ alkoxy, or —NR$^a$R$^b$, in which R$^a$ and R$^b$ are independently of each other hydrogen or $C_1$-$C_{30}$ alkyl; and
$Z_2$ is S.

7. The polymer of claim 5, wherein in Chemical Formula 3, $Z_2$ to $Z_4$ are S.

8. The polymer of claim 5, wherein in Chemical Formula 4,
- $Z_1$ is S or —CH=C(R')—, in which R' is hydroxy$C_1$-$C_{30}$ alkyl; and
- $Z_2$ and $Z_3$ are S.

9. The polymer of claim 1, wherein the polymer is selected from the group consisting of the following compounds:

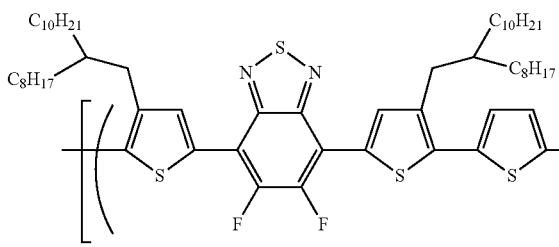

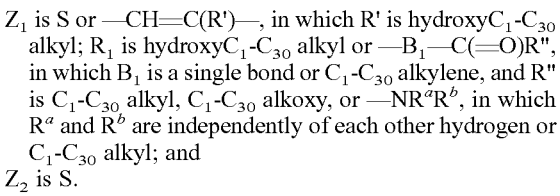

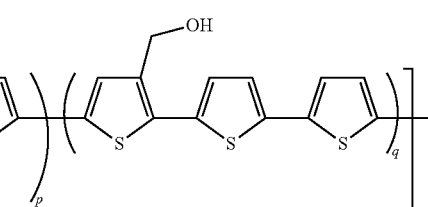

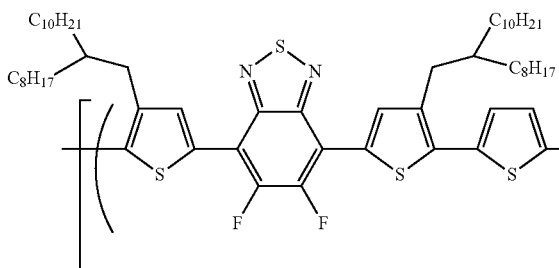

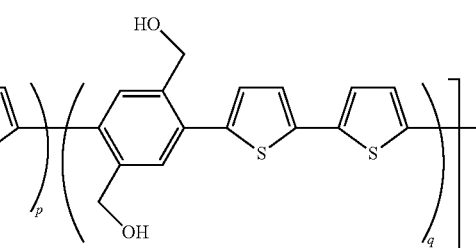

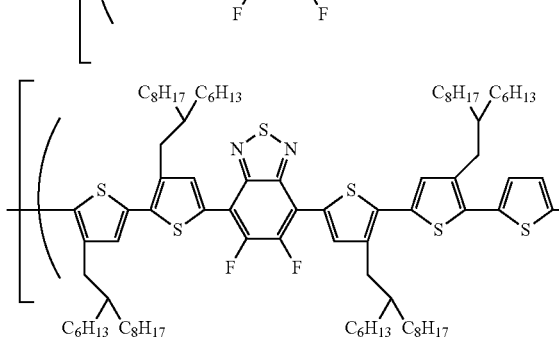

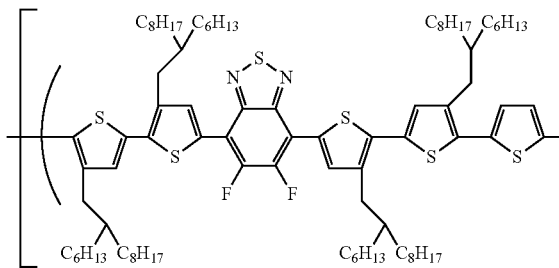

-continued
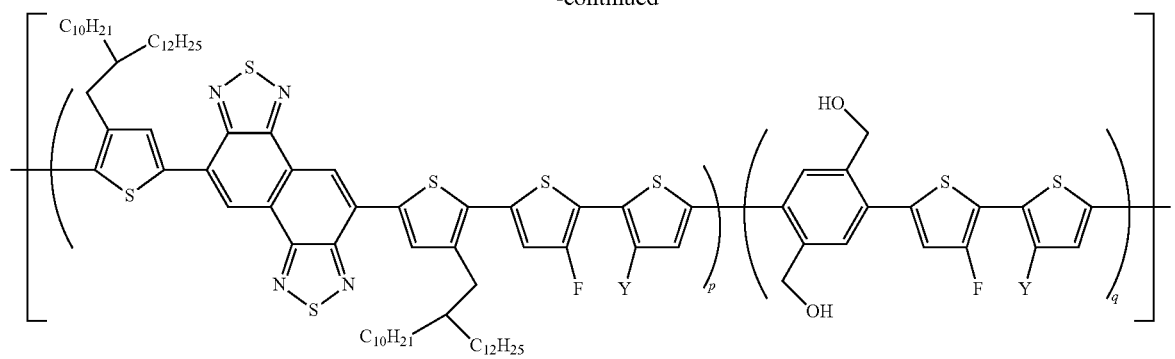
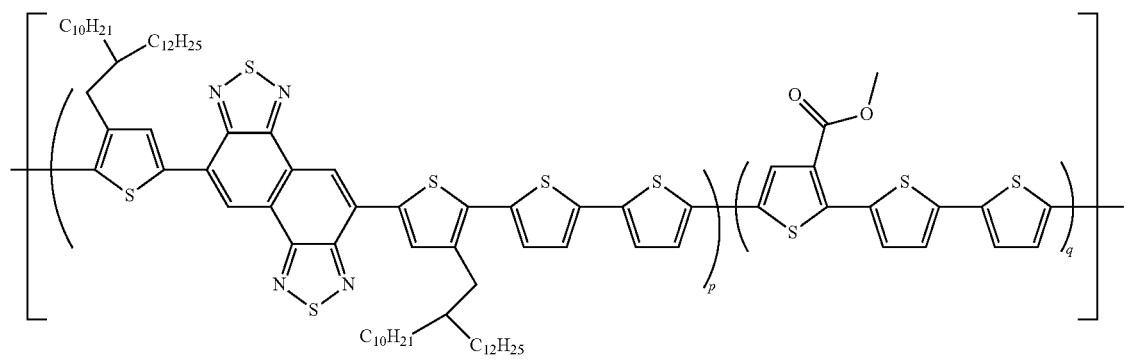
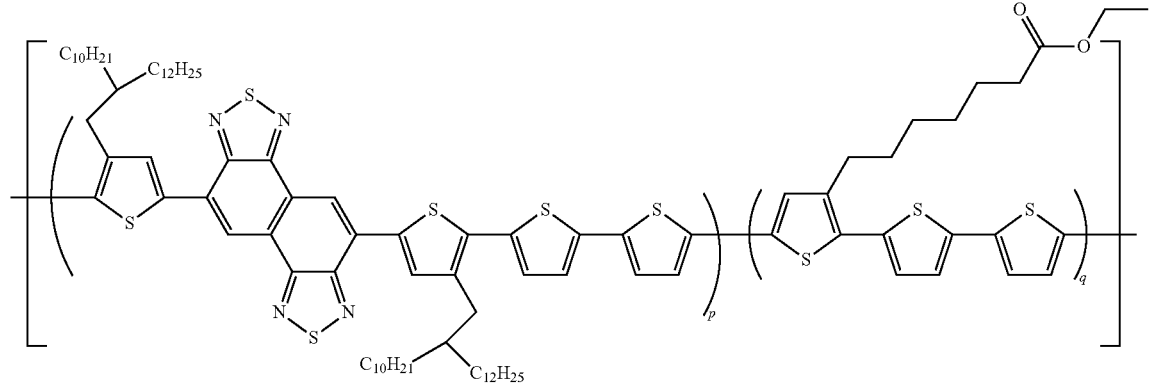
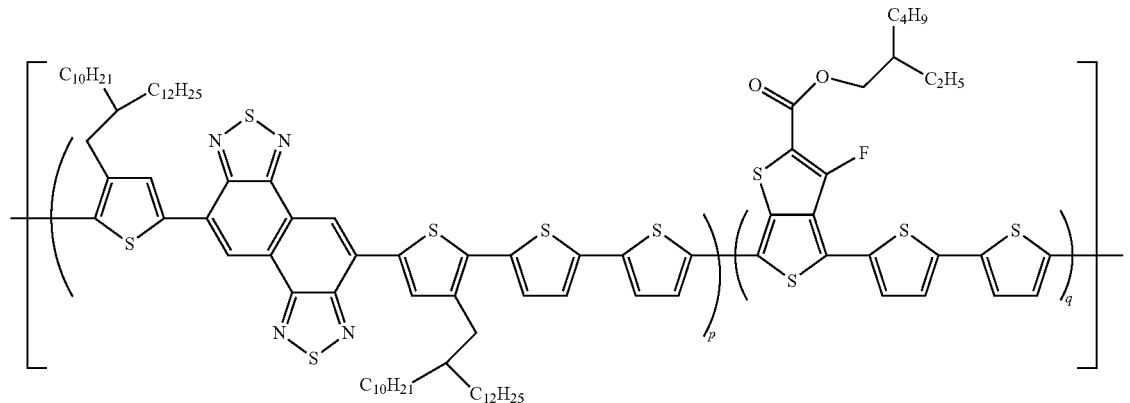

-continued
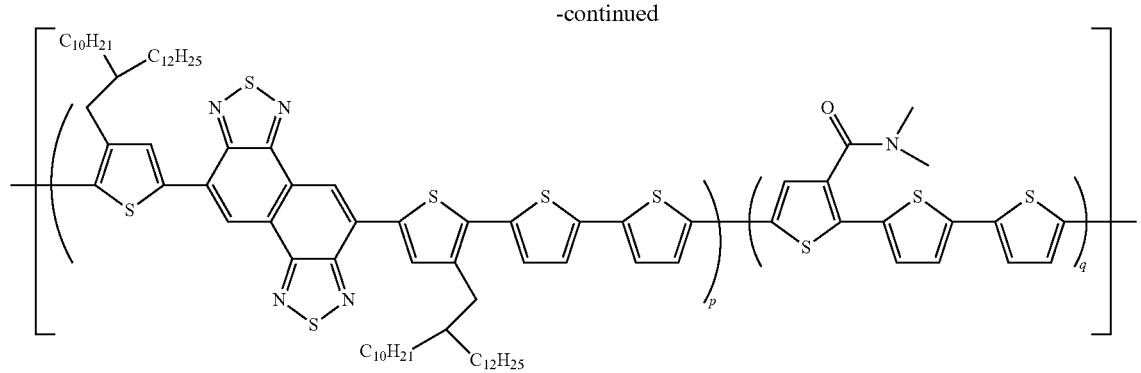
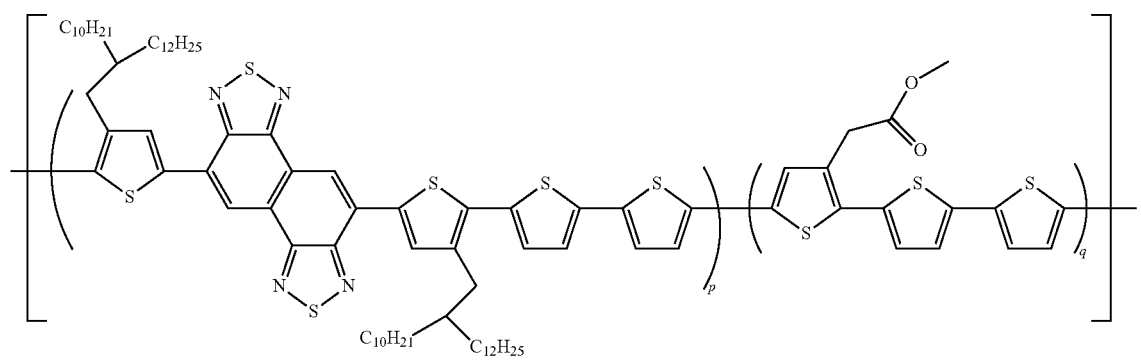
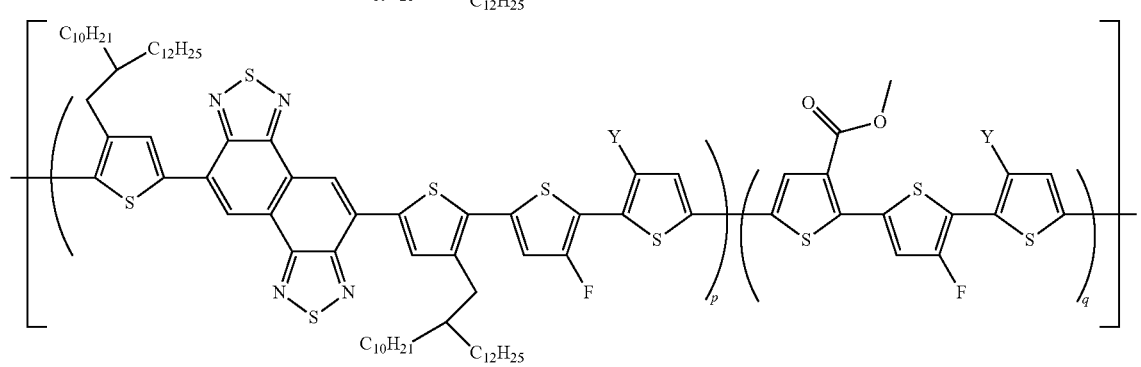
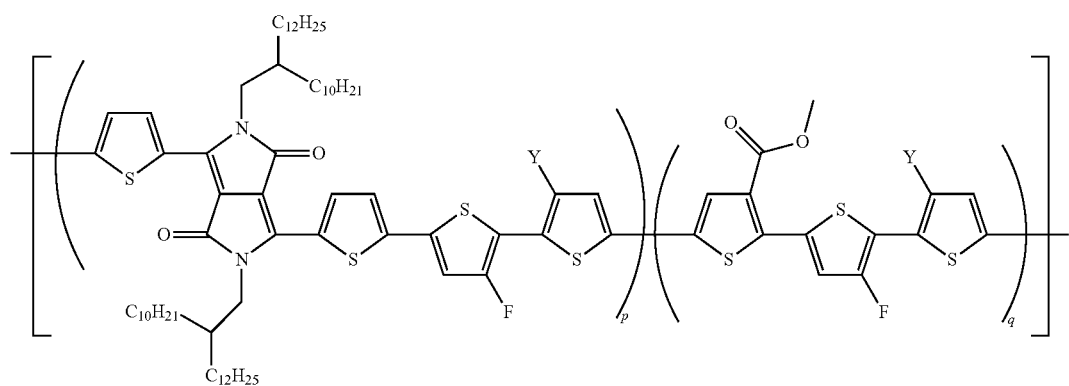

-continued

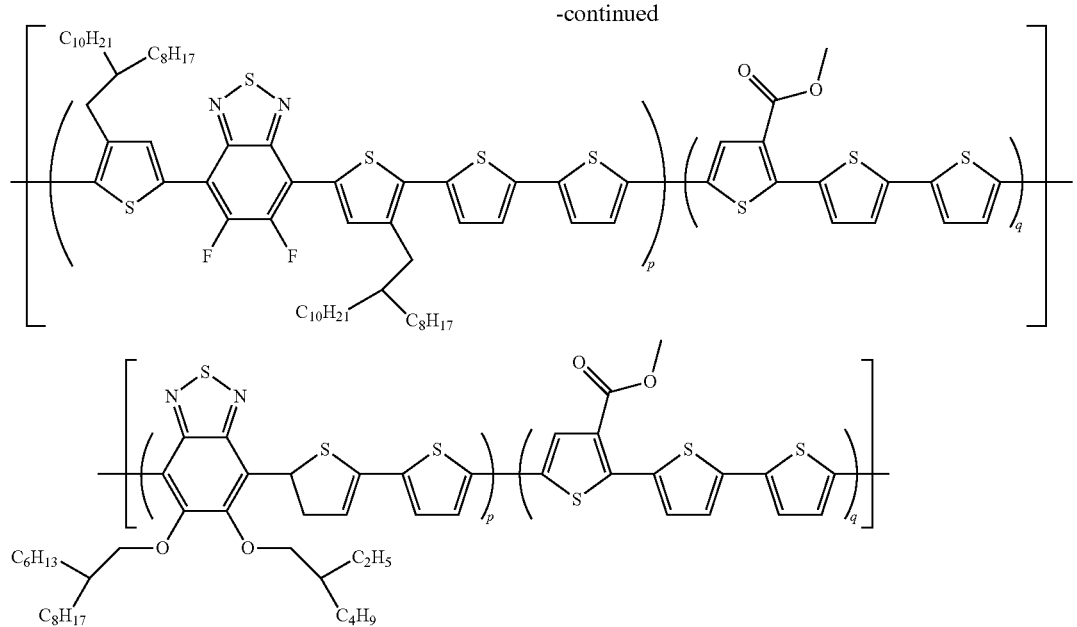

wherein
Y is hydrogen or fluorine; and
p and q satisfy 0<p<1, 0<q<1, and p+q=1, as a mole fraction.

10. The polymer of claim 1, wherein the polymer has a weight average molecular weight of 1,000 to 1,000,000 g/mol.

11. An organic electronic device, comprising the polymer of claim 1.

12. The organic electronic device of claim 11, wherein the polymer is used as an electron receptor.

13. The organic electronic device of claim 11, wherein the organic electronic device is selected from the group consisting of an organic light emitting device, an organic solar cell, an organic transistor, an organic photodetector drum, and an organic memory device.

* * * * *